(12) United States Patent
Chen et al.

(10) Patent No.: US 12,317,540 B2
(45) Date of Patent: May 27, 2025

(54) METHOD FOR MANUFACTURING SEMICONDUCTOR STRUCTURE WITH ISOLATION FEATURE

(71) Applicant: Taiwan Semiconductor Manufacturing Company, Ltd., Hsinchu (TW)

(72) Inventors: Shih-Cheng Chen, New Taipei (TW); Zhi-Chang Lin, Zhubei (TW); Jung-Hung Chang, Changhua County (TW); Chien-Ning Yao, Hsinchu (TW); Tsung-Han Chuang, Tainan (TW); Kuo-Cheng Chiang, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 433 days.

(21) Appl. No.: 17/673,232

(22) Filed: Feb. 16, 2022

(65) Prior Publication Data

US 2023/0144099 A1 May 11, 2023

Related U.S. Application Data

(60) Provisional application No. 63/276,821, filed on Nov. 8, 2021.

(51) Int. Cl.
| | | |
|---|---|---|
| H10D 30/67 | (2025.01) | |
| H01L 21/762 | (2006.01) | |
| H10D 30/01 | (2025.01) | |
| H10D 62/10 | (2025.01) | |
| H10D 64/01 | (2025.01) | |
| H10D 86/01 | (2025.01) | |
| H10D 87/00 | (2025.01) | |

(52) U.S. Cl.
CPC ... *H10D 30/6706* (2025.01); *H01L 21/76283* (2013.01); *H10D 30/031* (2025.01); *H10D 62/116* (2025.01); *H10D 64/018* (2025.01); *H10D 86/01* (2025.01); *H10D 87/00* (2025.01); *H10D 30/6735* (2025.01); *H10D 30/6757* (2025.01); *H10D 62/118* (2025.01)

(58) Field of Classification Search
CPC ......... H01L 29/78609; H01L 21/76283; H01L 21/84; H01L 27/1207; H01L 29/0653; H01L 29/66553; H01L 29/0665; H01L 29/42392; H01L 29/78696

See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

*Primary Examiner* — Jay C Kim
*Assistant Examiner* — Woo K Lee
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and a bottom isolation feature formed over the substrate. The semiconductor structure also includes a bottom semiconductor layer formed over the bottom isolation feature and nanostructures formed over the bottom semiconductor layer. The semiconductor structure also includes a source/drain structure attached to the nanostructures and covering a portion of the bottom isolation feature.

20 Claims, 44 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,947,804 B1 * | 4/2018 | Frougier ............... H01L 29/165 |
| 10,453,824 B1 * | 10/2019 | Mochizuki ........ H01L 21/32139 |
| 10,840,329 B1 * | 11/2020 | Xie ................. H01L 21/823412 |
| 10,916,627 B2 * | 2/2021 | Loubet .................. H01L 29/785 |
| 2021/0202758 A1 | 7/2021 | Yeong et al. |
| 2021/0320210 A1 | 10/2021 | Lin et al. |

\* cited by examiner

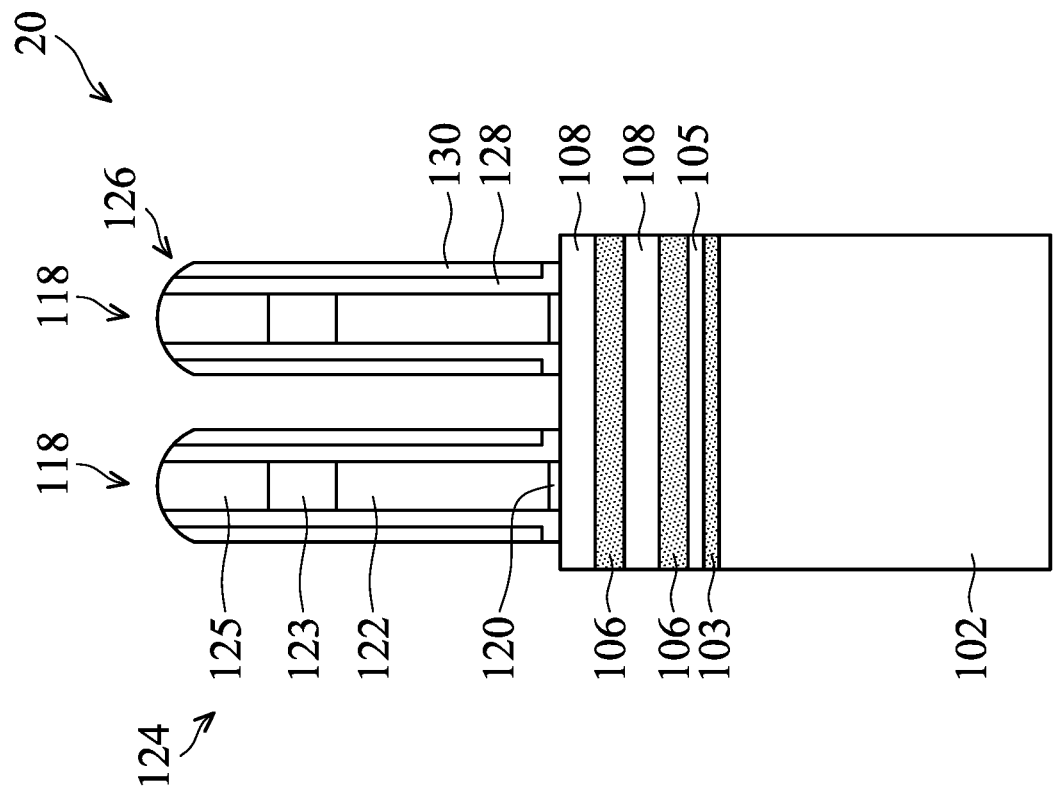
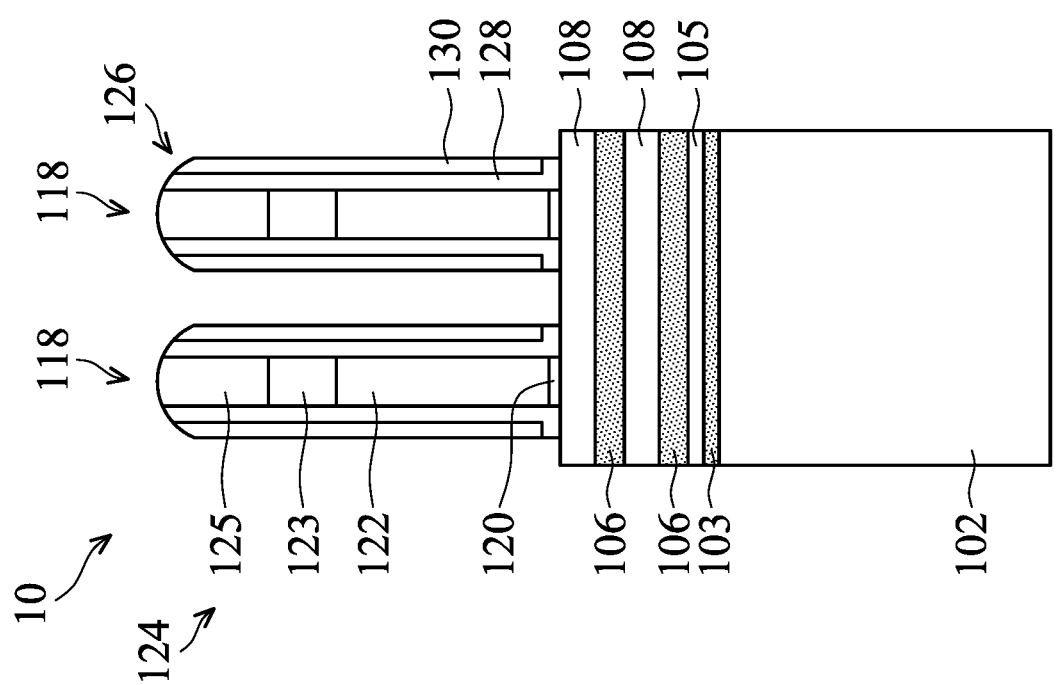

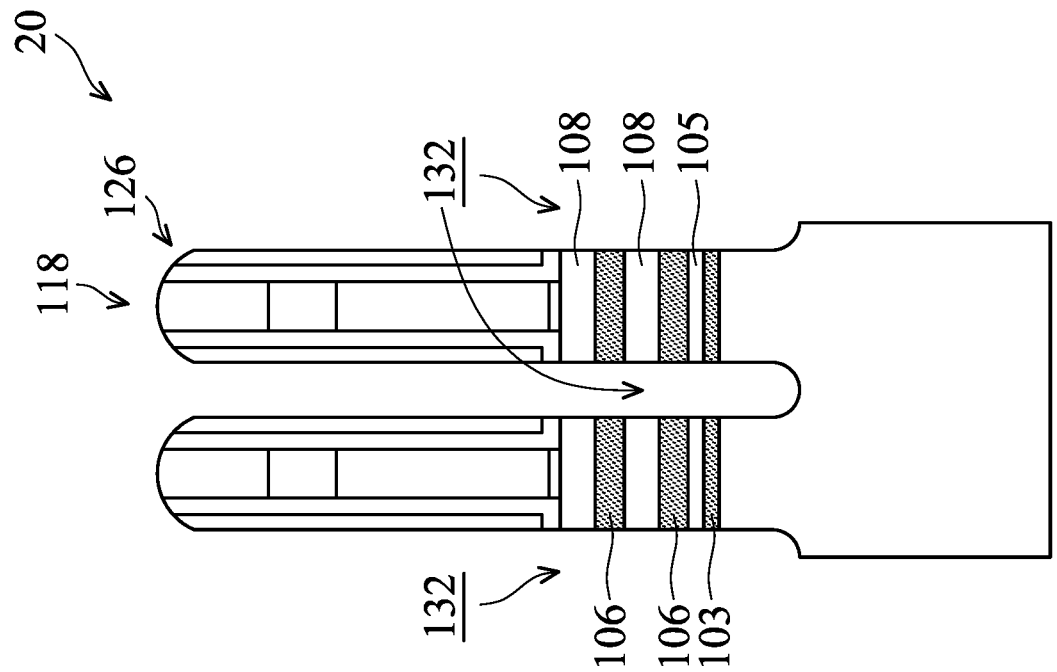
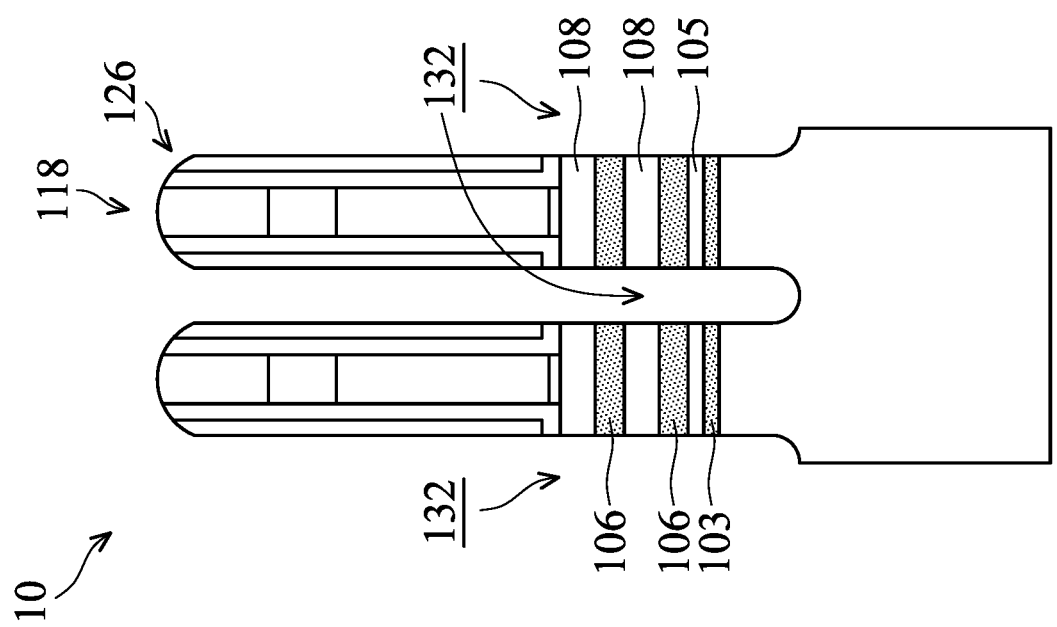

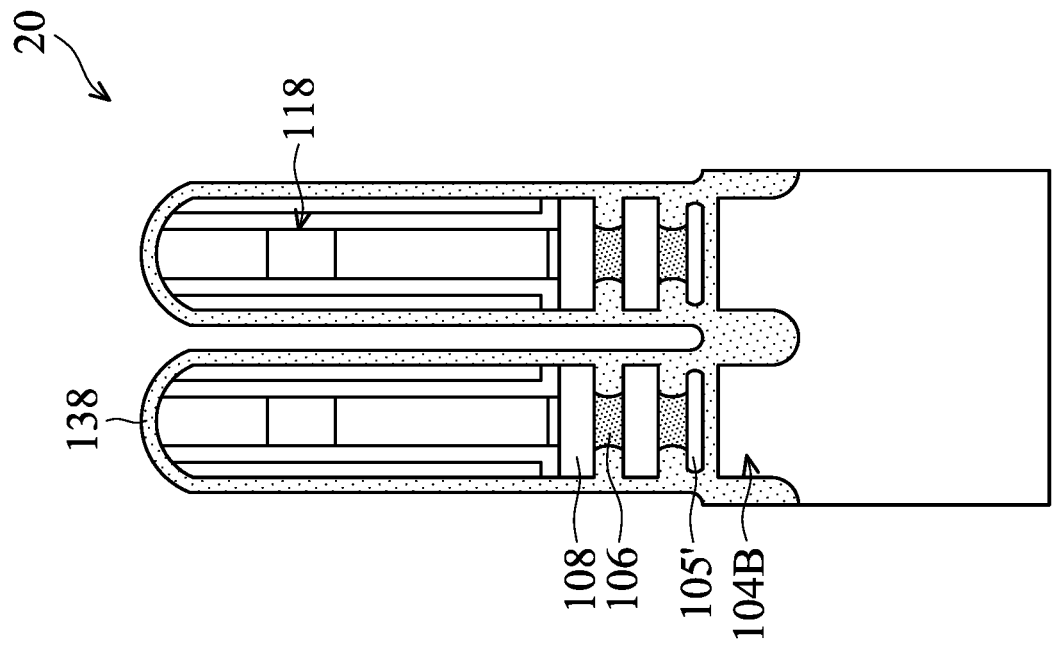
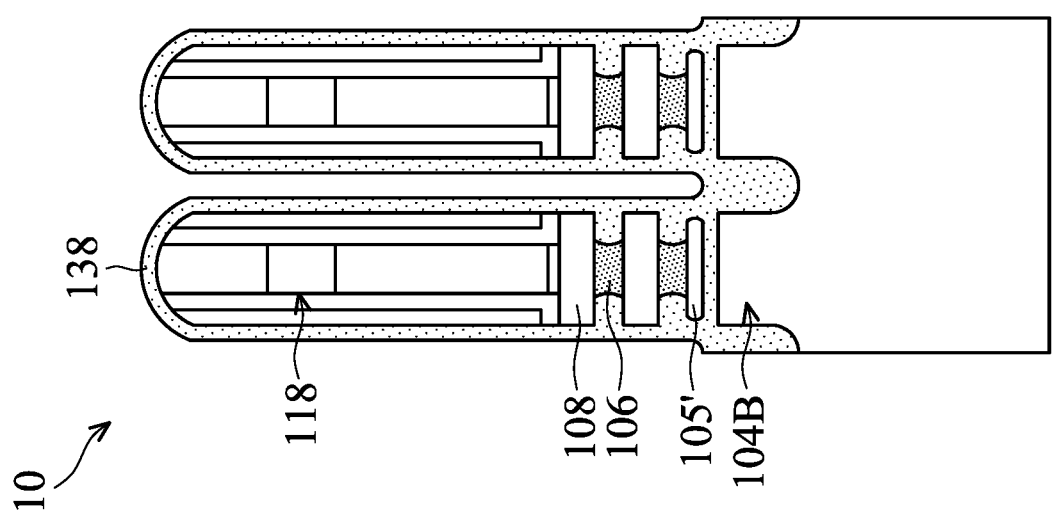
FIG. 2D-1
FIG. 2D-2

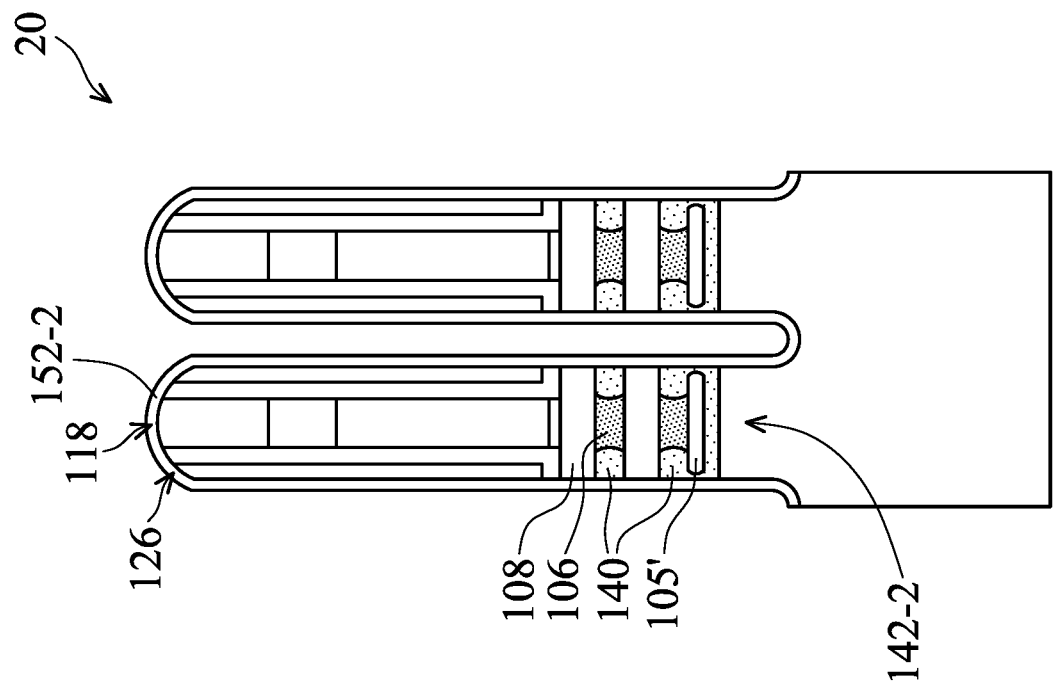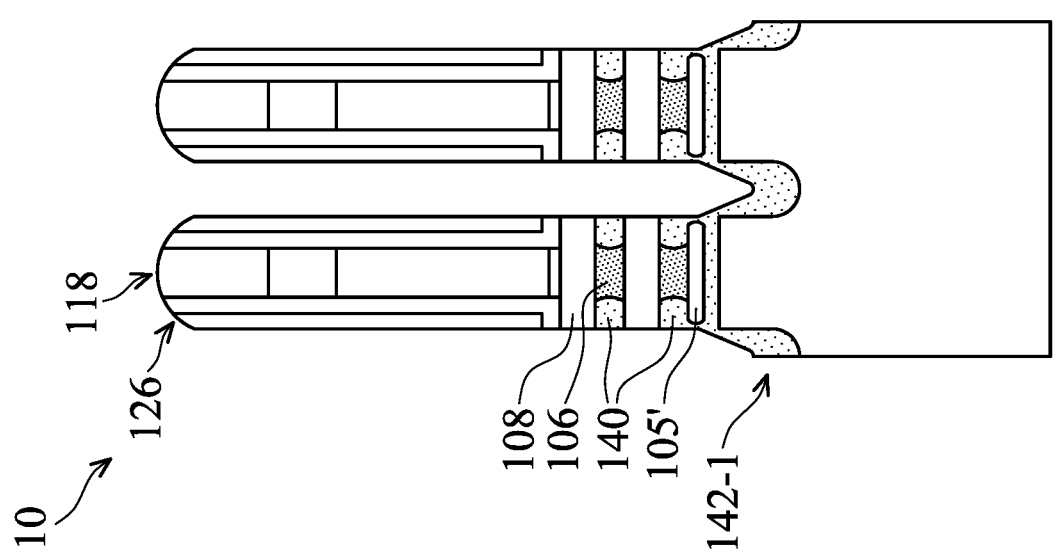

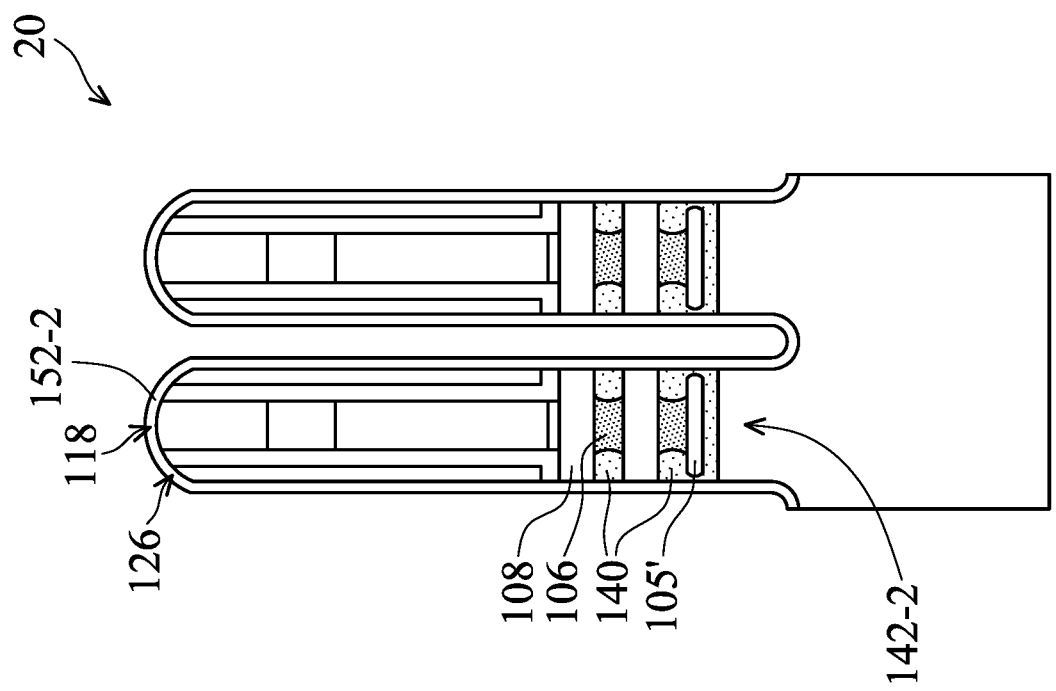
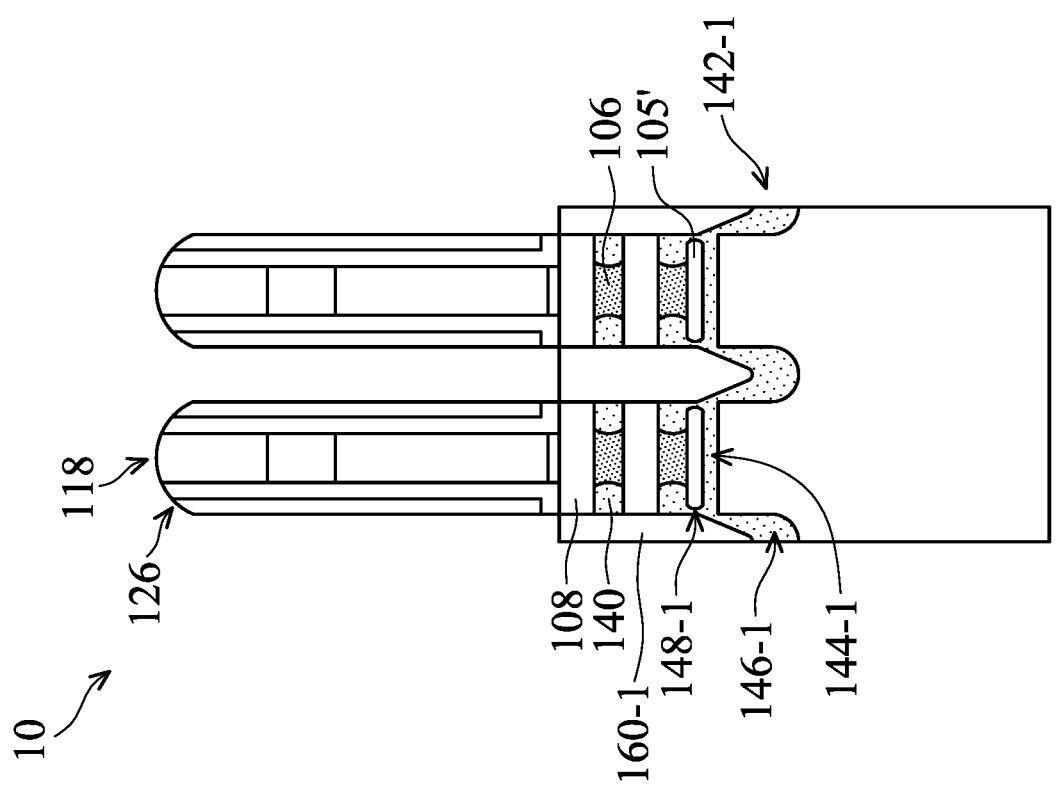

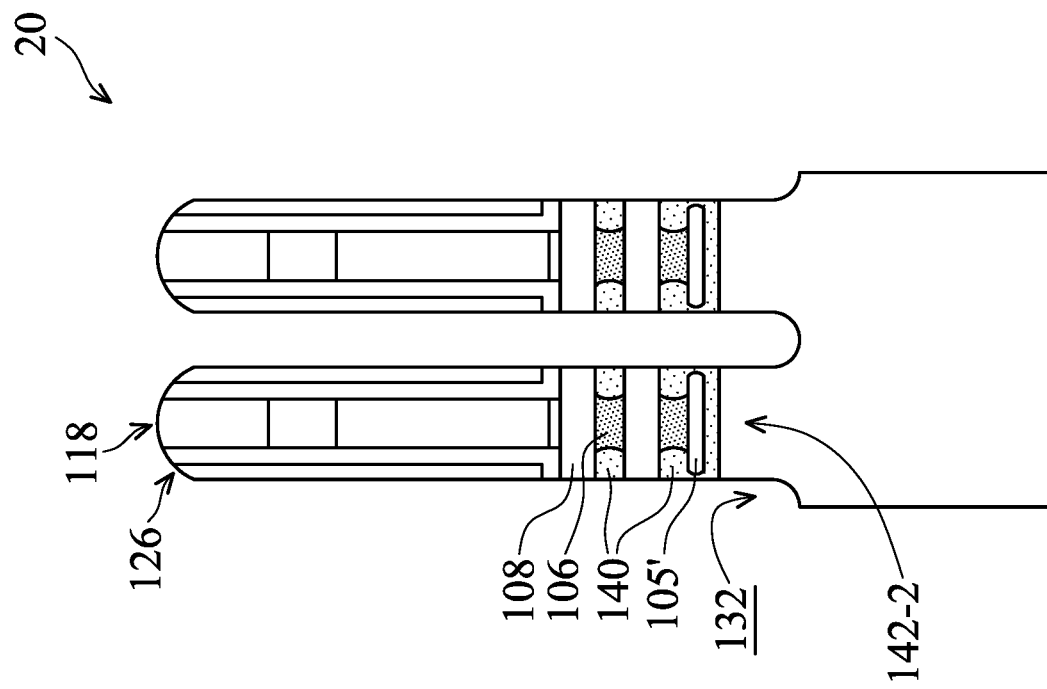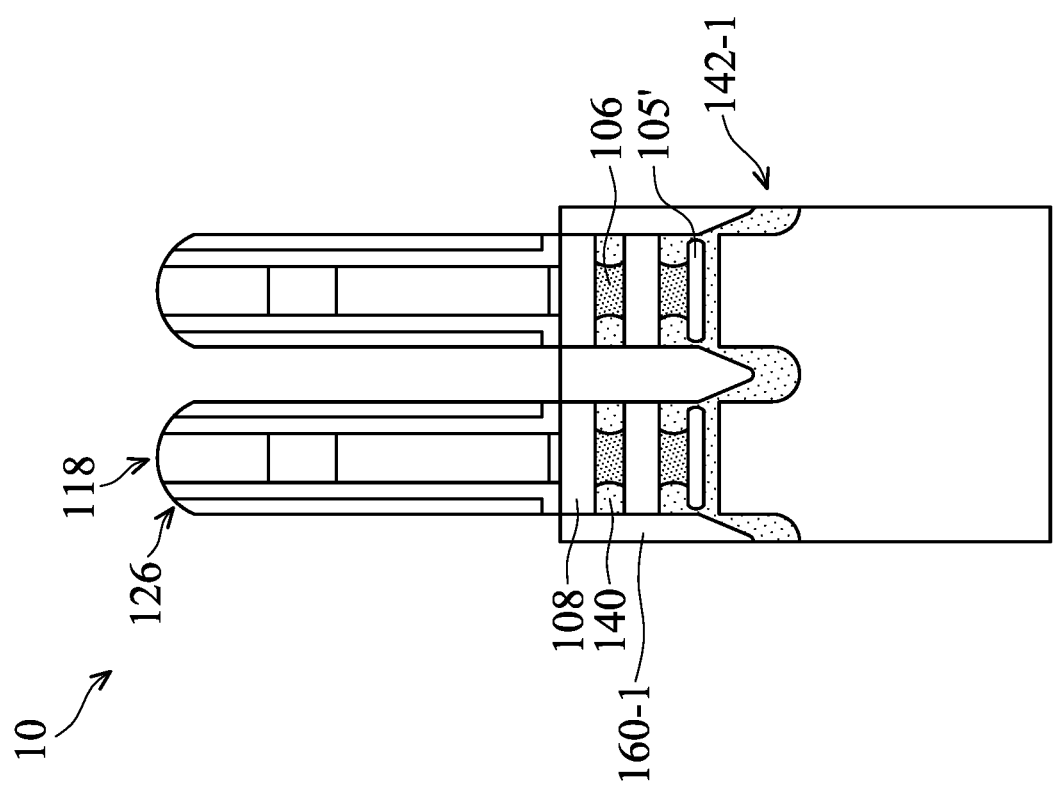

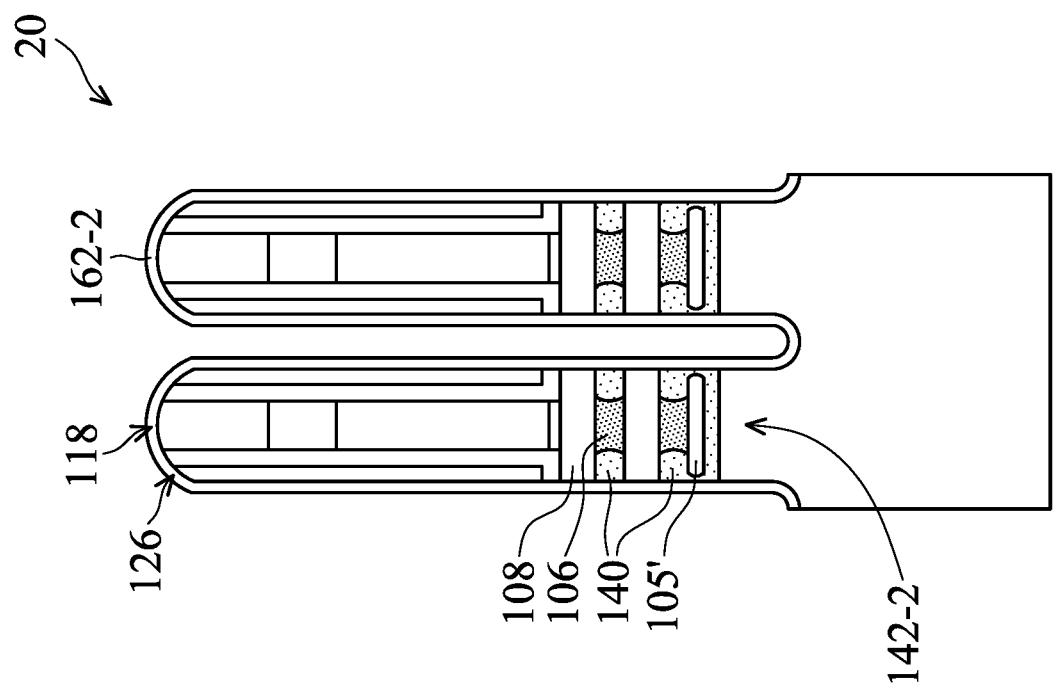
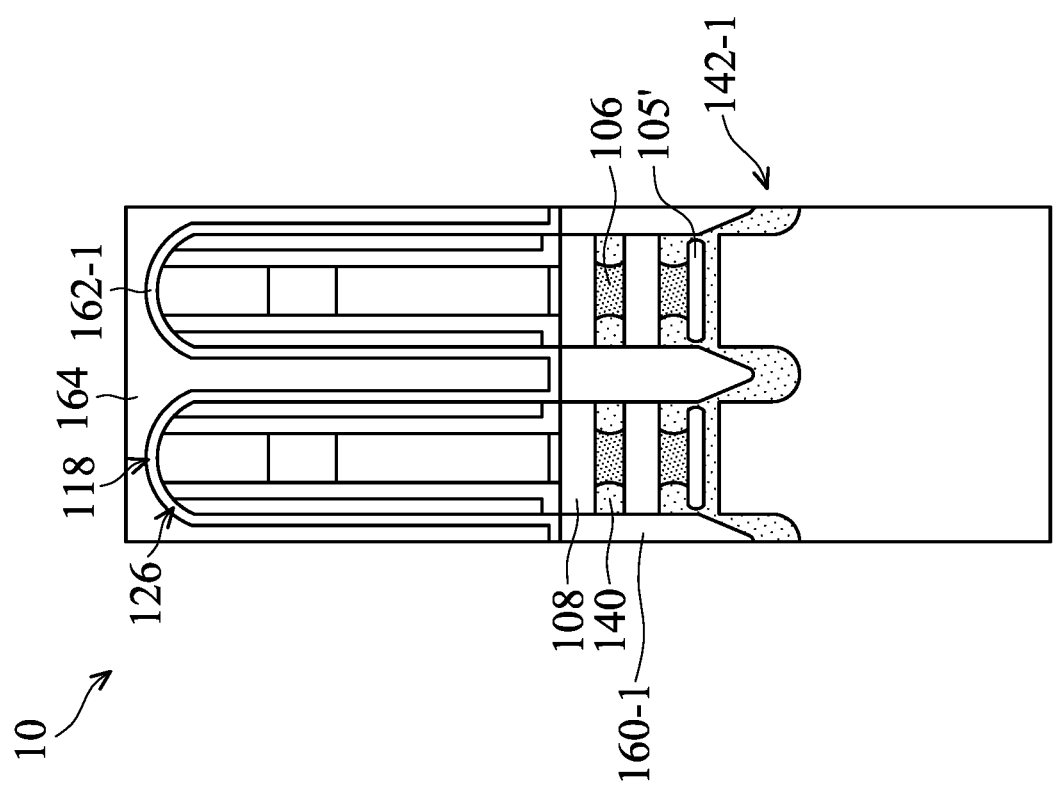

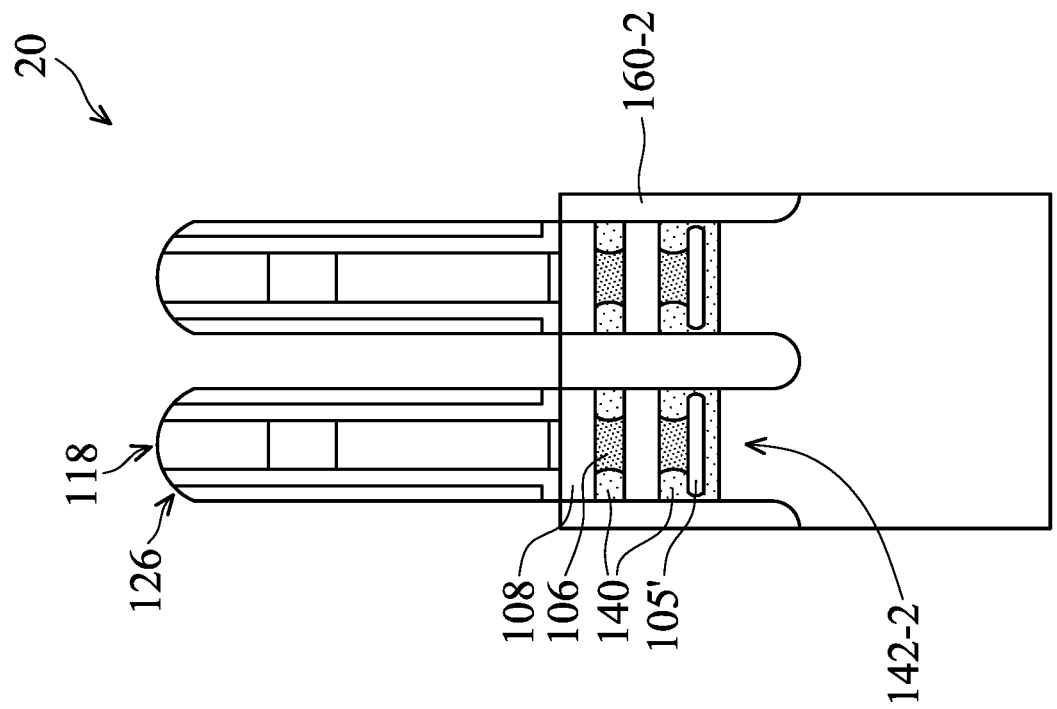
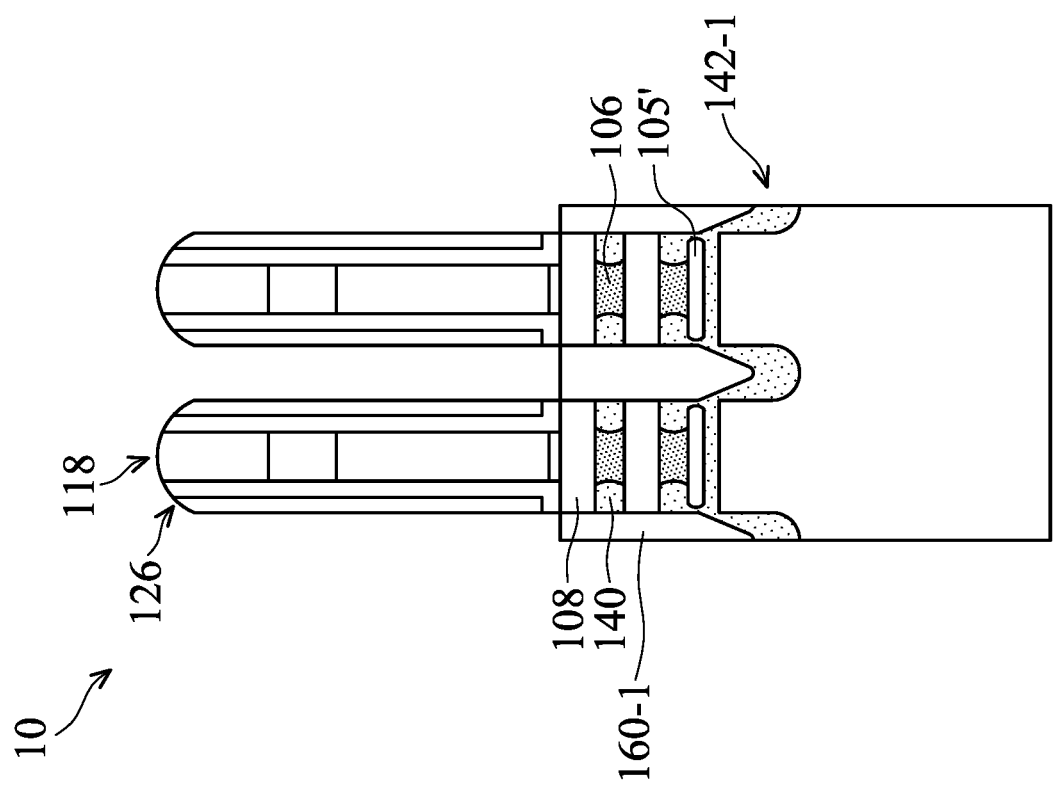

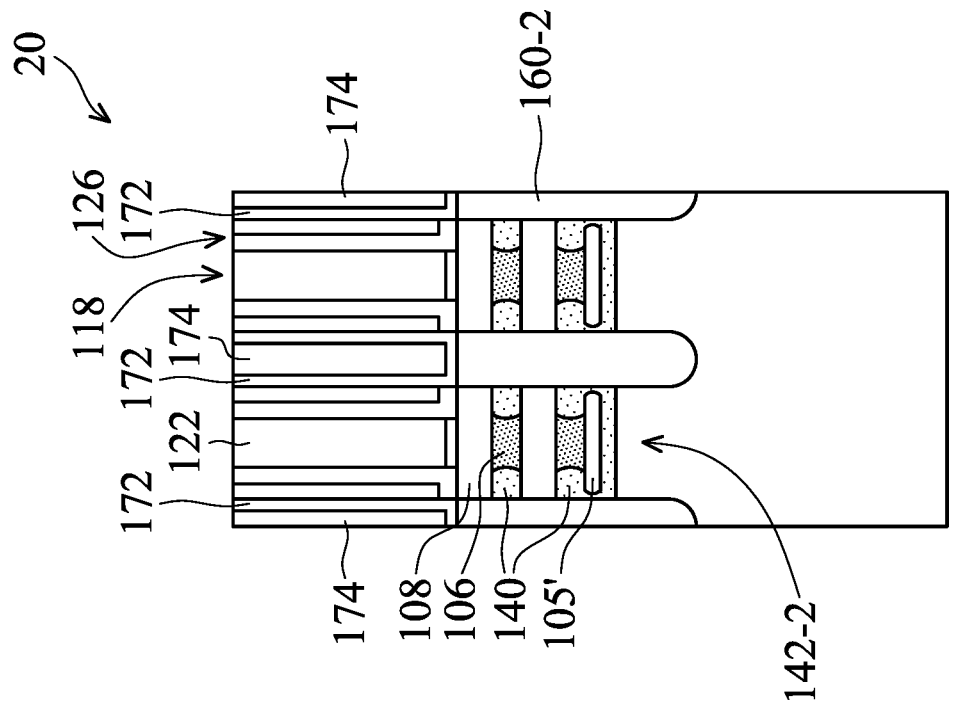
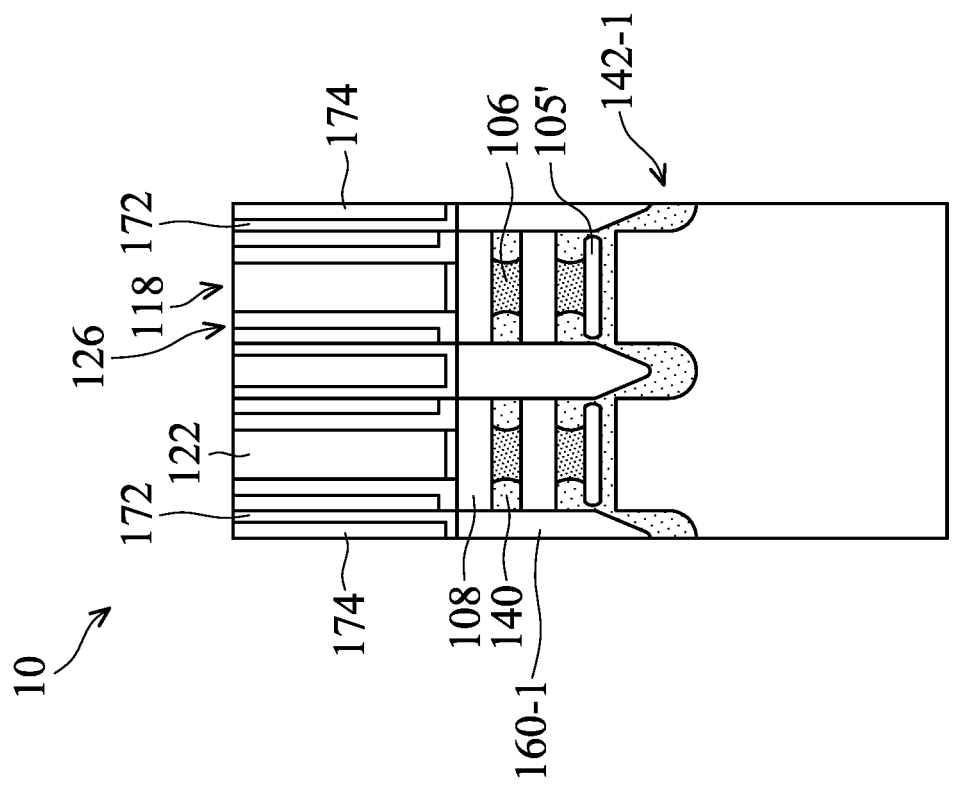

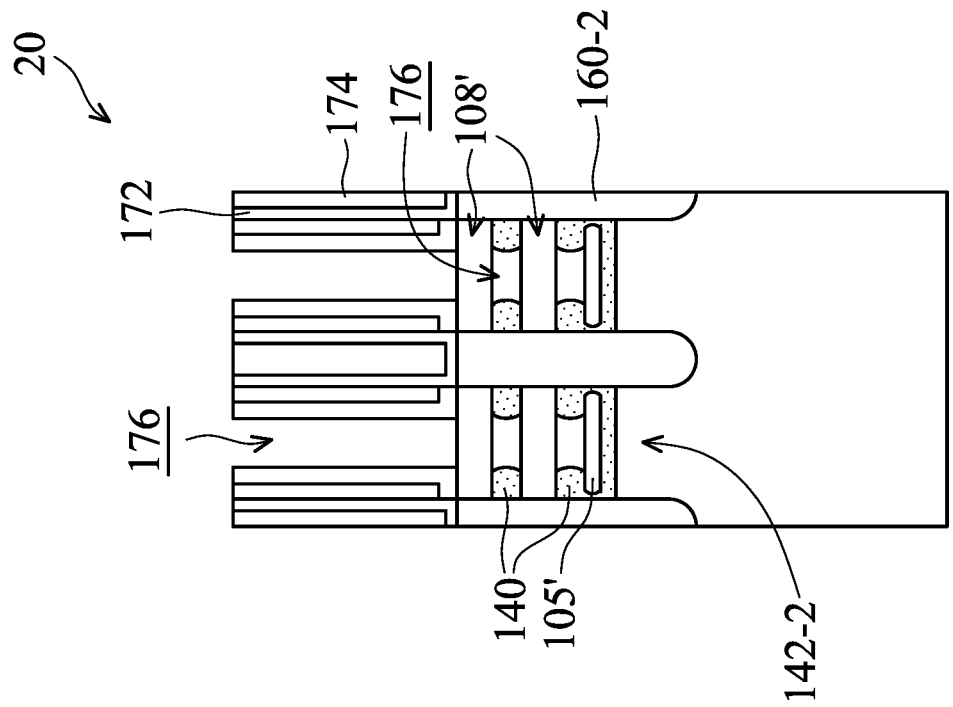
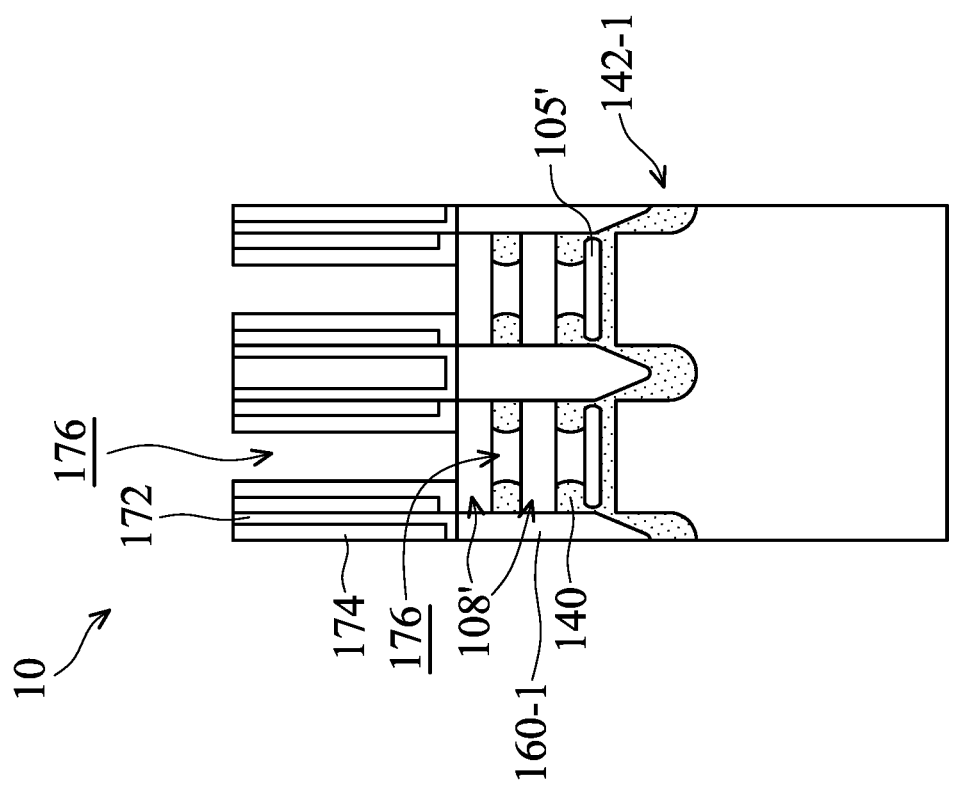

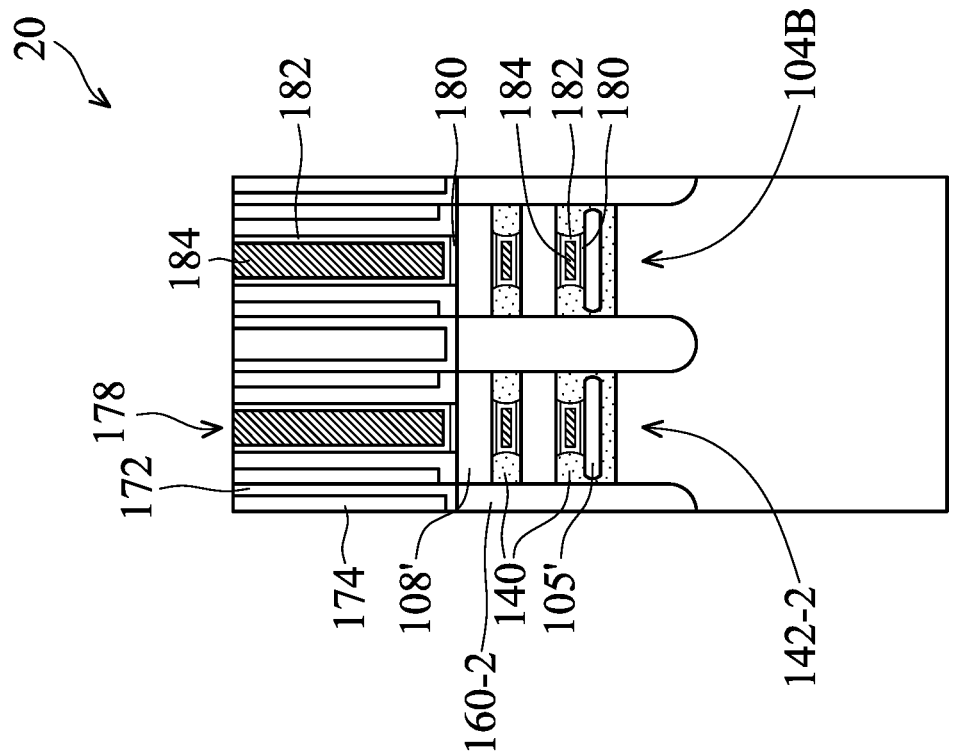
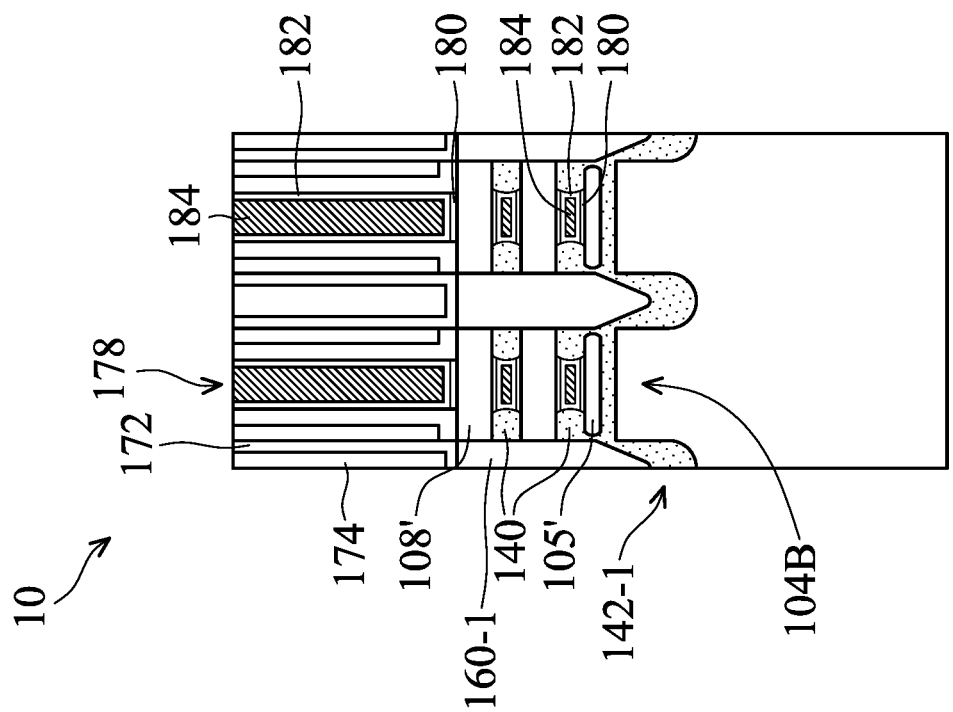
FIG. 2U-1
FIG. 2U-2

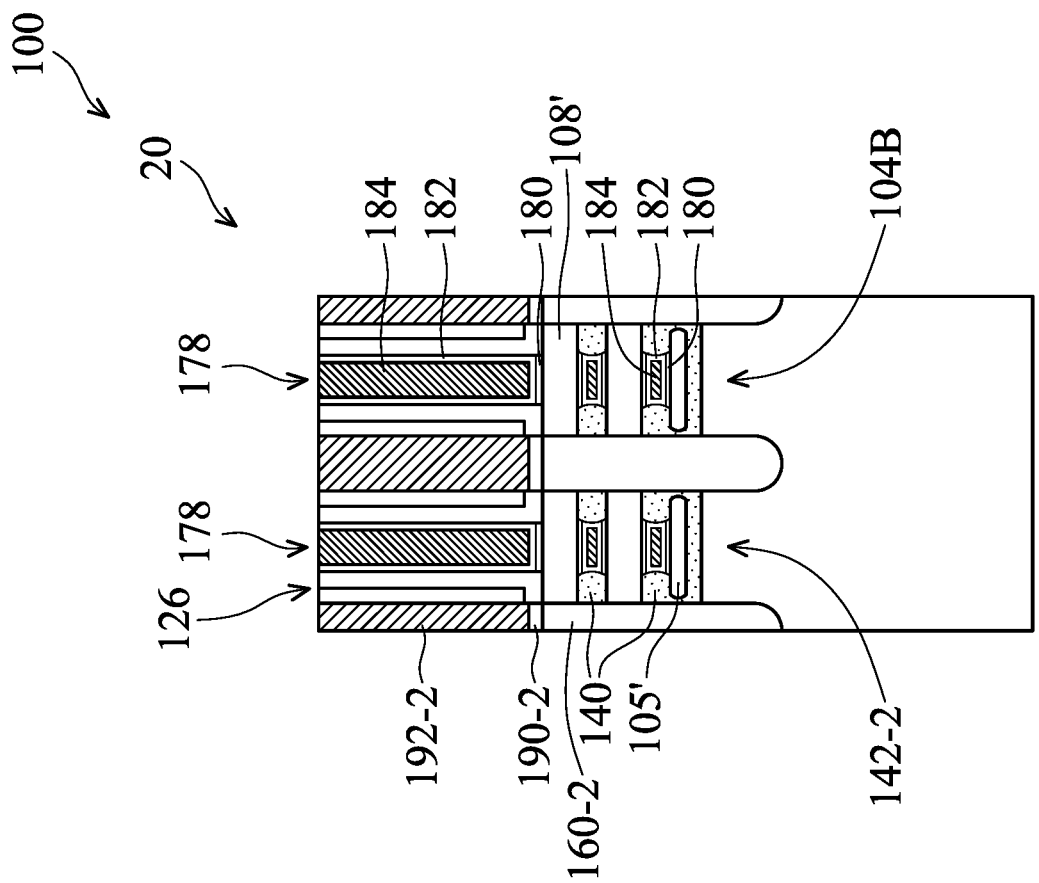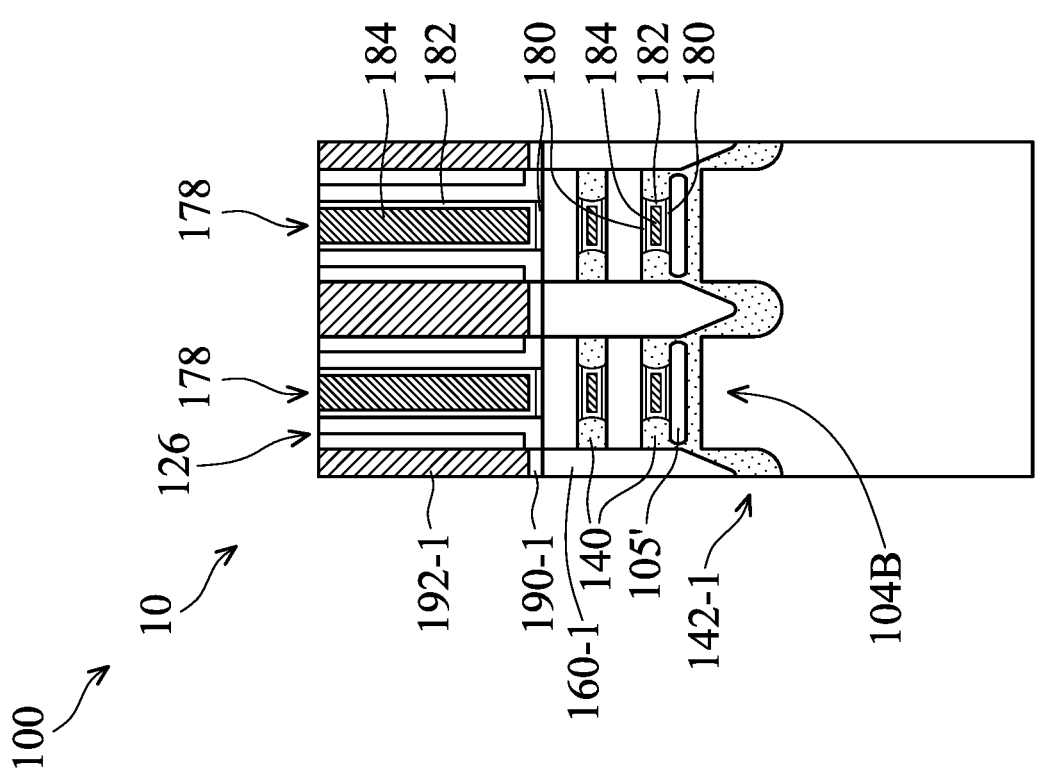

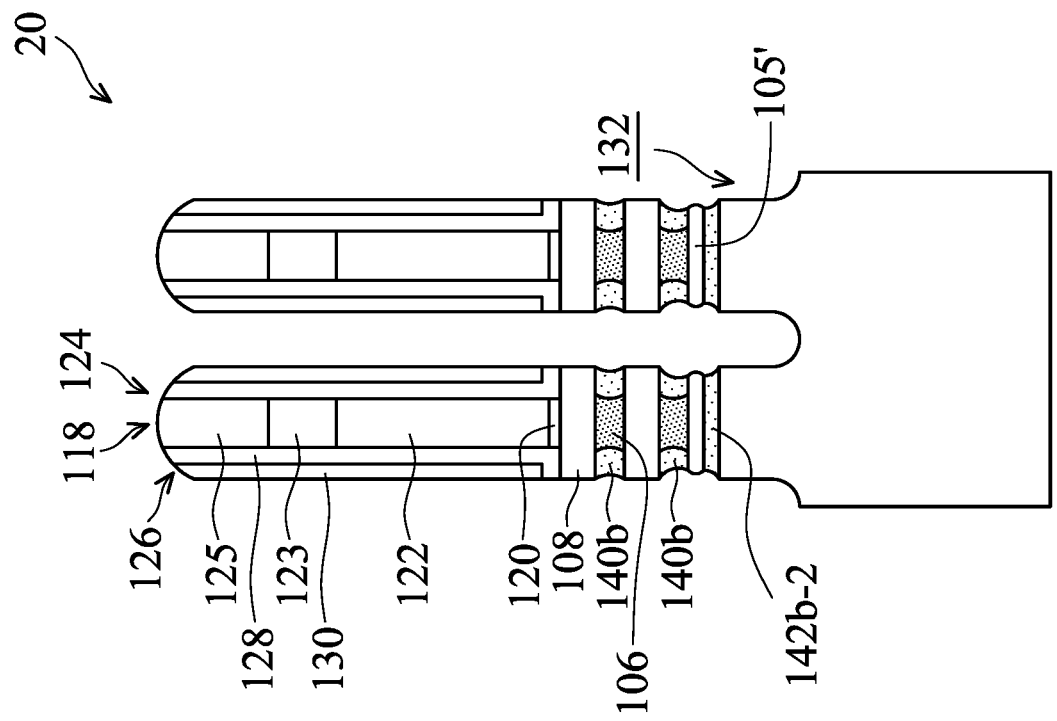
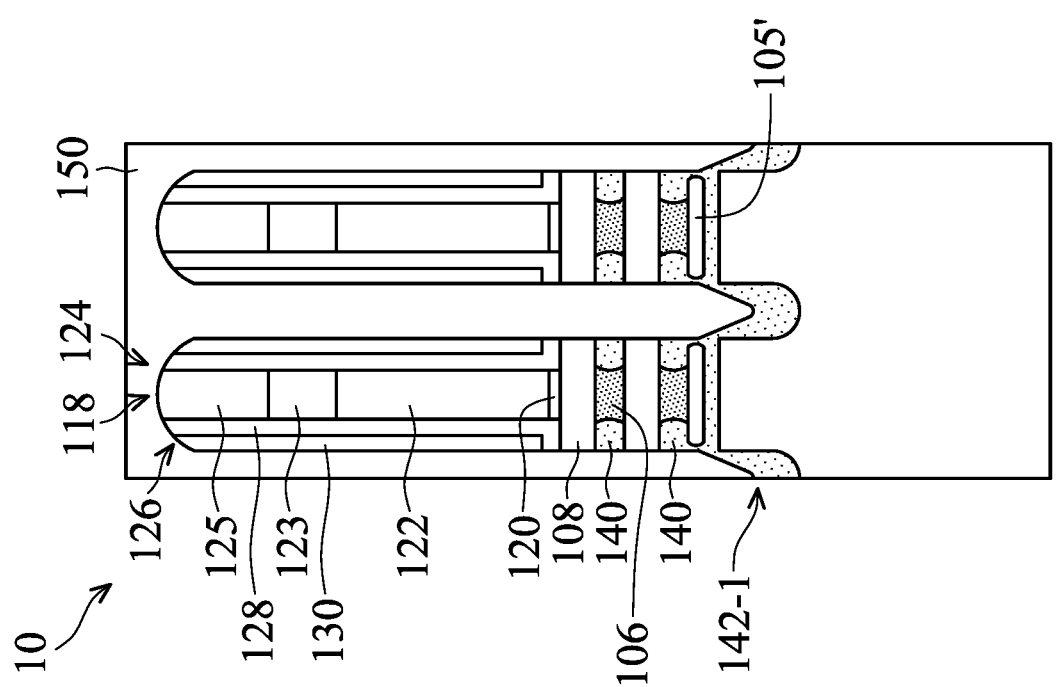

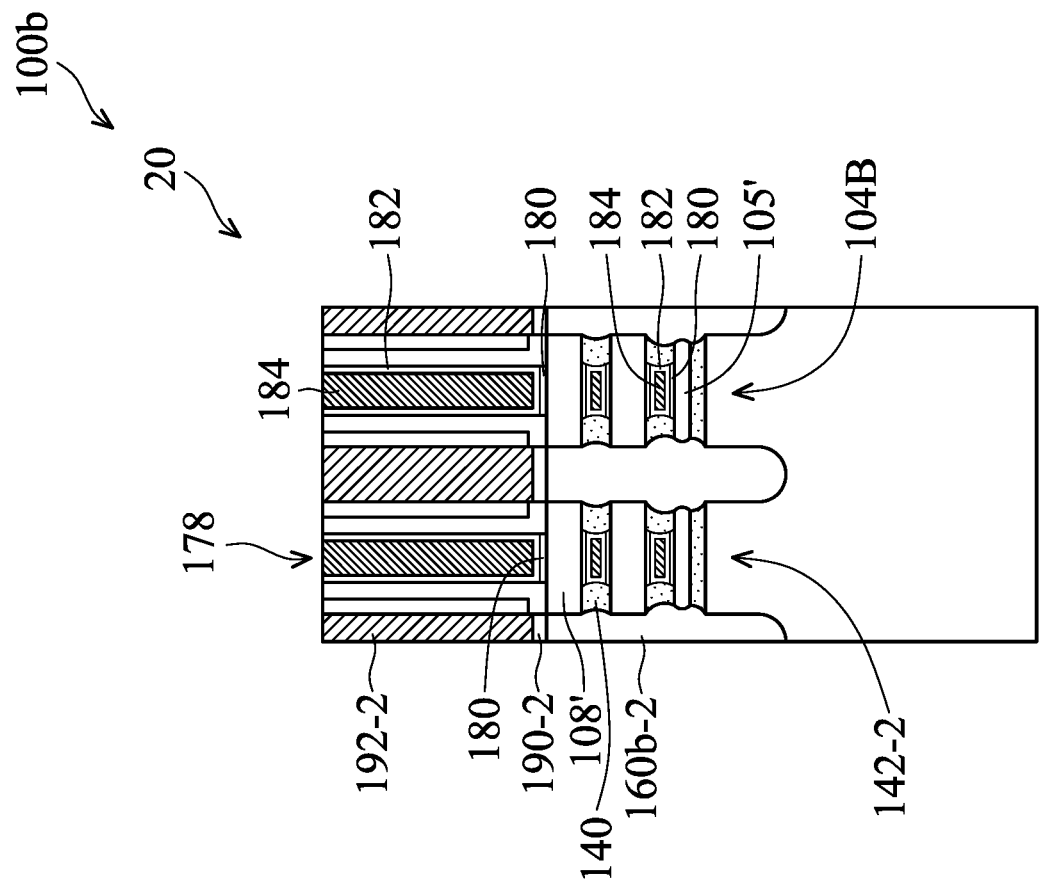
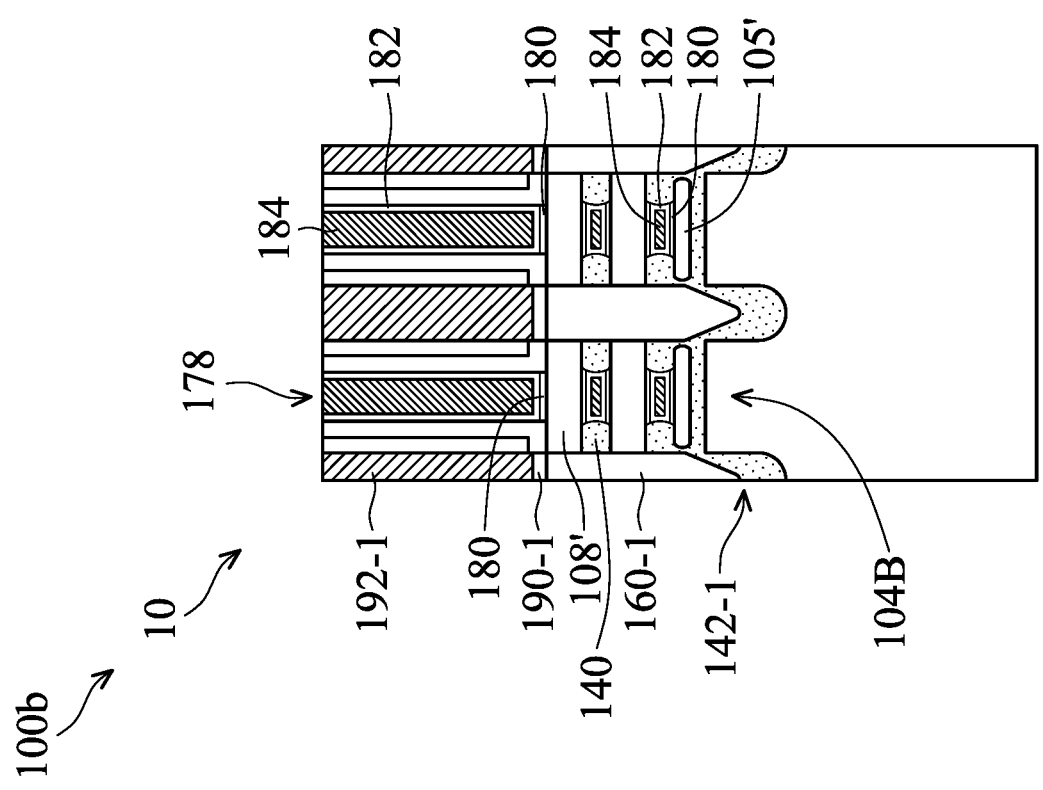
FIG. 5B-1
FIG. 5B-2

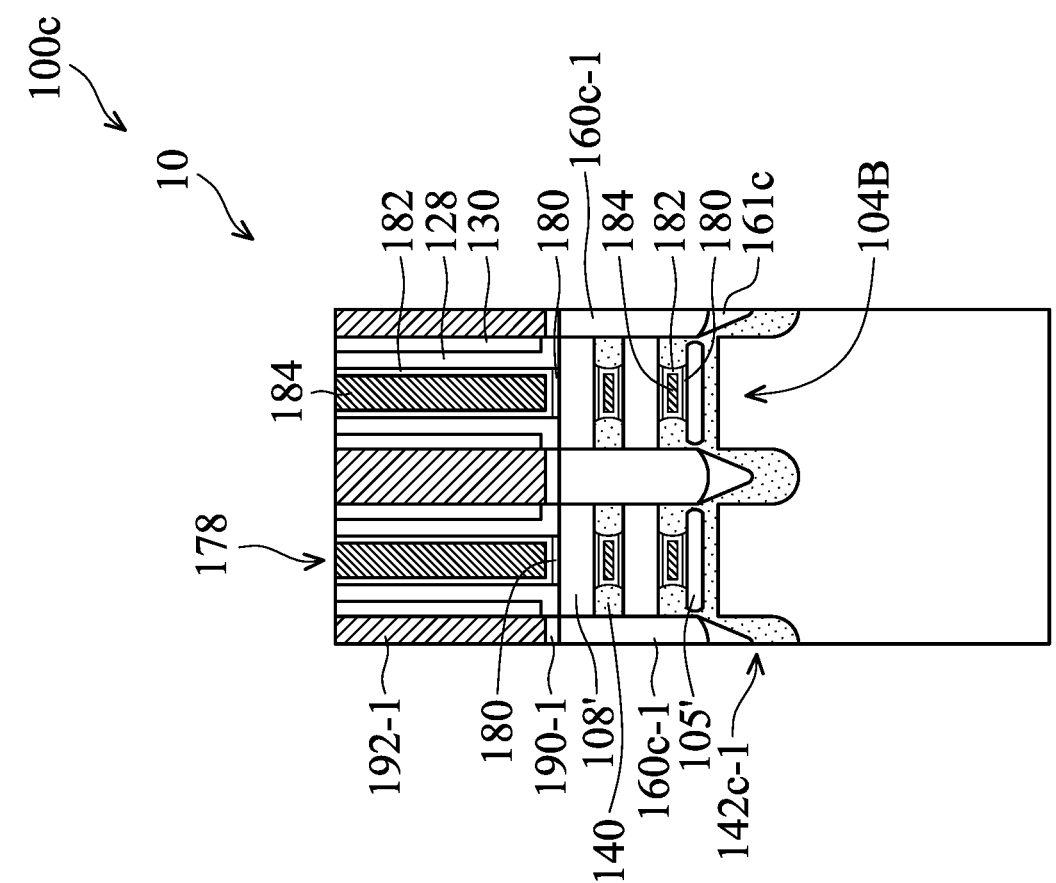
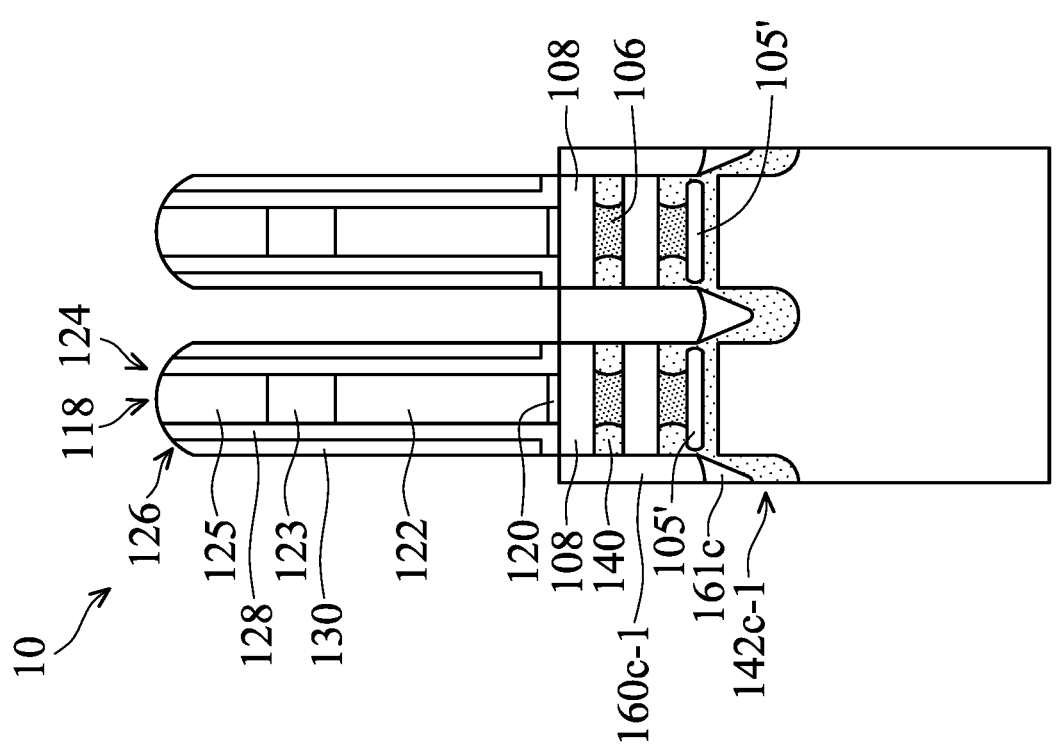

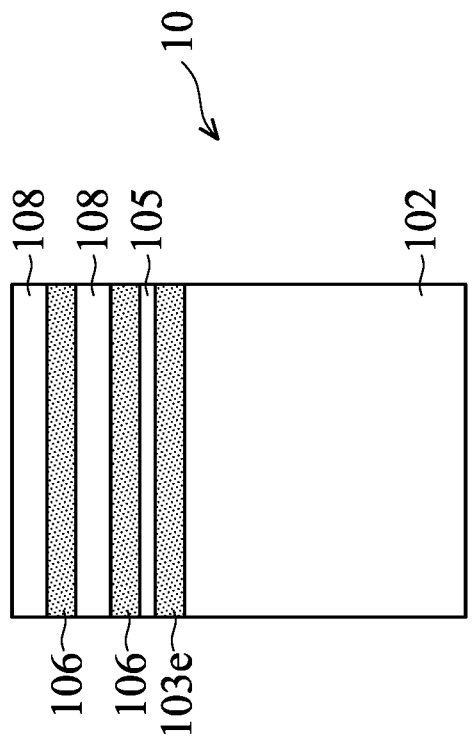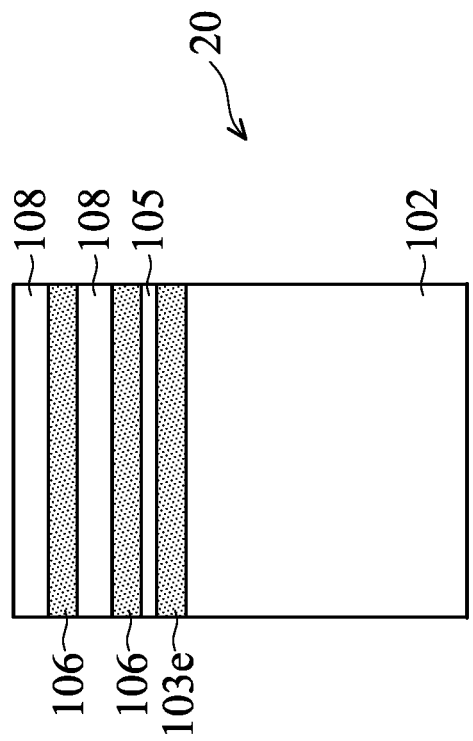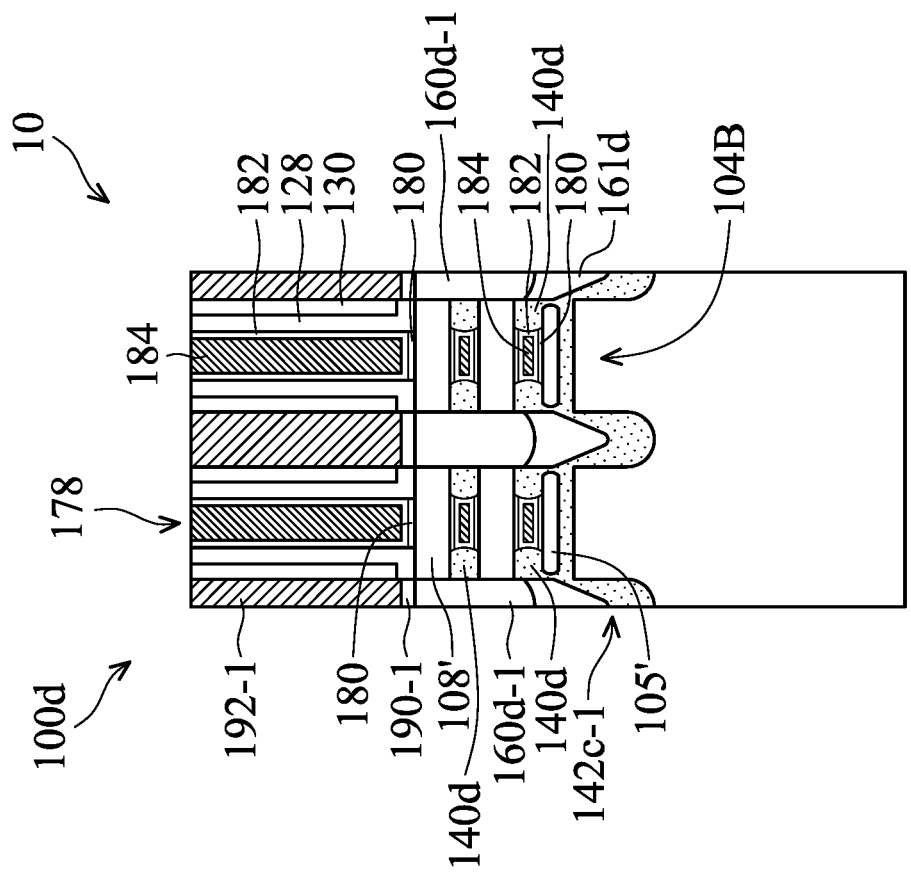

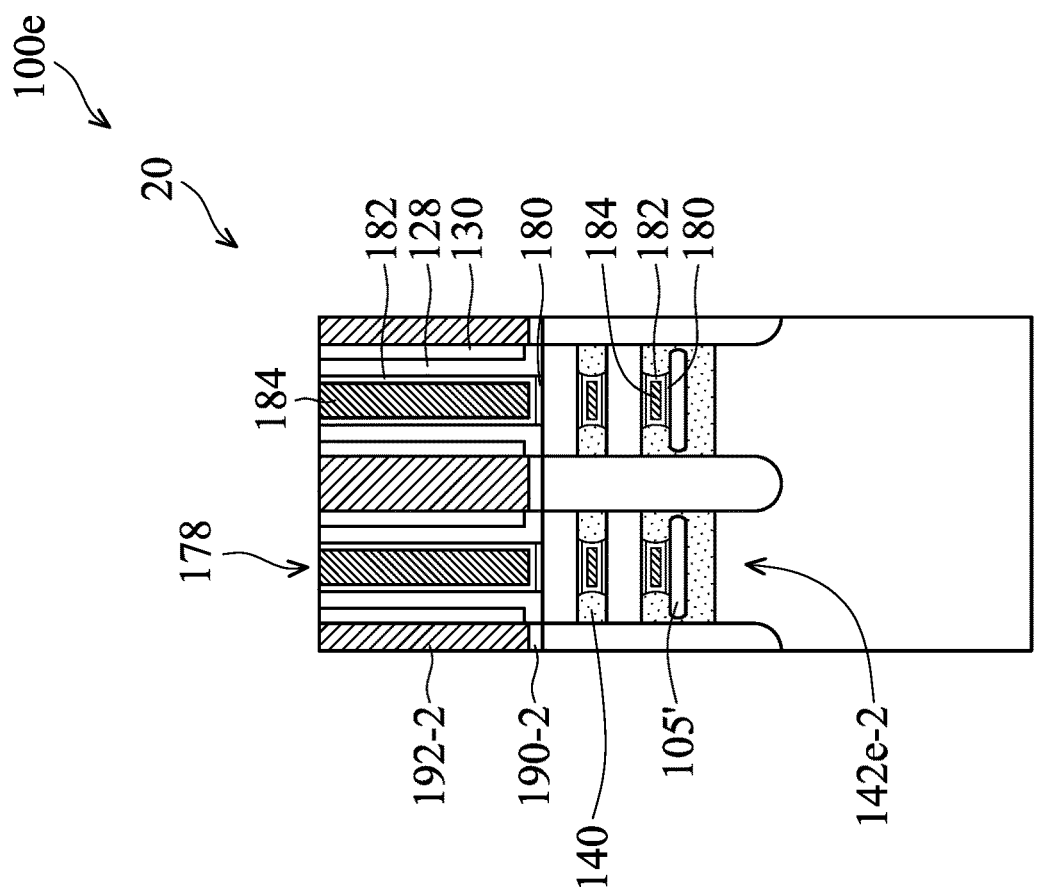
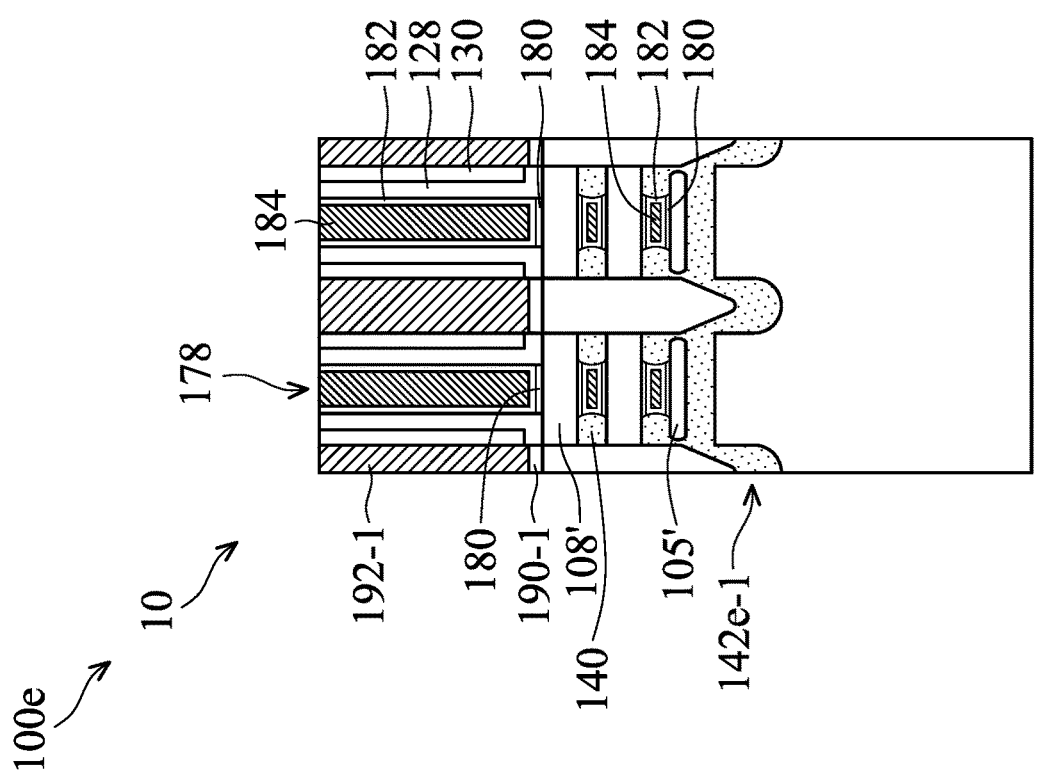
FIG. 8B-1
FIG. 8B-2

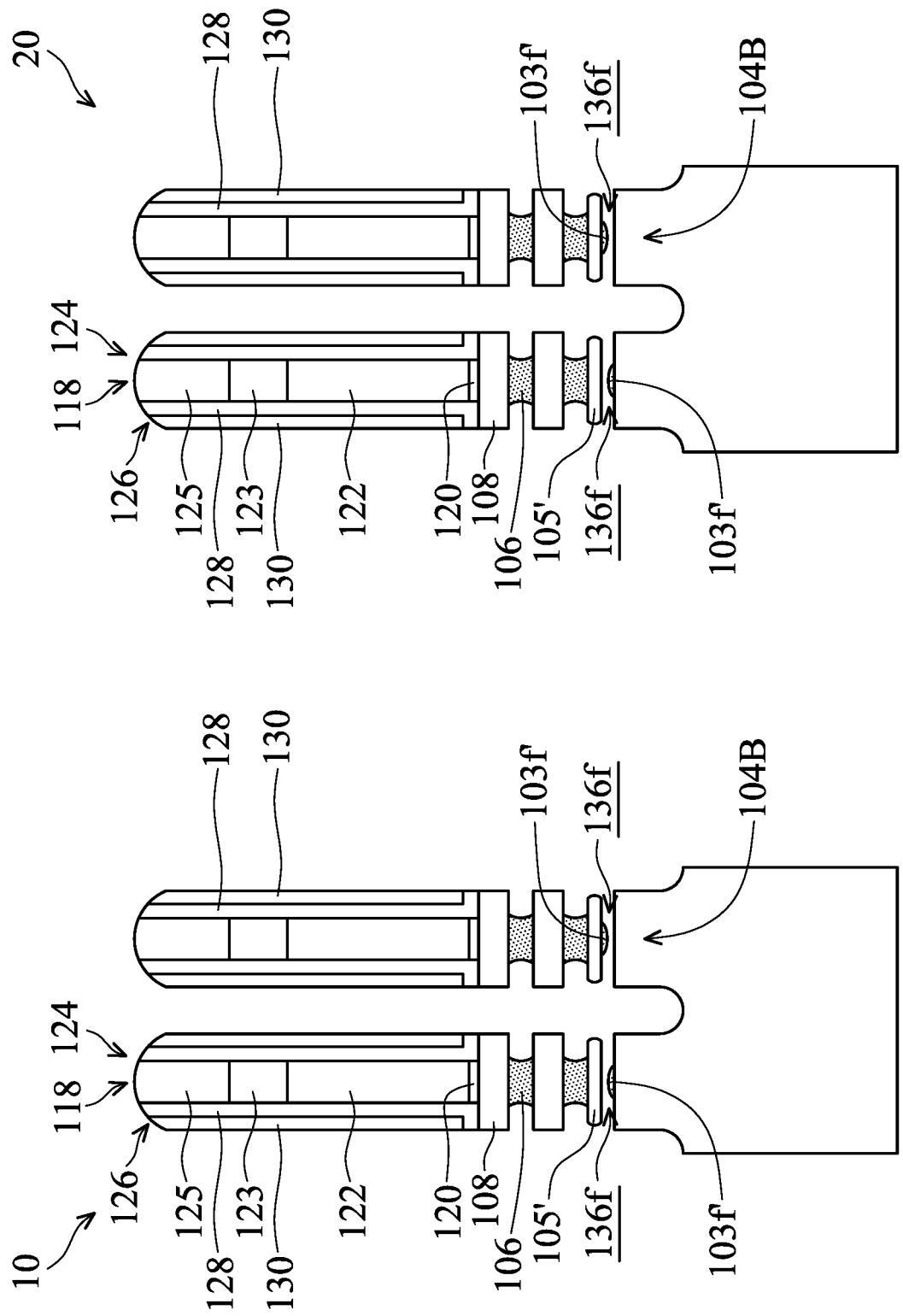

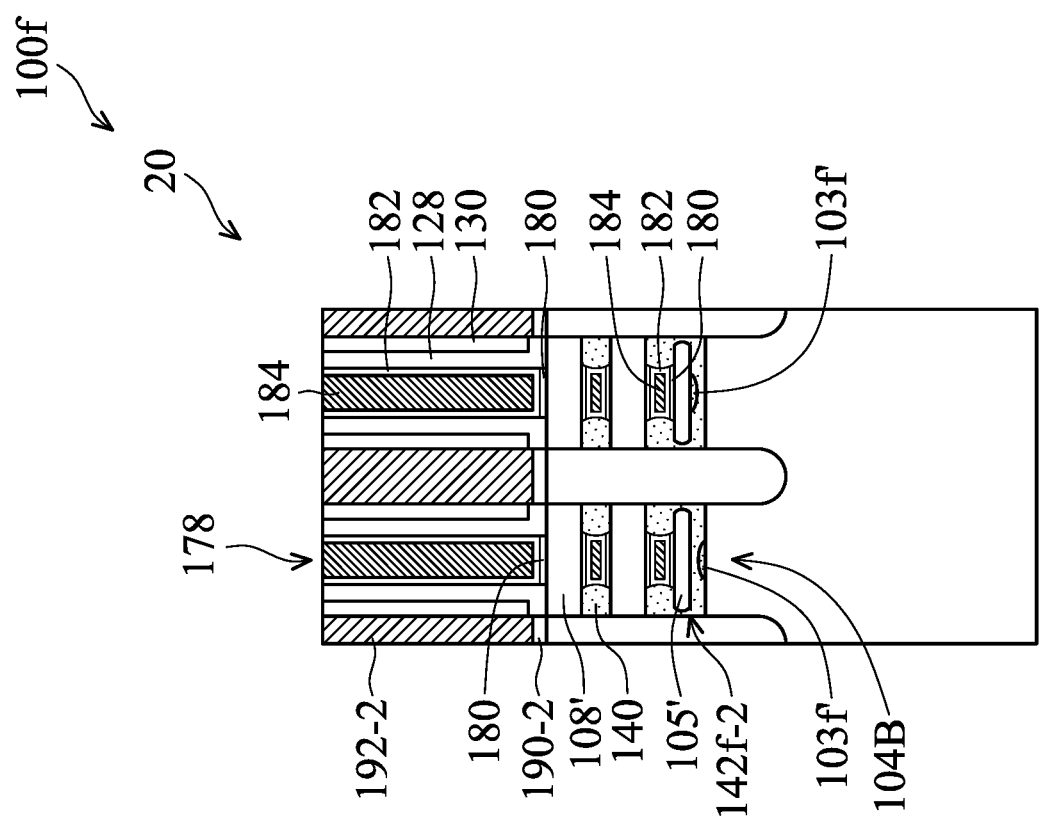
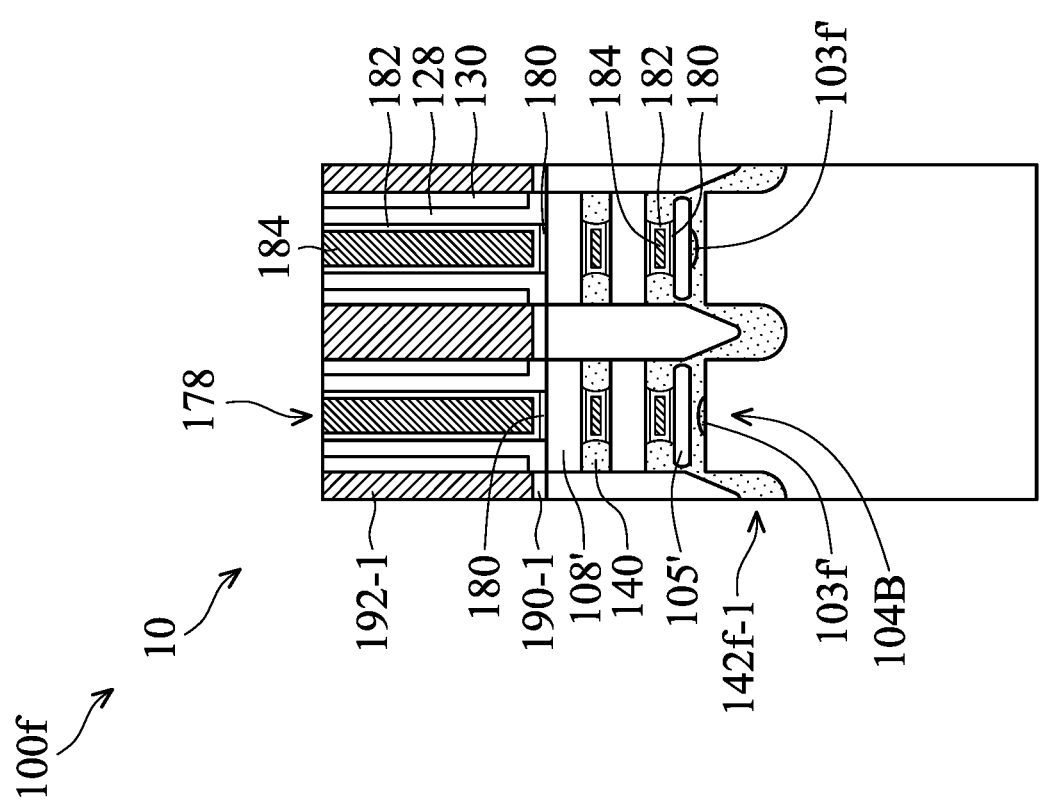
FIG. 9B-1
FIG. 9B-2

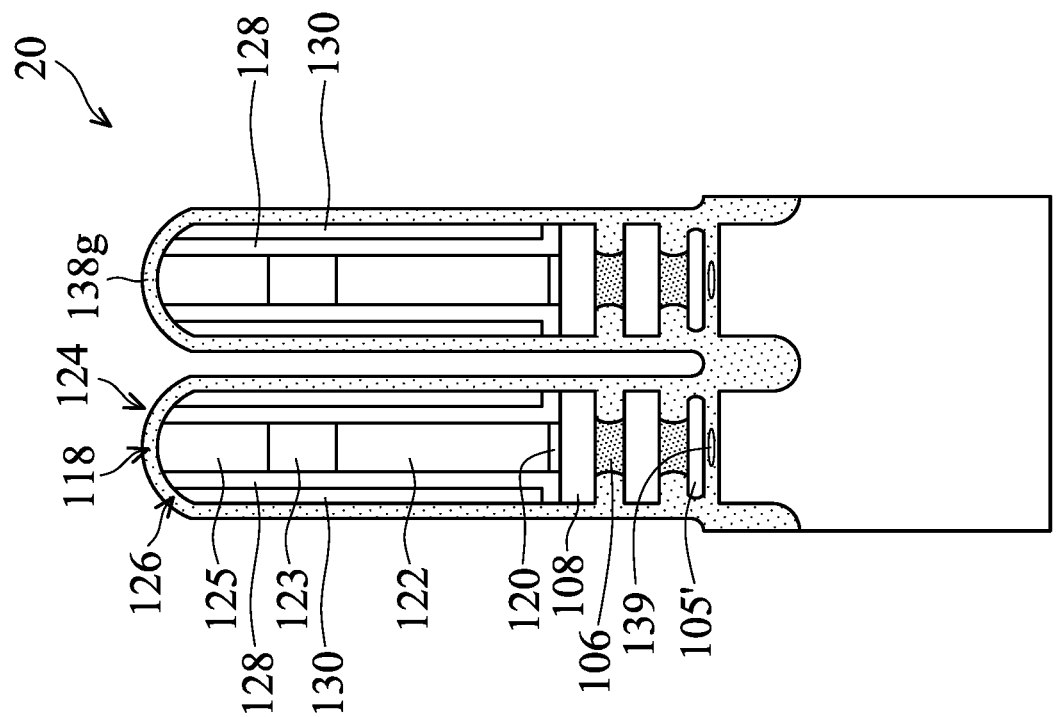
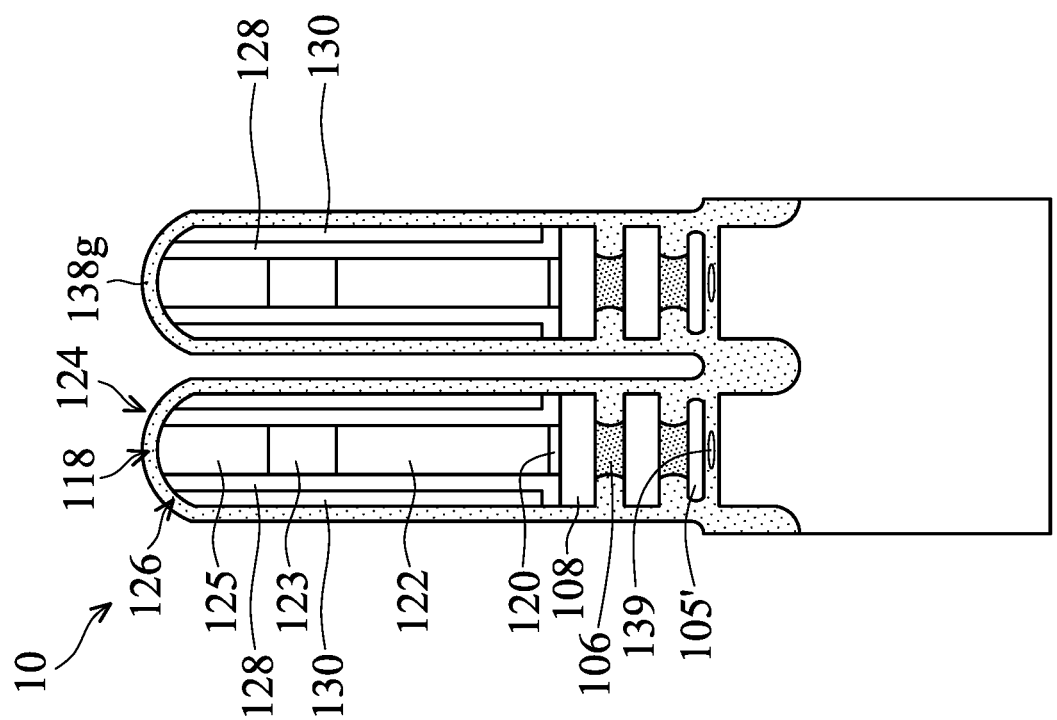

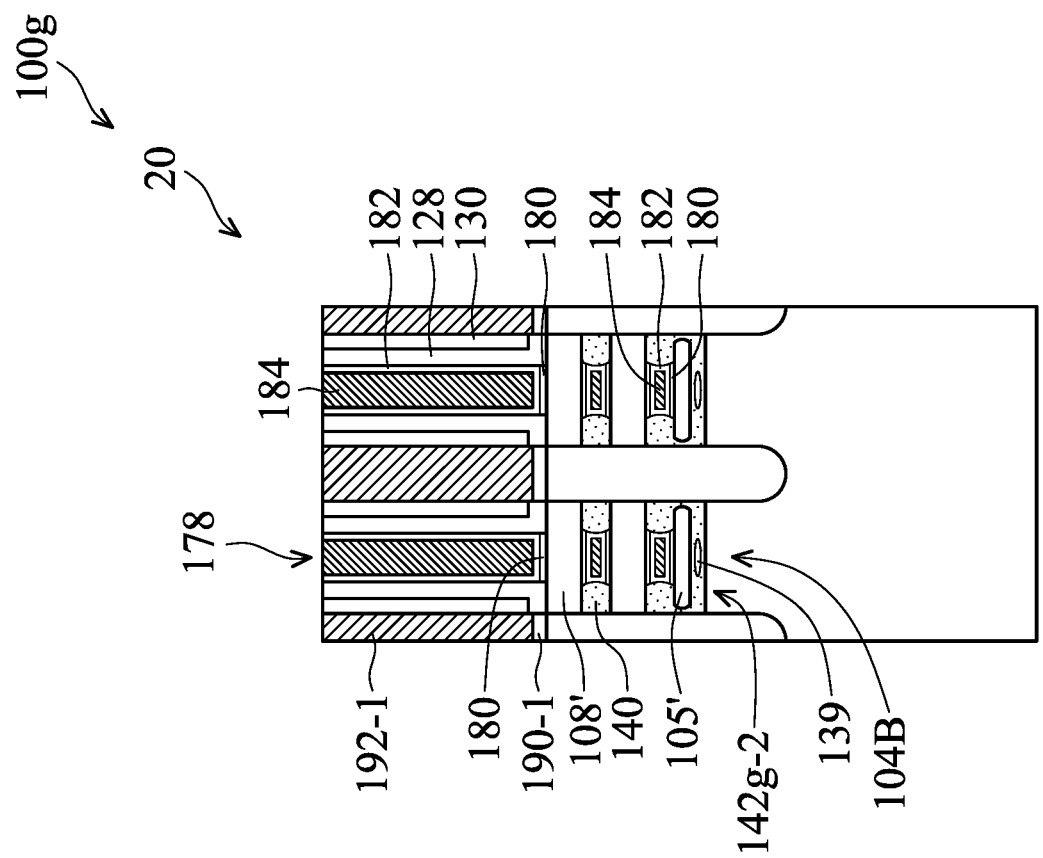
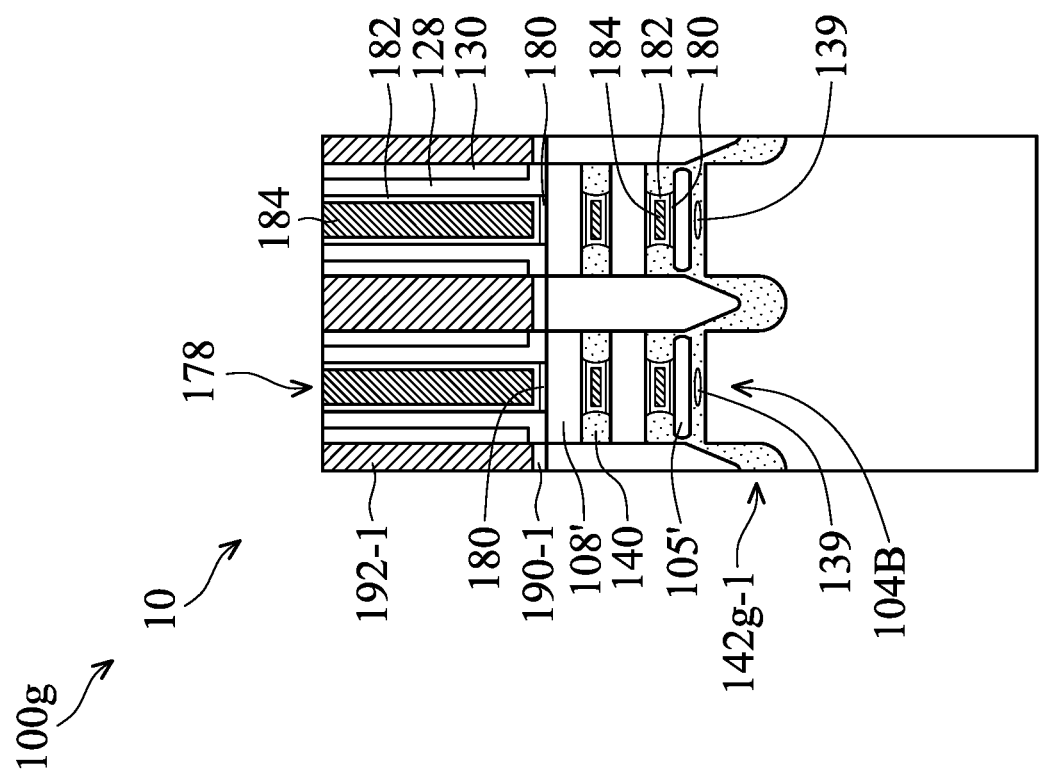
FIG. 10B-1
FIG. 10B-2

METHOD FOR MANUFACTURING SEMICONDUCTOR STRUCTURE WITH ISOLATION FEATURE

PRIORITY CLAIM AND CROSS-REFERENCE

This Application claims the benefit of U.S. Provisional Application No. 63/276,821, filed on Nov. 8, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication process of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1A-2 to 1D-2 illustrate diagrammatic perspective views of intermediate stages of manufacturing a second region 20 of the semiconductor structure in accordance with some embodiments.

FIGS. 2A-1 to 2V-1 illustrate cross-sectional views of intermediate stages of manufacturing the semiconductor structure in the first region along line A-A' shown in FIG. 2D-1 in accordance with some embodiments.

FIGS. 2A-2 to 2V-2 illustrate cross-sectional views of intermediate stages of manufacturing the semiconductor structure in the second region along line A-A' shown in FIG. 2D-2 in accordance with some embodiments.

FIGS. 4A-1 to 4D-1 and 4A-2 to 4D-2 illustrates cross-sectional views of intermediate stages of manufacturing the semiconductor structure in accordance with some other embodiments.

FIGS. 5A-1, 5A-2, 5B-1, and 5B-2 illustrate cross-sectional views of intermediate stages of manufacturing a semiconductor structure in accordance with some embodiments.

FIGS. 6A and 6B illustrate cross-sectional views of intermediate stages of manufacturing a semiconductor structure in accordance with some embodiments.

FIG. 7 illustrates a cross-sectional view of a semiconductor structure in accordance with some embodiments.

FIGS. 8A-1, 8A-2, 8B-1, and 8B-2 illustrate cross-sectional views of intermediate stages of manufacturing a semiconductor structure in accordance with some embodiments.

FIGS. 9A-1, 9A-2, 9B-1, and 9B-2 illustrate cross-sectional views of intermediate stages of manufacturing a semiconductor structure in accordance with some embodiments.

FIGS. 10A-1, 10A-2, 10B-1, and 10B-2 illustrate cross-sectional views of intermediate stages of manufacturing a semiconductor structure in accordance with some embodiments.

FIGS. 12-1, 12-2, 12-3, 12-4, 12-5, and 12-6 illustrate cross-sectional views of various regions of a semiconductor device in accordance with some embodiments.

DETAILED DESCRIPTION

Figures 1, 1A, 2:
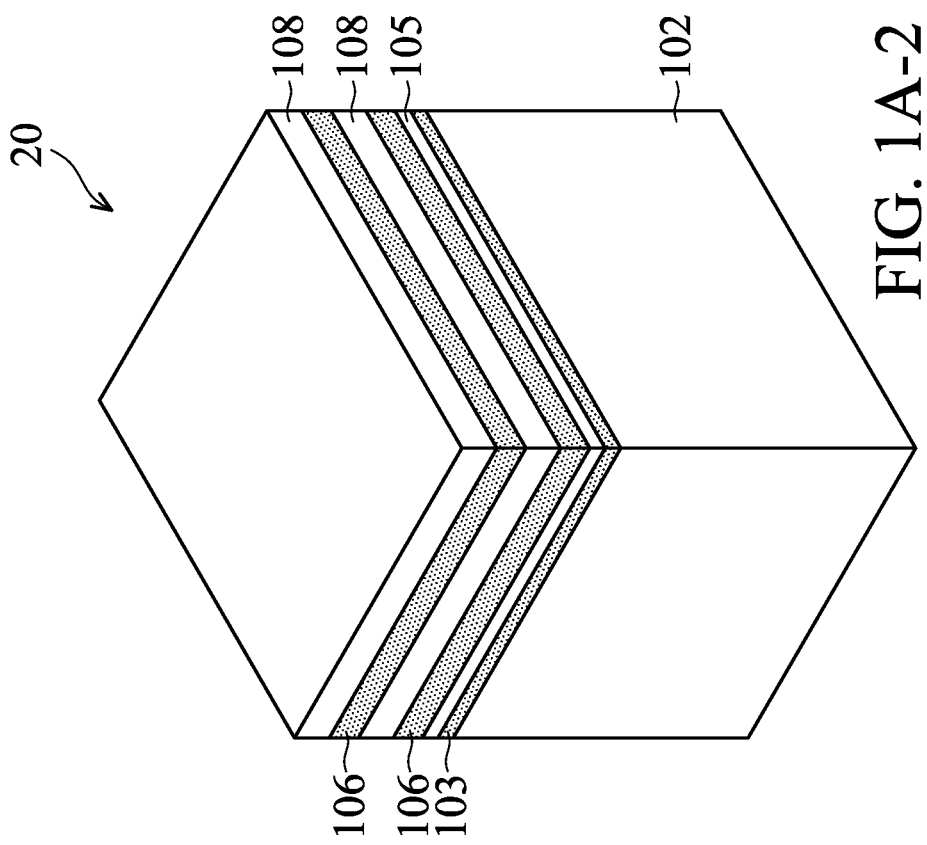
Figures 1, 1A:
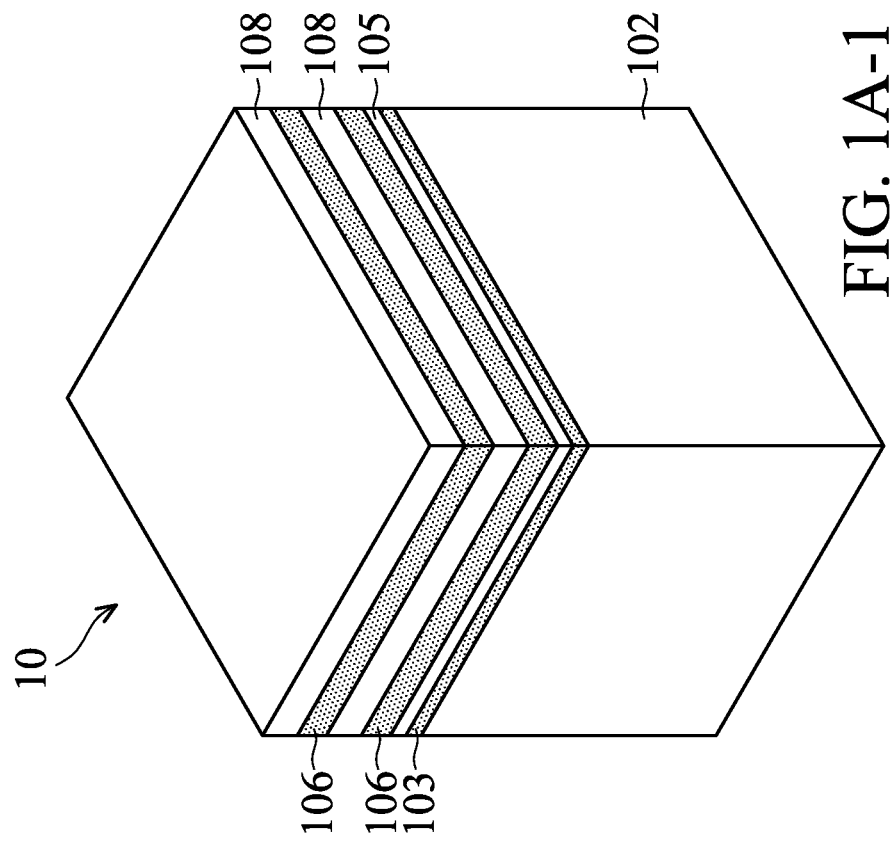
FIGS. 1A-1 to 1D-1 illustrate diagrammatic perspective views of intermediate stages of manufacturing a first region 10 of a semiconductor structure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nano-ribbon FET, and gate all around (GAA) transistors) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments of semiconductor structures and methods for forming the same are provided. The semiconductor structures may include nanostructures and source/drain structures connected to the nanostructures. In addition, a bottom isolation feature may be formed under the nanostructures in the channel region and under the source/drain structures in the source/drain region. The bottom isolation feature can help to prevent leakage through the substrate, and therefore the performance of the resulting device may be improved.

Figures 1, 1B:
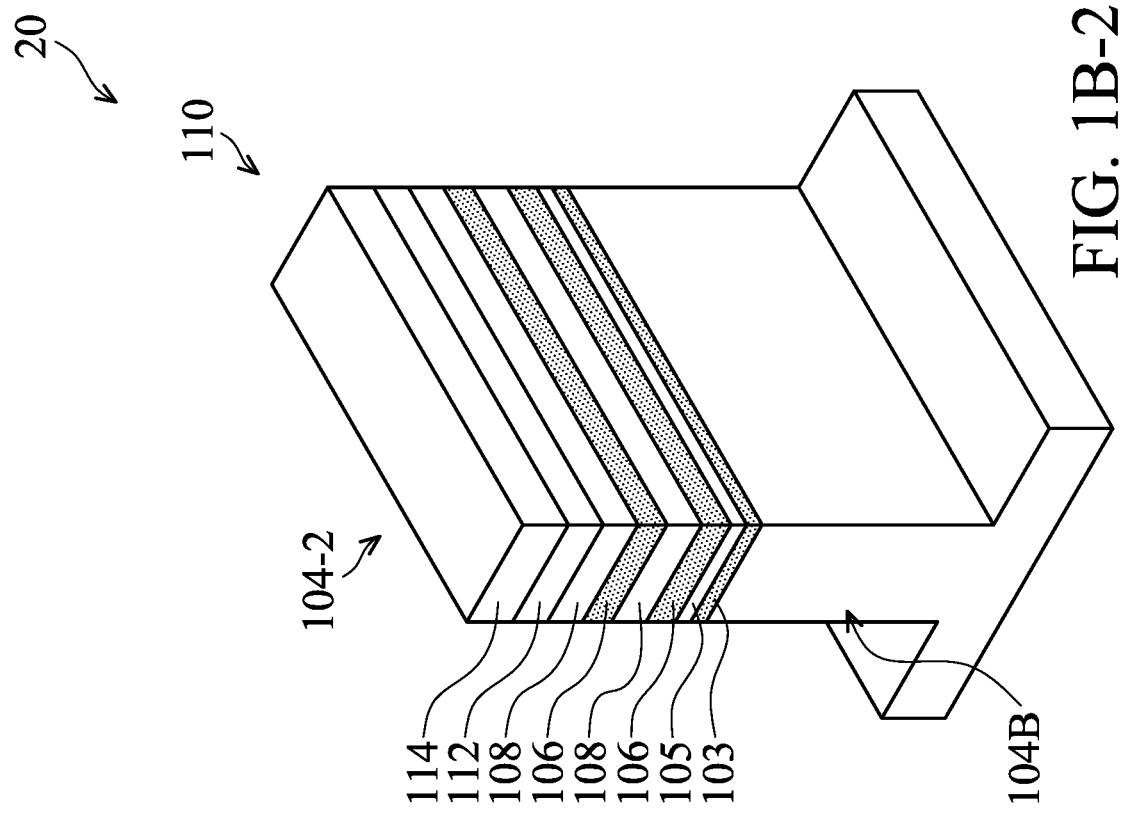
Figures 1, 1B, 2:
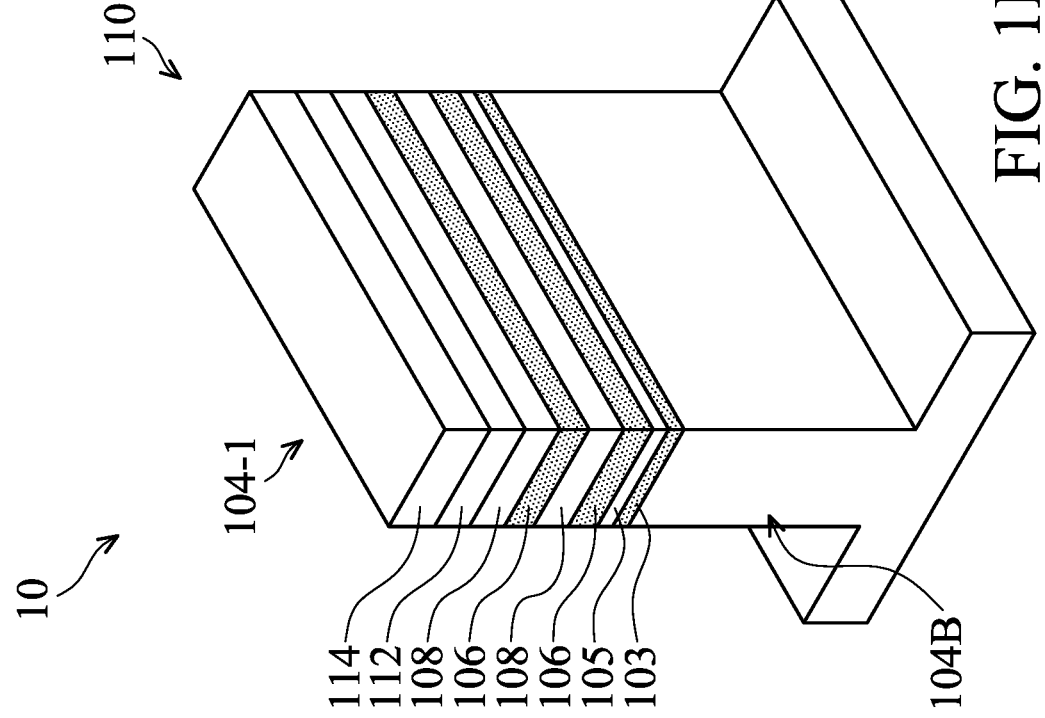
Figures 1, 1C, 2:
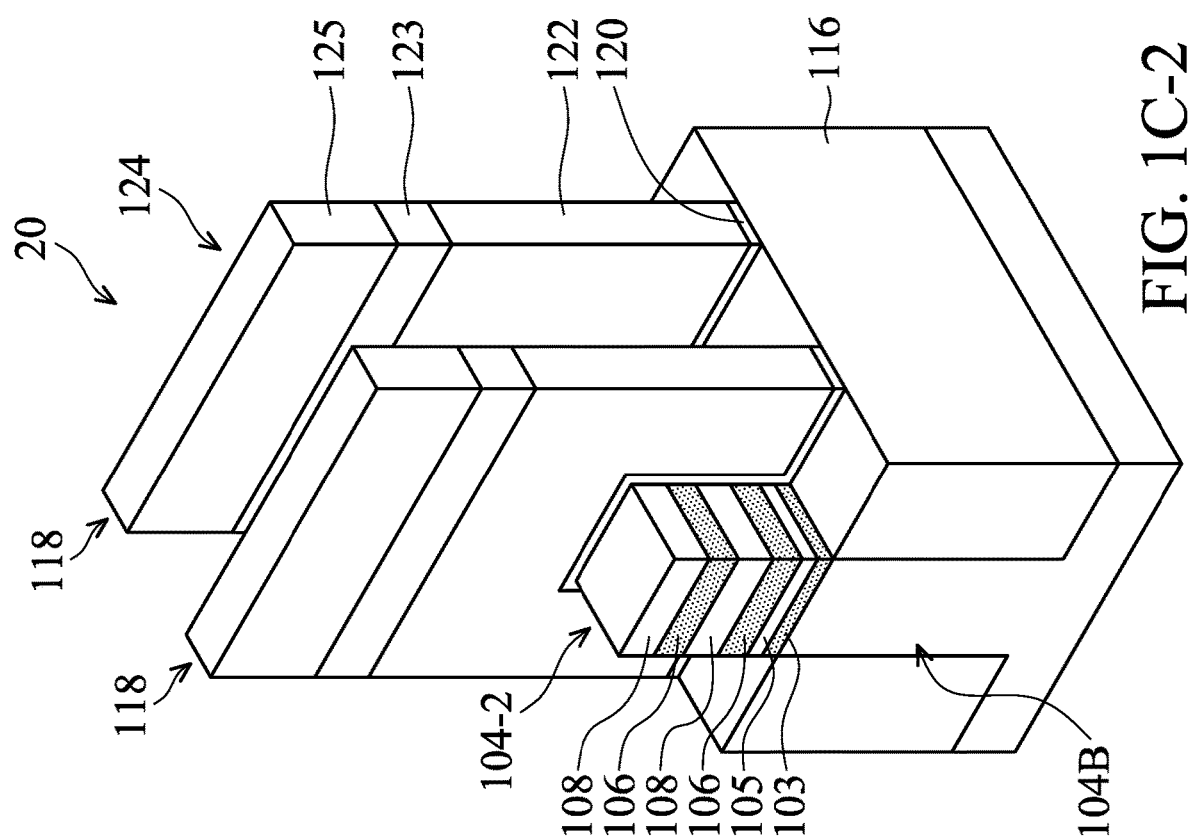
Figures 1, 1C:
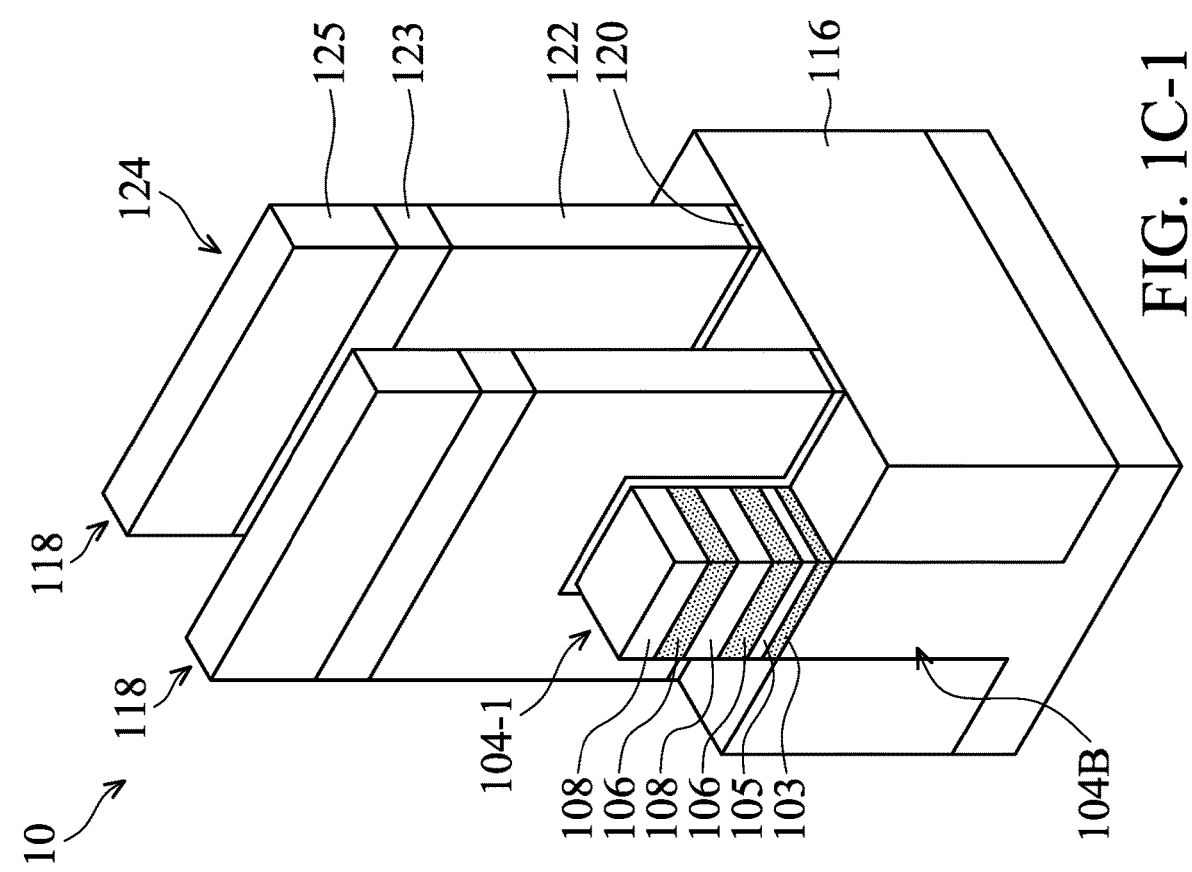
Figures 1, 1D:
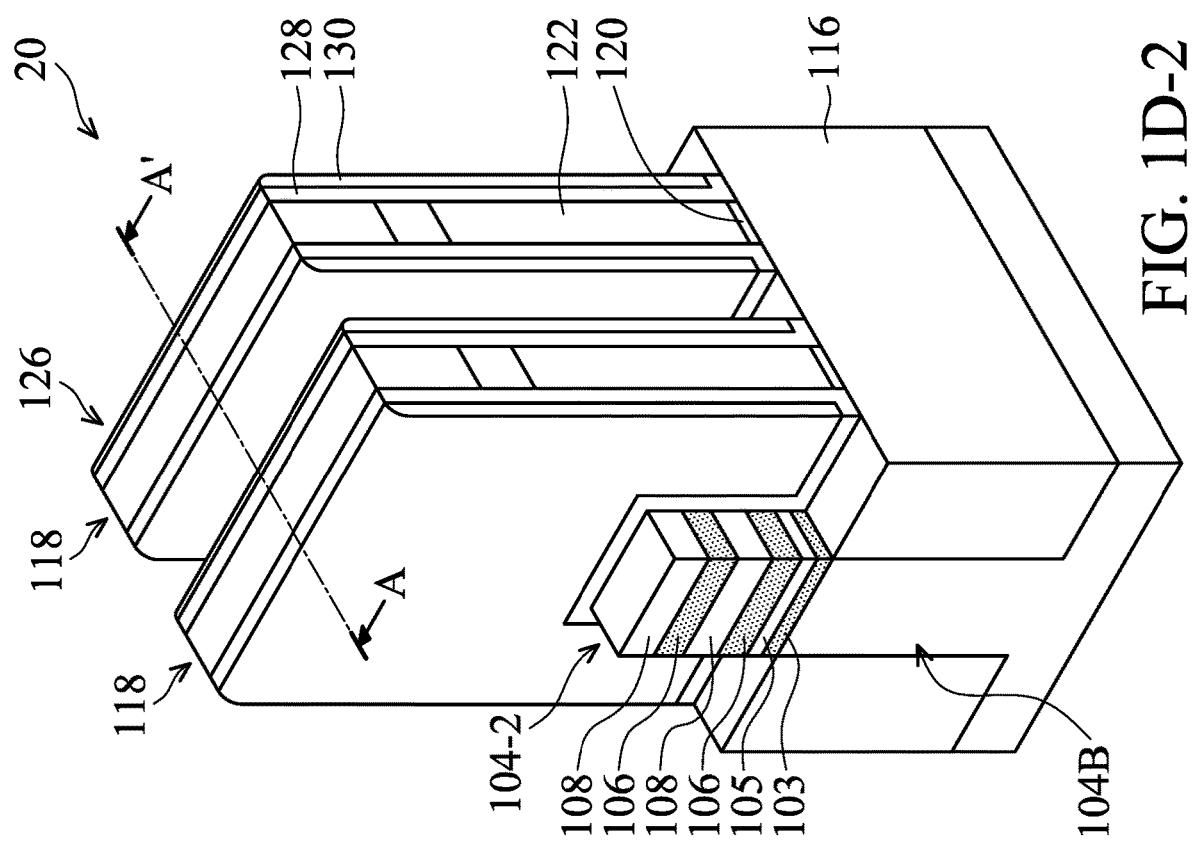
Figures 1, 1D, 2:
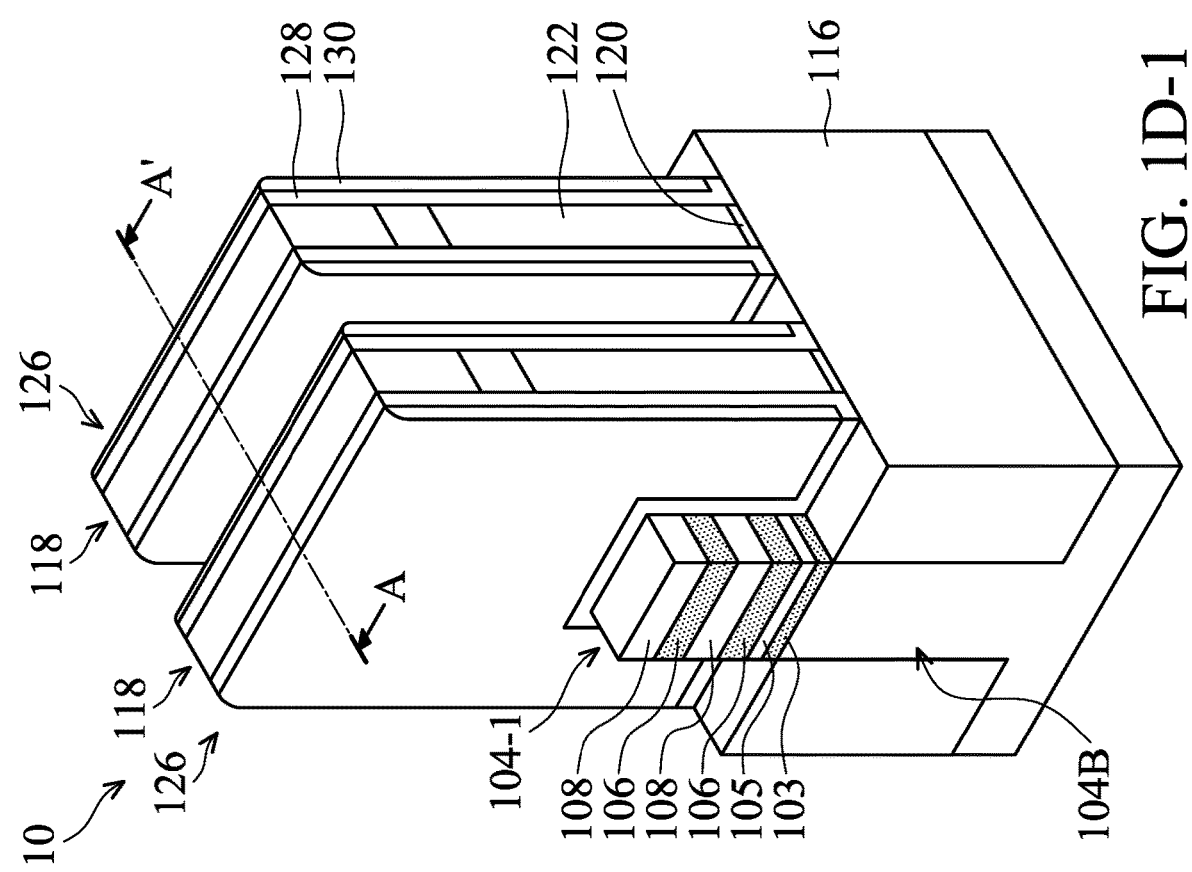

FIGS. 1A-1 to 1D-1 illustrate diagrammatic perspective views of intermediate stages of manufacturing a first region 10 of a semiconductor structure 100, and FIGS. 1A-2 to 1D-2 illustrate diagrammatic perspective views of intermediate stages of manufacturing a second region 20 of the semiconductor structure 100 in accordance with some embodiments.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high-frequency transistors, other applicable components, or combinations thereof. In some embodiments, the first region 10 is a first type active region, and the second region 20 in a second type active region in the semiconductor structure 100. In some embodiments, the first region 10 includes a portion of an NMOS transistor structure and the second region 20 includes a portion of a PMOS transistor structure.

First, a dummy bottom layer 103, a bottom semiconductor layer 105, and a semiconductor stack are sequentially formed over a substrate 102, as shown in FIGS. 1A-1 and 1A-2 in accordance with some embodiments. In addition, the semiconductor stack includes first semiconductor material layers 106 and second semiconductor material layers 108 formed over the bottom semiconductor layer 105 in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

The dummy bottom layer 103 is formed over the substrate 102 and is configured to be replaced by a bottom isolation feature in subsequent processes. In some embodiments, the dummy bottom layer 103 is thinner than the first semiconductor material layers 106 in the semiconductor stack. The dummy bottom layer 103 should be thick enough to provide enough space for the bottom isolation feature afterwards but should not be too thick or the gap formed by removing the dummy bottom layer 103 may be too large and forming the bottom isolation feature therein may be challenging. In some embodiments, the dummy bottom layer 103 has a thickness in a range from about 2 nm to about 5 nm.

In some embodiments, the dummy bottom layer 103 is made of a semiconductor material, such as SiGe. In some embodiments, the Ge concentration in the dummy bottom layer 103 is in a range from about 30% to about 40%. The Ge concentration in the dummy bottom layer 103 should be high enough so it can have good etching selectivity toward the bottom semiconductor layer 105 formed above. On the other hand, the Ge concentration in the dummy bottom layer 103 should not be too high, or the formation of the dummy bottom layer 103 over the substrate 102 may become challenging.

The bottom semiconductor layer 105 is configured to provide a greater process window for forming the bottom isolation feature afterwards. Therefore, the bottom semiconductor layer 105 should be thick enough to provide the process window for forming the bottom isolation feature in subsequent processes. On the other hand, the bottom semiconductor layer 105 should still be thin enough so it can still be fully depleted during the device operation. In some embodiments, the bottom semiconductor layer 105 has a thickness less than 3 nm.

In some embodiments, the bottom semiconductor layer 105 is made of a semiconductor material different from that the dummy bottom layer 103 is made of. The bottom semiconductor layer 105 and the dummy bottom layer 103 are made of different materials, so that the dummy bottom layer 103 can be removed in subsequent processes while the bottom semiconductor layer 105 can be substantially remain. In some embodiments, the dummy bottom layer 103 is made of SiGe, and the bottom semiconductor layer 105 is made of Si.

After the bottom semiconductor layer 105 is formed, the first semiconductor material layers 106 and the second semiconductor material layers 108 are alternately stacked over the bottom semiconductor layer 105 to form the semiconductor stack. In some embodiment, the first semiconductor material layers 106 and the second semiconductor material layers 108 are made of different semiconductor materials. In some embodiments, the first semiconductor material layers 106 and the dummy bottom layer 103 are made of the same semiconductor material. In some embodiments, the dummy bottom layer 103 and the first semiconductor material layer 106 are both made of SiGe but the Ge concentrations in the dummy bottom layer 103 and the first semiconductor material layer 106 are different. In some embodiments, the Ge concentration in the dummy bottom layer 103 is greater than the Ge concentration in the first semiconductor material layers 106 by more than about 10%.

In some embodiments, the second semiconductor material layers 108 and the bottom semiconductor layer 105 are made of the same material. In some embodiments, the first semiconductor material layers 106 and the dummy bottom layer 103 are both made of SiGe, and the second semiconductor material layers 108 and the bottom semiconductor layer 105 are both made of Si.

It should be noted that although two first semiconductor material layers 106 and two second semiconductor material layers 108 are shown in the figures, the semiconductor structure may include more first semiconductor material layers 106 and second semiconductor material layers 108. For example, the semiconductor structure may include two to five of the first semiconductor material layers 106 and two to five of the second semiconductor material layers 108.

The dummy bottom layer 103, the bottom semiconductor layer 105, the first semiconductor material layers 106, and the second semiconductor material layers 108 may be formed using low-pressure chemical vapor deposition (LPCVD), epitaxial growth process, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor material stack, the semiconductor material stack, the bottom semiconductor layer 105, the dummy bottom layer 103, and the substrate 102 are patterned to form a fin structure 104-1 in the first region 10 and a fin structure 104-2 in the second region 20, as shown in FIGS. 1B-1 and 1B-2 in accordance with some embodiments.

In some embodiments, the fin structures 104-1 and 104-2 include a base fin structure 104B, the dummy bottom layer 103, the bottom semiconductor layer 105, and the semiconductor material stack, including the first semiconductor material layers 106 and the second semiconductor material layers 108. In some embodiments, the patterning process includes forming mask structures 110 over the semiconductor material stack and etching the semiconductor material stack, the bottom semiconductor layer 105, the dummy bottom layer 103, and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

After the fin structures 104-1 and 104-2 are formed, the mask structures 110 are removed, and isolation structures 116 are formed around the fin structures 104-1 and 104-2, as shown in FIGS. 1C-1 and 1C-2 in accordance with some embodiments. In some embodiments, isolation liners (not shown) are formed before forming the isolation structures 116. The isolation liners may be formed of a single or multiple dielectric materials. In some embodiments, the isolation liners include an oxide layer and a nitride layer formed over the oxide layer. In some embodiments, the isolation structures 116 are formed over the isolation liners and are made of silicon oxide, silicon nitride, silicon oxynitride (SiON), other applicable insulating materials, or a combination thereof.

The isolation structures 116 may be formed by forming an insulating material around the fin structures 104-1 and 104-2 over the substrate 102 and recessing the insulating material to form the isolation structures 116. The isolation structures 116 are configured to electrically isolate active regions (e.g. the fin structures 104-1 and 104-2) of the semiconductor structure and are also referred to as shallow trench isolation (STI) features in accordance with some embodiments.

After the isolation structures 116 are formed, dummy gate structures 118 are formed across the fin structures 104-1 and 104-2 and extending over the isolation structures 116, as shown in FIGS. 1C-1 and 1C-2 in accordance with some embodiments.

The dummy gate structures 118 may be used to define the source/drain regions and the channel regions of the resulting semiconductor structure 100. In some embodiments, the dummy gate structures 118 include a dummy gate dielectric layer 120 and a dummy gate electrode layer 122. In some embodiments, the dummy gate dielectric layer 120 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 120 is formed using thermal oxidation, CVD, ALD, physical vapor deposition (PVD), another suitable method, or a combination thereof.

In some embodiments, the dummy gate electrode layer 122 is made of conductive material includes polycrystalline-silicon (poly-Si), poly-crystalline silicon-germanium (poly-SiGe), or a combination thereof. In some embodiments, the dummy gate electrode layer 122 is formed using CVD, PVD, or a combination thereof.

The formation of the dummy gate structures 118 may include conformally forming a dielectric material as the dummy gate dielectric layers 120. Afterwards, a conductive material may be formed over the dielectric material as the dummy gate electrode layers 122, and a hard mask layer 124 may be formed over the conductive material. Next, the dielectric material and the conductive material may be patterned through the hard mask layer 124 to form the dummy gate structures 118. In some embodiments, the hard mask layers 124 include multiple layers, such as an oxide layer 123 and a nitride layer 125. In some embodiments, the oxide layer 123 is made of silicon oxide, and the nitride layer 125 is made of silicon nitride.

After the dummy gate structures 118 are formed, gate spacers 126 are formed along and covering opposite sidewalls of the dummy gate structures 118, as shown in FIGS. 1D-1 and 1D-2 in accordance with some embodiments. The gate spacers 126 may be configured to separate source/drain structures (formed afterwards) from the dummy gate structures 118. In some embodiments, the gate spacers 126 include first spacer layers 128 and second spacer layers 130 formed over the first spacer layers 128. In some embodiments, the first spacer layers 128 are formed on the sidewalls of the dummy gate structures 118 and covering the fin structures 104-1 and 104-2 and the isolation structure 116 and therefore have L shapes in the cross-sectional view. In some embodiments, the first spacer layers 128 and the second spacer layers 130 are made of different dielectric materials, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. After the gate spacers 126 are formed, fin spacers may also be formed over the fin structures 104-1 and 104-2 (not shown in FIG. 1D-1 and 1D-2).

FIGS. 2A-1 to 2V-1 illustrate cross-sectional views of intermediate stages of manufacturing the semiconductor structure 100 in the first region 10 along line A-A' shown in FIG. 1D-1 in accordance with some embodiments. FIGS. 2A-2 to 2V-2 illustrate cross-sectional views of intermediate stages of manufacturing the semiconductor structure 100 in the second region 20 along line A-A' shown in FIG. 1D-2 in accordance with some embodiments. More specifically, FIG. 2A-1 illustrates the cross-sectional view of the semiconductor structure shown along line A-A' in FIG. 1D-1, and FIGS. 2B-1 to 2V-1 illustrate the cross-sectional views of the intermediate stages of manufacturing the semiconductor structure 100 in the first region 10 after the process shown in FIG. 1D-1 in accordance with some embodiments. FIG. 2A-2 illustrates the cross-sectional view of the semiconductor structure shown along line A-A' in FIG. 1D-2, and FIGS. 2B-2 to 2V-2 illustrate the cross-sectional views of the intermediate stages of manufacturing the semiconductor structure 100 in the first region 20 after the process shown in FIG. 1D-2 in accordance with some embodiments.

After the gate spacers 128 are formed, source/drain recesses 132 are formed in the fin structures 104-1 and 104-2 adjacent to the gate spacers 126, as shown in FIGS. 2B-1 and 2B-2 in accordance with some embodiments. More specifically, the fin structures 104-1 and 104-2 not covered by the dummy gate structures 118 and the gate spacers 126 are recessed in accordance with some embodiments. In some embodiments, a portion of the bottom surface of the source/drain recesses 132 is lower than the bottom surface of the dummy bottom layer 103.

In some embodiments, the fin structures 104-1 and 104-2 are recessed by performing an etching process. The etching process may be an anisotropic etching process, such as dry plasma etching, and the dummy gate structure 118 and the gate spacers 126 may be used as etching masks during the etching process.

Figures 1, 2C:
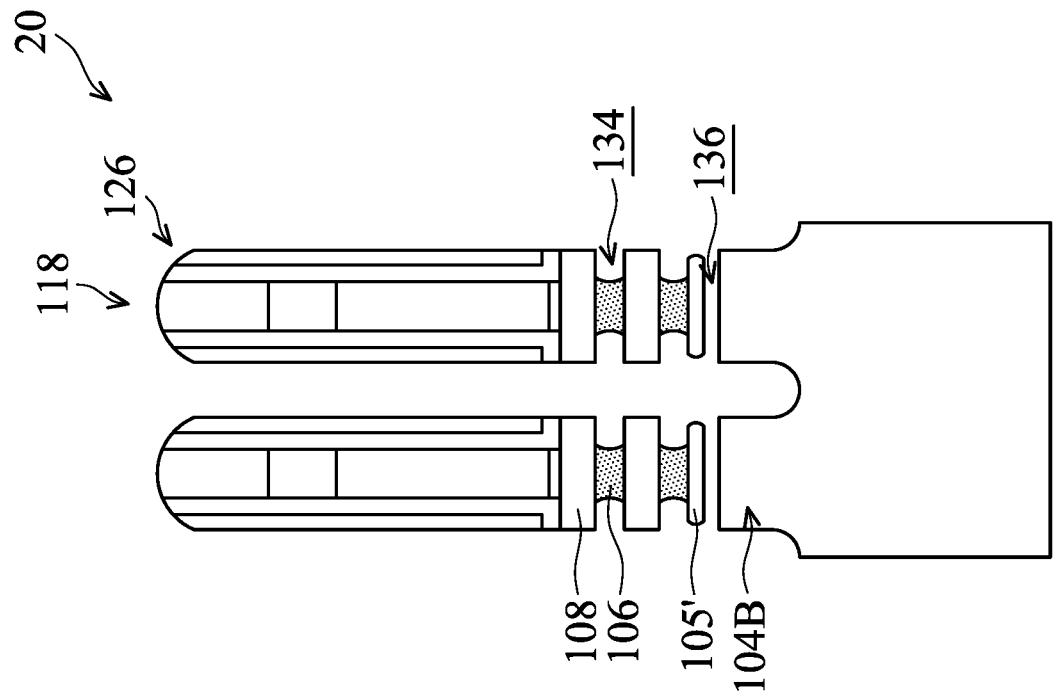
Figures 2, 2C:
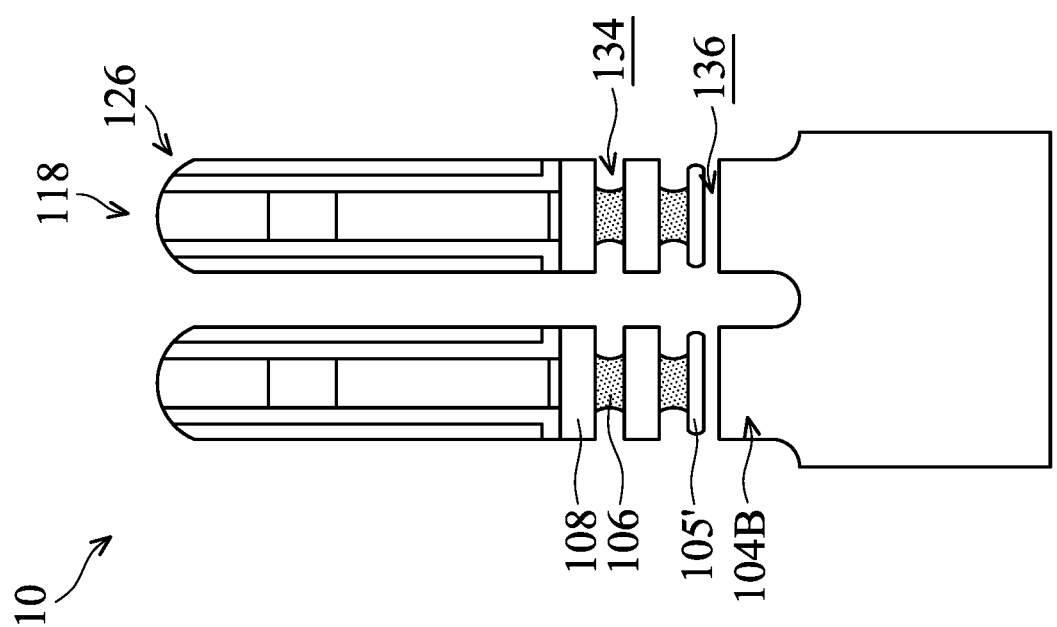

After the source/drain recesses 132 are formed, the first semiconductor material layers 106 exposed by the source/drain recesses 132 are laterally recessed to form notches 134 and the dummy bottom layers 103 are completely removed to form gaps 136, as shown in FIGS. 2C-1 and 2C-2 in accordance with some embodiments.

In some embodiments, an etching process is performed to laterally recess the first semiconductor material layers 106 of the fin structures 104-1 and 104-2 and the dummy bottom layers 103 from the source/drain recesses 132. In some embodiments, during the etching process, the dummy bottom layers 103 and the first semiconductor material layers 106 have greater etching rates (e.g. etching amount) than that of the second semiconductor material layers 108 and the bottom semiconductor layer 105, thereby forming the notches 134 and the gaps 136. In addition, the dummy bottom layers 103 have a greater etching rates (e.g. etching amount) than that of the first semiconductor material layers 106 since the dummy bottom layer 103 has a greater Ge concentration in accordance with some embodiments. Therefore, the dummy bottom layers 103 are completely removed while the first semiconductor material layers 106 are only partially removed during the etching process. In some embodiments, the first semiconductor material layers 106 are laterally etched for a first width (i.e. the width of the notch 134), and the first width is in a range from about 7 nm to about 10 nm.

In some embodiments, the bottom semiconductor layers 105 are also laterally etched during the etching process to form bottom semiconductor layers 105'. More specifically, although the bottom semiconductor layers 105 also have etching selectivity towards the first semiconductor material layers 106 and the dummy bottom layer 103, it may still be slightly etched since it is relatively thin. Accordingly, the bottom semiconductor layers 105' become shorter than the second semiconductor material layers 108 after the etching process is performed in accordance with some embodiments. In some embodiments, the bottom semiconductor layers 105 are laterally etched for a second width less that the first width, and the second width is in a range from about 1 nm to about 4 nm. In some embodiments, the etching process is an isotropic etching such as dry chemical etching, remote plasma etching, wet chemical etching, another suitable technique, and/or a combination thereof.

Inner spacer layers 138 are formed in the notches 134, the gap 136, and the source/drain recesses 132 in both the first region 10 and the second region 20, as shown in FIGS. 2D-1 and 2D-2 in accordance with some embodiments. In addition, the inner spacer layers 132 also cover the sidewalls of the gate spacers 126 and the dummy gate structures 118 in accordance with some embodiments. In some embodiments, the inner spacer layers 138 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer layers 138 may be formed by performing chemical vapor deposition (CVD), physical vapor deposition, (PVD), atomic layer deposition (ALD), or other applicable processes.

Figures 1, 2E:
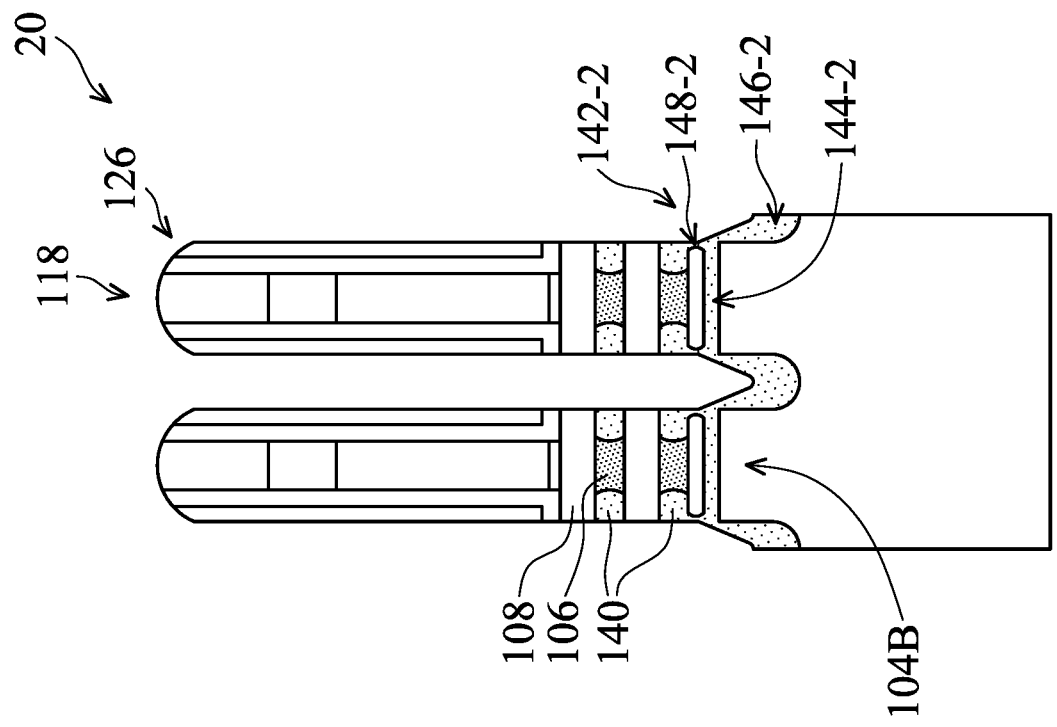
Figures 2, 2E:
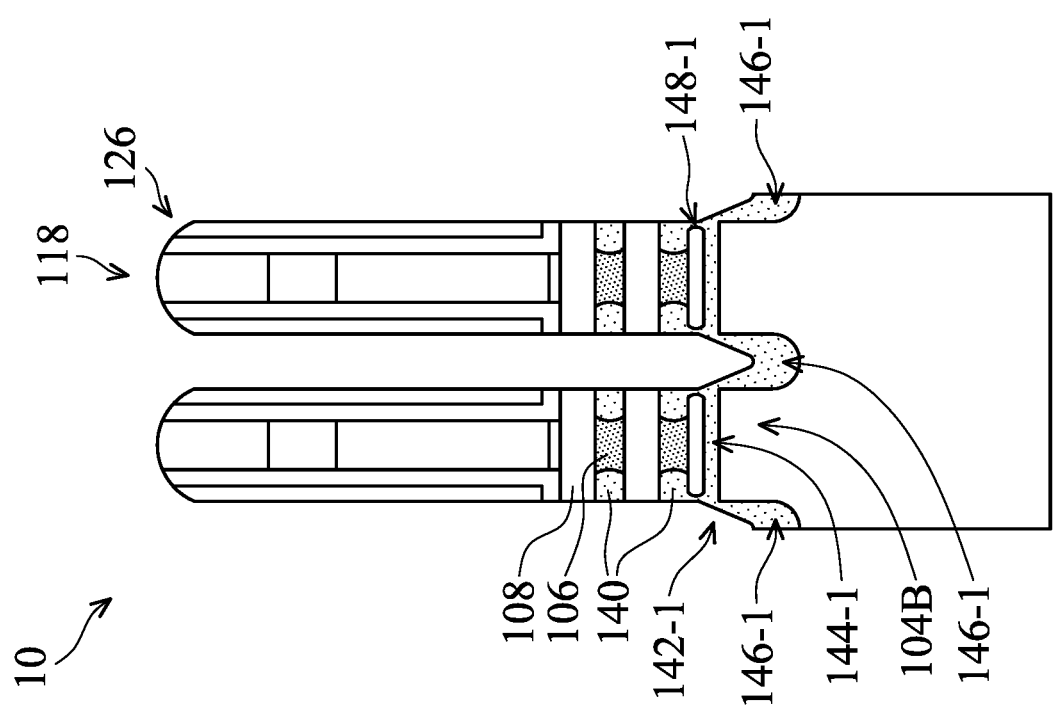

After the inner spacer layers 138 are formed, an etching process is performed to form inner spacers 140 and bottom isolation features 142-1 and 142-2 with the inner spacer layer 138, as shown in FIGS. 2E-1 and 2E-2 in accordance with some embodiments. The inner spacers 140 may be configured to separate the source/drain structures and the gate structures formed in subsequent manufacturing processes. The bottom isolation features 142-1 and 142-2 may be configured to prevent the circuit leakage through the substrate 102 during the device operation.

More specifically, the inner spacers 140 are formed in the notches 134 between the second semiconductor material layers 108 and between the second semiconductor material layers 108 and the bottom semiconductor layers 105' in both the first region 10 and the second region 20 in accordance with some embodiments. In some embodiments, the inner spacers 140 partially cover the top surfaces of the bottom semiconductor layers 105'.

In addition, the bottom isolation feature 142-1 is formed in the first region 10, and the bottom isolation feature 142-2 is formed in the second region 20 in accordance with some embodiments.

In some embodiments, the bottom isolation feature 142-1 includes first portions 144-1 under the bottom semiconductor layer 105', second portions 146-1 in the bottom portions of the source/drain recesses 132, and third portions 148-1 on the sidewalls of the bottom semiconductor layer 105' in the first region 10. In some embodiments, the second portions 146-1 at opposite sides are connected by the first portion 144-1, such that the bottom isolation feature 142-1 continuously extends from one source/drain recess 132 to another source/drain recess 132 through the space under the channel region. Accordingly, the top surface of the base fin structure 104B is completely covered by the bottom isolation feature 142-1, so that the current leakage from the base fin structure 104B, especially at the corners of the source/drain recesses, may be prevented. In addition, the bottom semiconductor layer 105' located under the semiconductor stack provides an additional height as a buffer region for the etching process for forming the bottom isolation feature 142-1. That is, the distance between the bottommost second semiconductor layers 108 (i.e. the bottommost nanostructure formed afterwards) and the base fin structure 104B is enlarged due to the formation of the bottom semiconductor layer 105'. That is, when the inner spacer layers 138 are etched to form the bottom isolation feature 142-1, it can have a greater operation window, and therefore the isolation of the base fin structure 104B can be improved. In some embodiments, the bottom isolation feature 142-1 further extends to the inner spacers 140 above with no interface therebetween.

Similarly, the bottom isolation feature 142-2 includes first portions 144-2 under the bottom semiconductor layer 105', second portions 146-2 in the bottom portions of the source/drain recesses 132, and third portions 148-2 on the sidewalls of the bottom semiconductor layer 105' in the second region 20 in accordance with some embodiments.

Figures 2, 2F:
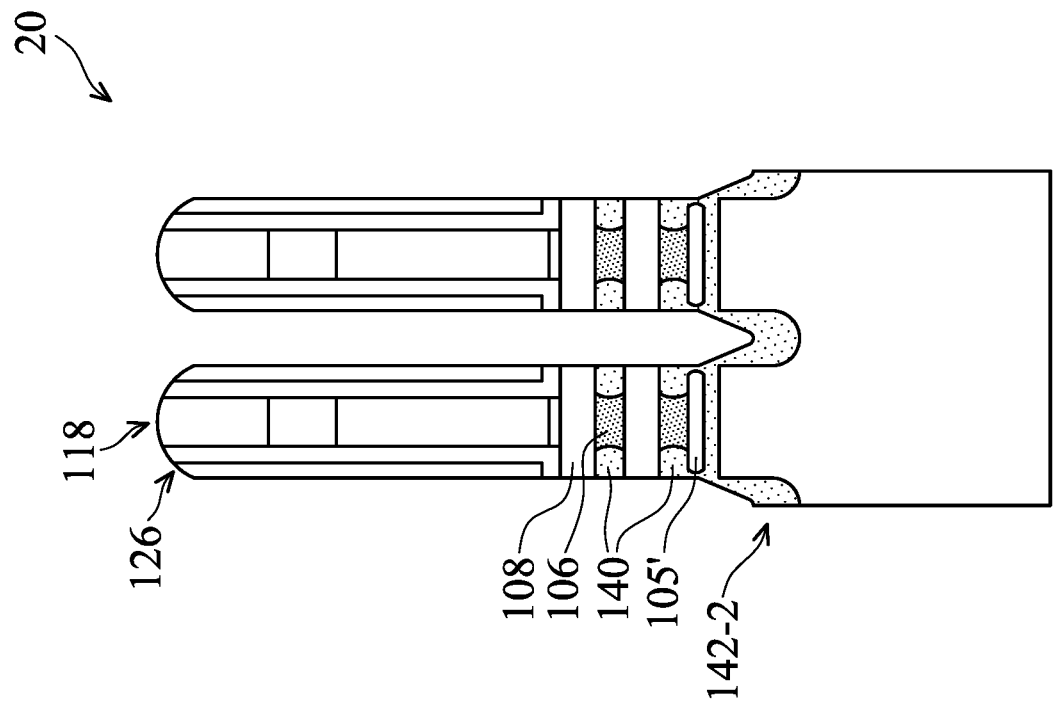
Figures 1, 2F:
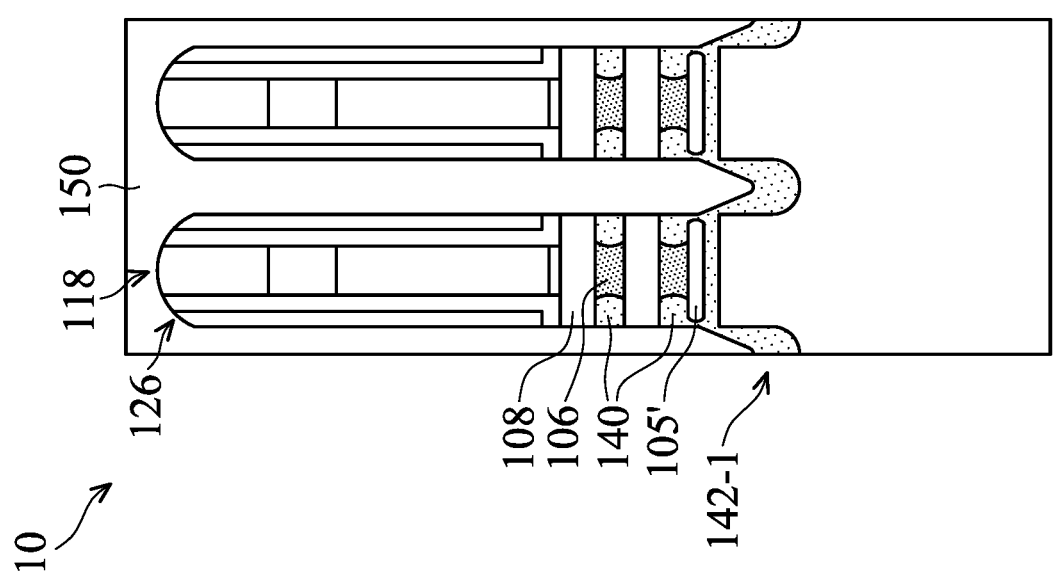

After the inner spacers 140 and the bottom isolation features 142-1 and 142-2 are formed, a resist structure 150 is formed in the first region 10 to cover the dummy gate structures 118 and the bottom isolation feature 142-1 in the first region 10, as shown in FIGS. 2F-1 and 2F-2 in accordance with some embodiments.

In some embodiments, the resist structure 150 includes a photoresist layer that can be patterned by being exposed to light using a photomask. Exposed (or unexposed portions) of the photoresist may be removed, depending on whether a positive or negative resist is used. In some embodiments, the resist structure 150 further includes two mask layers under the photoresist layer. In some embodiments, the first mask layer is made of titanium nitride (TiN), carbon-doped silicon dioxide (e.g., SiO2:C), titanium oxide (TiO), boron nitride (BN), other applicable materials, and/or a combination thereof. In some embodiments, the second mask layer is made of silicon nitride (SiN), silicon oxynitride (SiON), and/or a combination thereof. The materials for forming the first mask layer and the second mask layer may be patterned using the photoresist layer.

Figures 2, 2G:
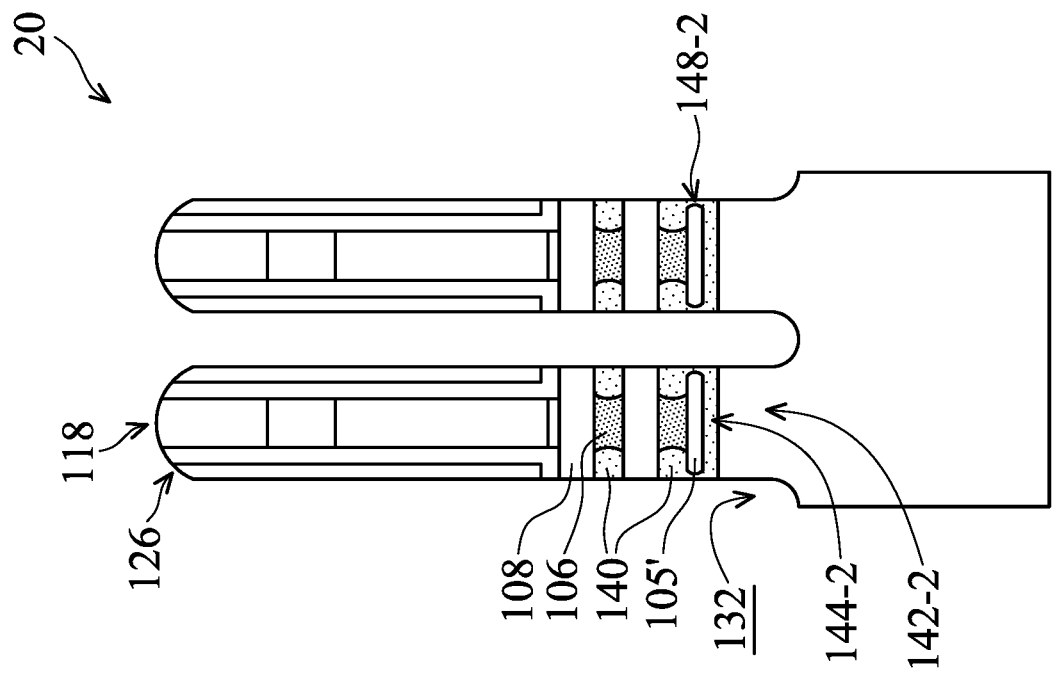
Figures 1, 2G:
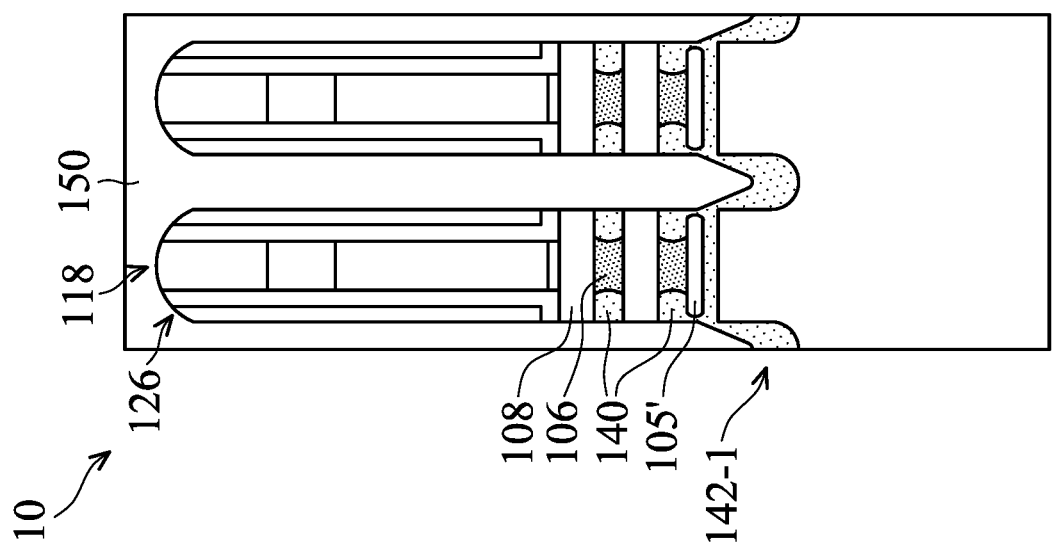

After the resist structure 150 is formed, an etching process is performed to etched the bottom isolation feature 142-2 in the second region 20, as shown in FIGS. 2G-1 and 2G-2 in accordance with some embodiments. More specifically, the second portions 146-2 of the bottom isolation feature 142-2 in the source/drain recesses 132 are removed, so that the bottom surfaces of the source/drain recesses 132 in the second region 20 are exposed again. Meanwhile, the first portions 144-2 under the bottom semiconductor layer 105' and the third portions 148-2 remain in accordance with some embodiments.

Figures 1, 2H:
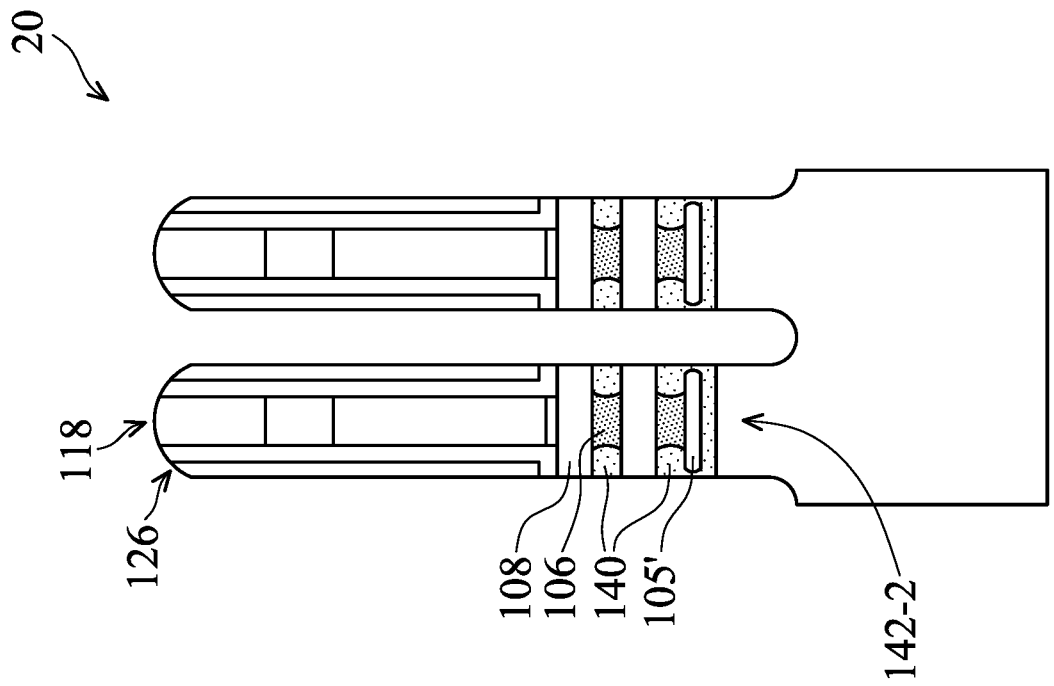
Figures 2, 2H:
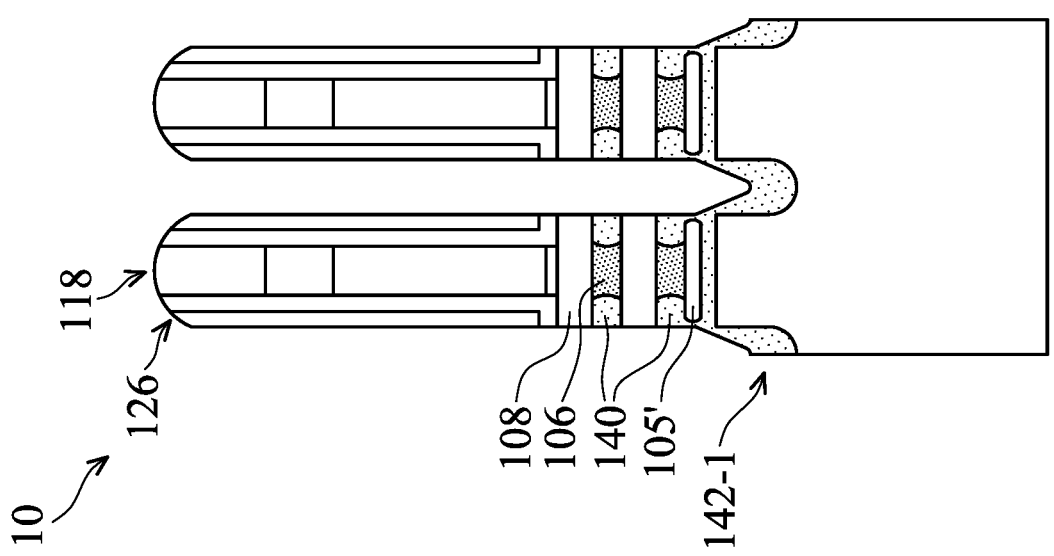

After the second portions 146-2 of the bottom isolation feature 142-2 are removed, the resist structure 150 covering the first region 10 is removed, as shown in FIGS. 2H-1 and 2H-2 in accordance with some embodiments. An etching process may be performed to remove the resist structure 150. In some embodiments, the etching process is an isotropic etching such as dry chemical etching, remote plasma etching, wet chemical etching, other applicable technique, and/ or a combination thereof. In some embodiments, the inner spacers 140 are also slightly etched during the etching process.

Figures 1, 2I:
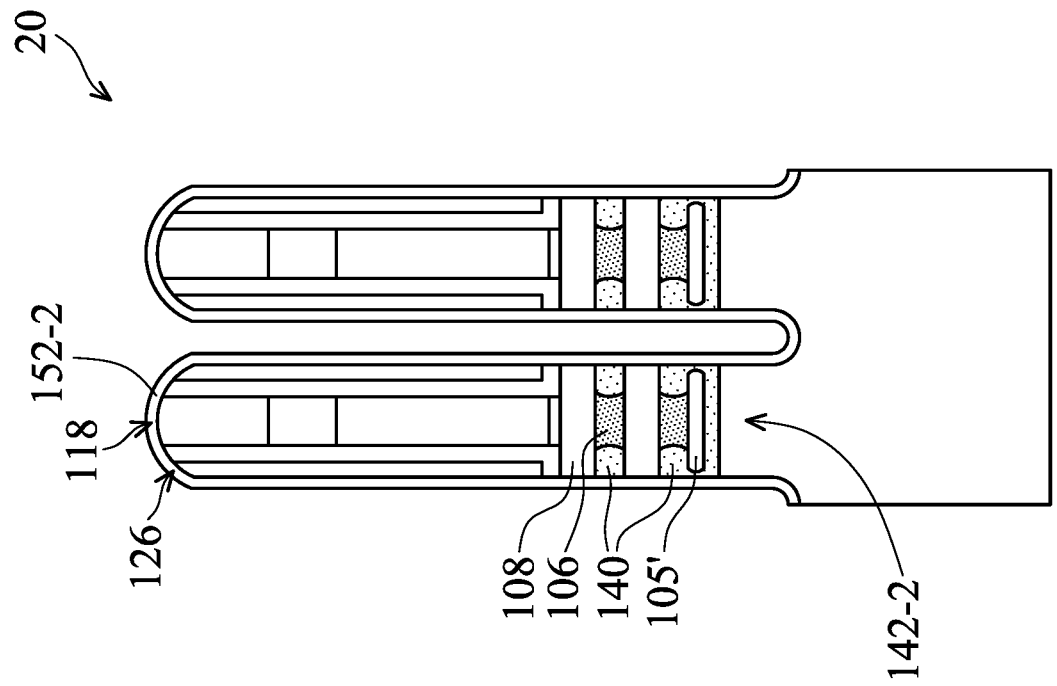
Figures 2, 2I:
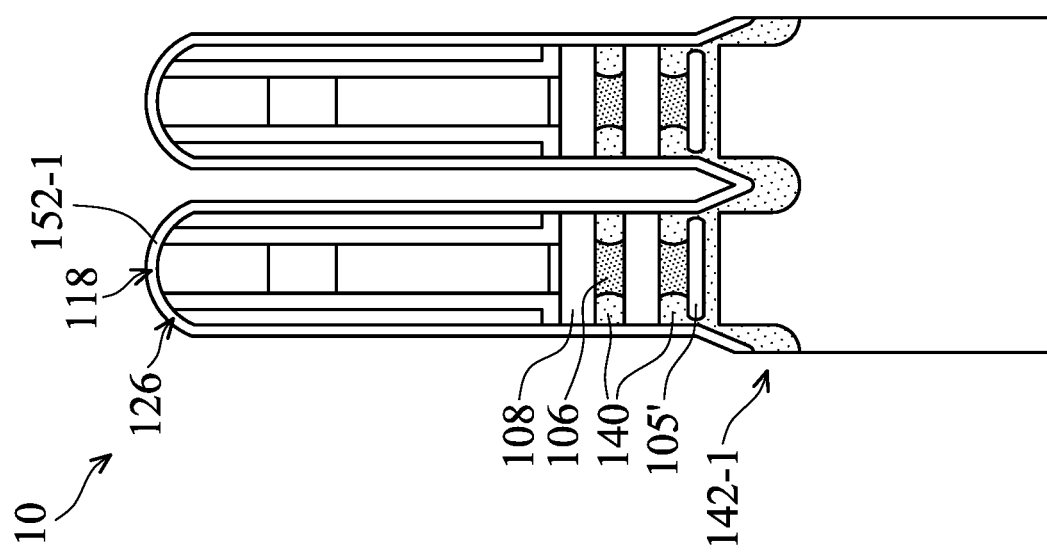

Next, a mask layer 152-1 is formed over the first region 10 and a mask layer 152-2 is formed over the second region 20, as shown in FIGS. 2I-1 and 2I-2 in accordance with some embodiments. In some embodiments, the mask layers 152-1 and 152-2 are formed of the same dielectric material by the same deposition process. In some embodiments, the mask layers 152-1 and 152-2 are made of a high k dielectric material such as a nitride. In some embodiments, the thicknesses of the mask layers 152-1 and 152-2 are in a range from about 3 nm to about 5 nm.

Figures 2, 2J:
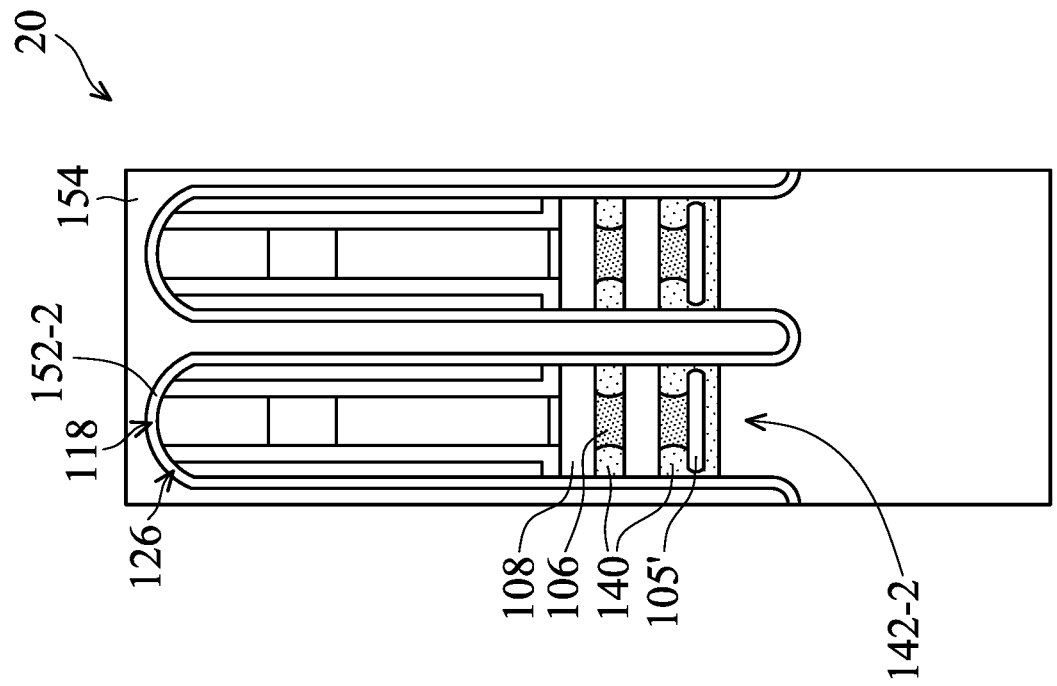
Figures 1, 2J:
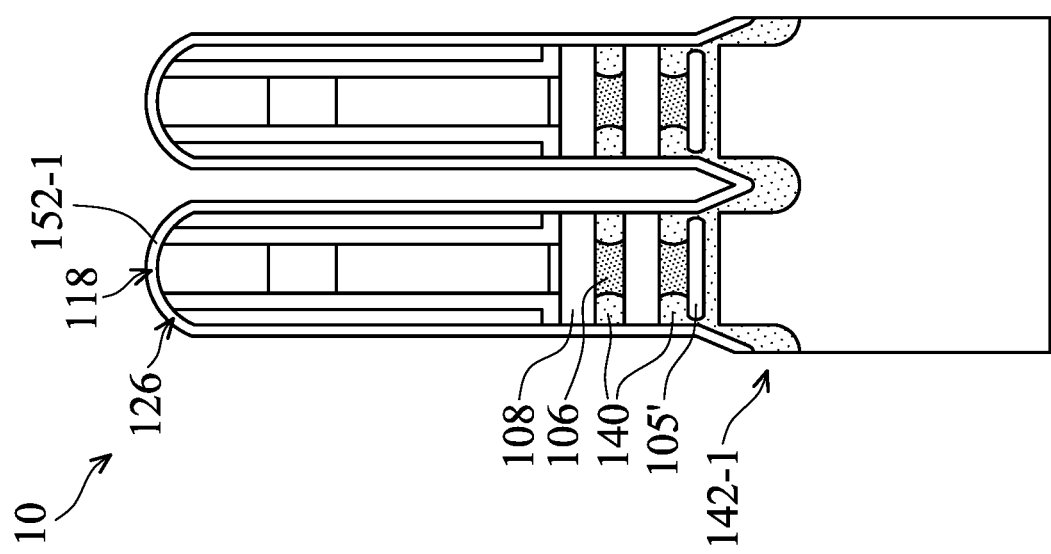

After the mask layers 152-1 and 152-2 are formed, a resist structure 154 is formed over the second region 20, as shown in FIGS. 2J-1 and 2J-2 in accordance with some embodiments. The materials and processes for forming the resist structure 154 may be similar to, or the same as, those for forming the resist structure 150 described previously and are not repeated herein.

After the resist structure 154 is formed, the mask layer 152-1 not covered by the resist structure 154 in the first region 10 is removed, as shown in FIGS. 2K-1 and 2K-2 in accordance with some embodiments. More specifically, an etching process is performed to remove the mask layer 152-1 over the first region 10, so that the bottom isolation feature 142-1 and the sidewalls of the second semiconductor material layers 108 are exposed again in accordance with some embodiments. In some embodiments, the etching process is an isotropic etching such as dry chemical etching, remote plasma etching, wet chemical etching, other applicable technique, and/or a combination thereof. After the mask layer 152-1 is removed, the resist structure 154 is also removed, as shown in FIGS. 2K-1 and 2K-2 in accordance with some embodiments.

Next, source/drain structures 160-1 are formed over the bottom isolation feature 142-1 in the source/drain recesses 132 in the first region 10, as shown in FIGS. 2L-1 and 2L-2 in accordance with some embodiments. Since the base fin structure 104B is covered by the bottom isolation feature 142-1, the source/drain structures 160-1 are not in direct contact with the base fin structure 104B, and therefore the current leakage through the backside of the resulting device may be prevented. In some embodiments, the source/drain structures 160-1 are separated from the base fin structure 104B by the bottom isolation feature 142-1. In some embodiments, the source/drain structures 160-1 are in direct contact with the second portions 146-1 and the third portions 148-1 of the bottom isolation feature 142-1.

In some embodiments, the source/drain structures 160-1 are formed using an epitaxial growth process, such as MBE, MOCVD, VPE, other applicable epitaxial growth process, or a combination thereof. In some embodiments, the source/ drain structures 160-1 are made of any applicable material, such as Ge, Si, GaAs, AlGaAs, SiGe, GaAsP, SiP, SiC, SiCP, or a combination thereof. In some embodiments, the source/ drain structures 160-1 are in-situ doped during the epitaxial growth process. In some embodiments, the source/drain structures 160-1 are the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 160-1 are doped in one or more implantation processes after the epitaxial growth process.

After the source/drain structures 160-1 are formed, the mask layer 152-2 in the second region 20 is removed, as shown in FIGS. 2M-1 and 2M-2 in accordance with some embodiments. In some embodiments, the mask layer 152-2 is removed by performing an etching process. In some embodiments, the etching process is an isotropic etching such as dry chemical etching, remote plasma etching, wet chemical etching, other applicable technique, and/or a combination thereof.

Figures 1, 2N:
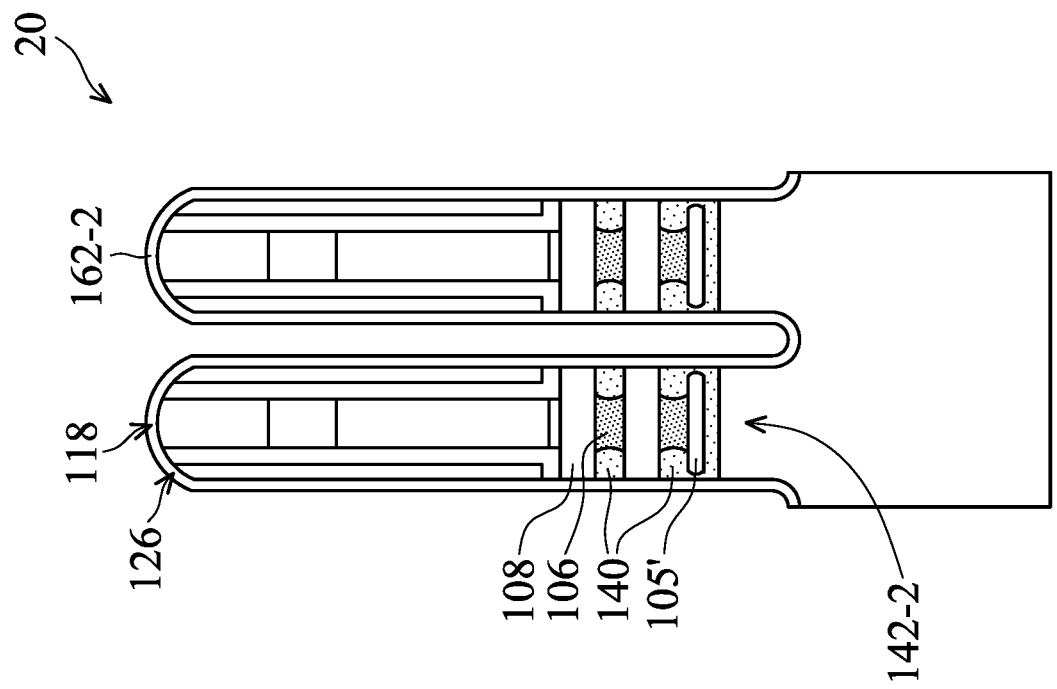
Figures 2, 2N:
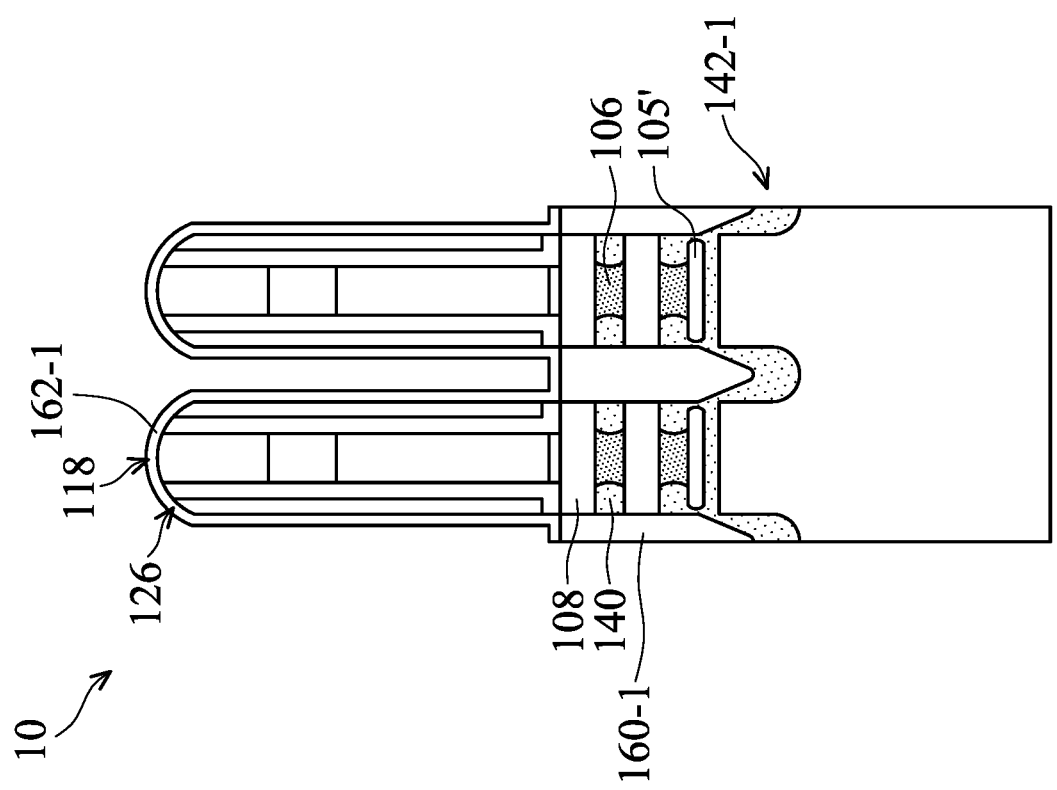

Next, a mask layer 162-1 is formed over the first region 10 and a mask layer 162-2 is formed over the second region 20, as shown in FIGS. 2N-1 and 2N-2 in accordance with some embodiments. In some embodiments, the mask layers 162-1 and 162-2 are formed of the same dielectric material by the same deposition process. In some embodiments, the mask layers 162-1 and 162-2 are made of a high k dielectric material such as a nitride. In some embodiments, the thicknesses of the mask layers 162-1 and 162-2 are in a range from about 3 nm to about 5 nm.

After the mask layers 162-1 and 162-2 are formed, a resist structure 164 is formed over the first region 10, as shown in FIGS. 2O-1 and 2O-2 in accordance with some embodiments. The materials and processes for forming the resist structure 164 may be similar to, or the same as, those for forming the resist structure 150 described previously and are not repeated herein.

Figures 1, 2P:
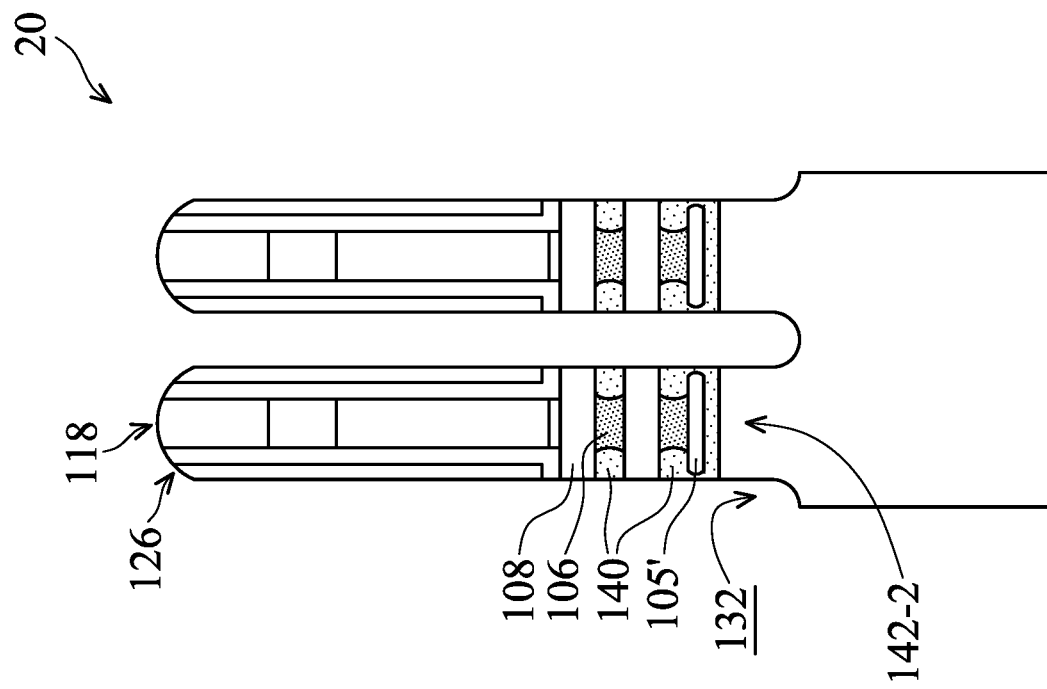
Figures 2, 2P:
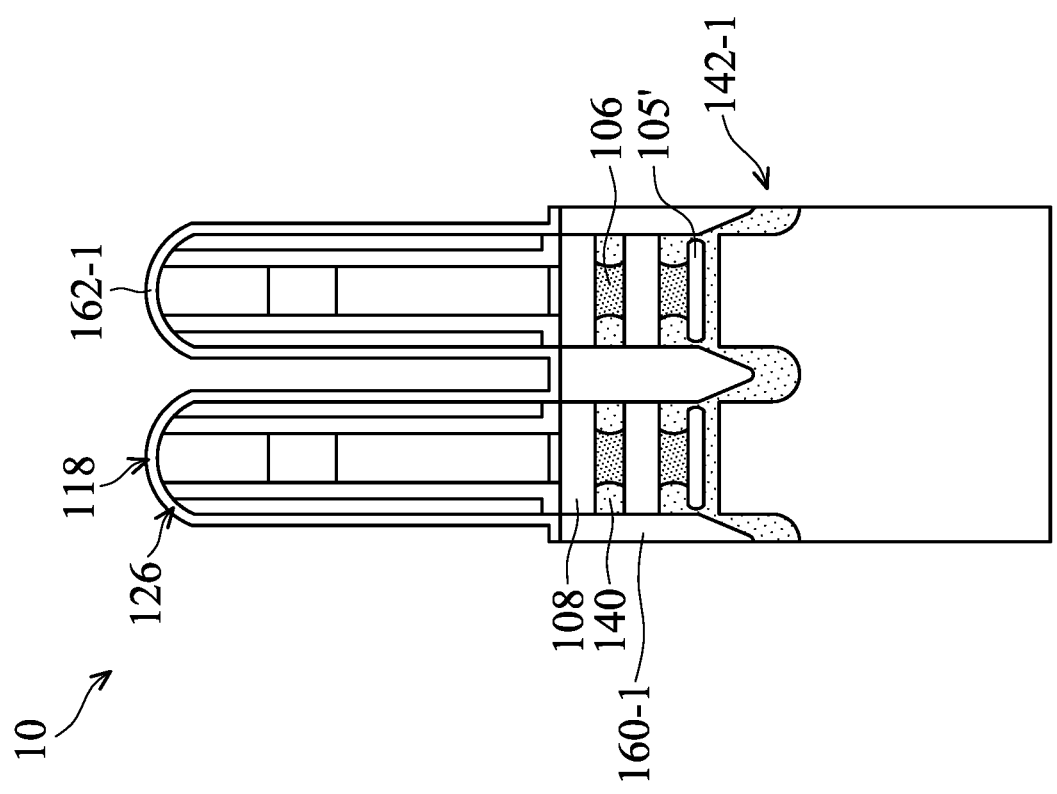

After the resist structure 164 is formed, the mask layer 162-2 not covered by the resist structure 164 in the second region 20 is removed, as shown in FIGS. 2P-1 and 2P-2 in accordance with some embodiments. More specifically, an etching process is performed to remove the mask layer 162-2 over the second region 20 to expose the source/drain recesses 132 in accordance with some embodiments. In some embodiments, the etching process is an isotropic etching such as dry chemical etching, remote plasma etching, wet chemical etching, other applicable technique, and/ or a combination thereof. After the mask layer 162-2 is removed, the resist structure 164 is also removed, as shown in FIGS. 2P-1 and 2P-2 in accordance with some embodiments.

Figures 1, 2Q:
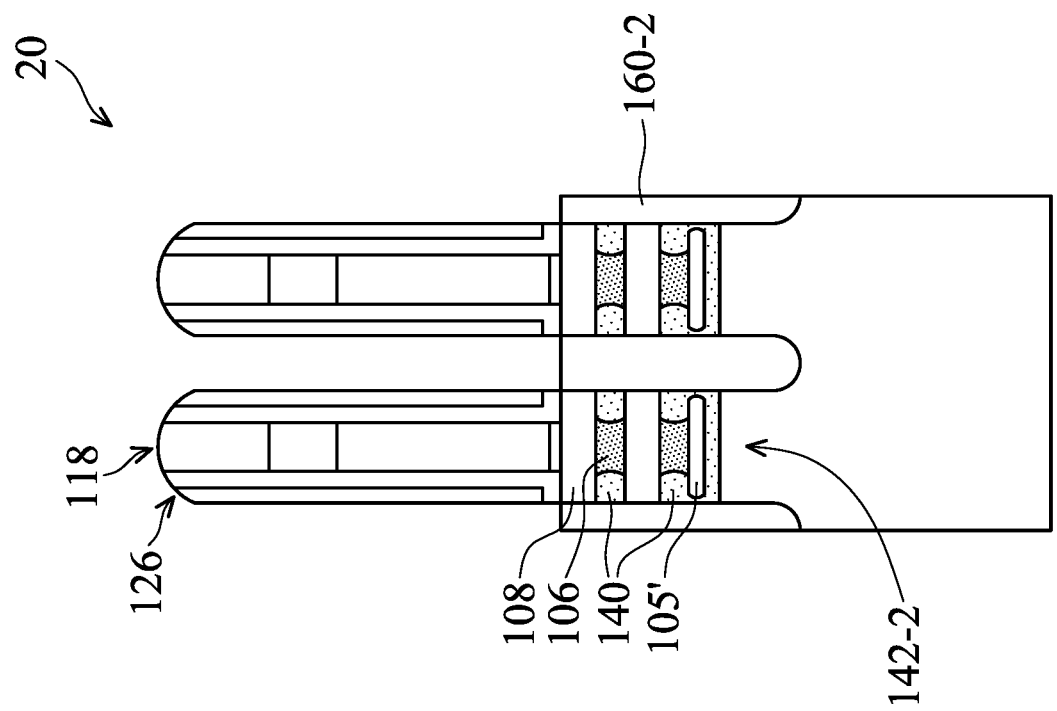
Figures 2, 2Q:
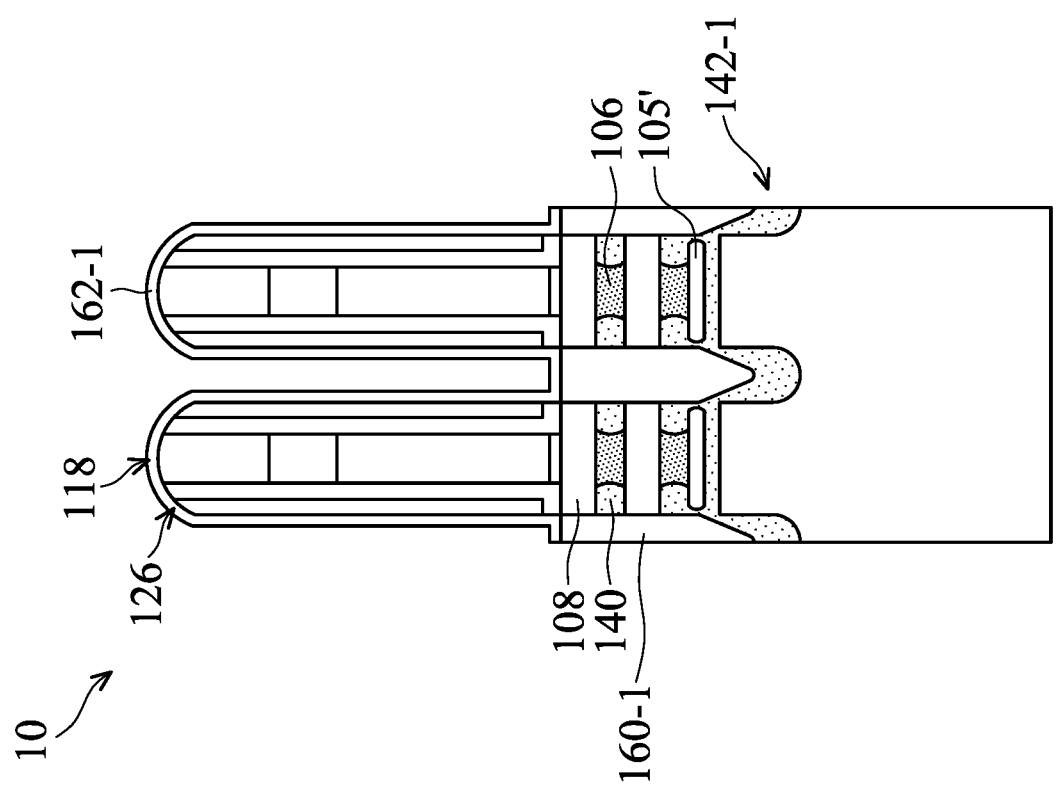

Next, source/drain structures 160-2 are formed in the source/drain recesses 132 in the second region 20, as shown in FIGS. 2Q-1 and 2Q-2 in accordance with some embodiments. Since the bottom isolation feature 142-2 in the bottom portions of the source/drain recesses 132 are removed, the source/drain structures 160-2 are directly formed over the base fin structure 104B in accordance with some embodiments. Accordingly, the bottommost portions of the source/drain structures 160-2 are lower than the bottommost portions of the source/drain structures 160-1 in accordance with some embodiments. In some embodiments, the bottommost portions of the source/drain structures 160-2 are substantially level with the bottommost portions of the bottom isolation feature 142-1.

In some embodiments, the source/drain structures 160-2 are formed using an epitaxial growth process, such as MBE, MOCVD, VPE, other applicable epitaxial growth process, or a combination thereof. In some embodiments, the source/drain structures 160-2 are made of any applicable material, such as Ge, Si, GaAs, AlGaAs, SiGe, GaAsP, SiP, SiC, SiCP, or a combination thereof. In some embodiments, the source/drain structures 160-2 are in-situ doped during the epitaxial growth process. In some embodiments, the source/drain structures 160-2 are the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 160-2 are the epitaxially grown SiGe doped with boron (B). In some embodiments, the source/drain structures 160-2 are doped in one or more implantation processes after the epitaxial growth process.

After the source/drain structures 160-2 are formed, the mask layer 162-1 in the first region 10 is removed, as shown in FIGS. 2R-1 and 2R-2 in accordance with some embodiments. In some embodiments, the mask layer 162-1 is removed by performing an etching process. In some embodiments, the etching process is an isotropic etching such as dry chemical etching, remote plasma etching, wet chemical etching, other applicable technique, and/or a combination thereof.

After the source/drain structures 160-2 are formed, contact etch stop layers (CESL) 172 are conformally formed to cover the source/drain structures 160-1 and 160-2 and the dummy gate structures 118, and interlayer dielectric (ILD) layers 174 are formed over the contact etch stop layers 172, as shown in FIGS. 2S-1 and 2S-2 in accordance with some embodiments.

In some embodiments, the contact etch stop layers 172 are made of a dielectric materials, such as silicon nitride, silicon oxide, silicon oxynitride, another suitable dielectric material, or a combination thereof. The dielectric material for the contact etch stop layers 172 may be conformally deposited over the semiconductor structure by performing CVD, ALD, other application methods, or a combination thereof.

The interlayer dielectric layers 174 may include multi-layers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layers 174 may be formed by chemical vapor deposition (CVD), physical vapor deposition, (PVD), atomic layer deposition (ALD), or other applicable processes.

After the contact etch stop layers 172 and the interlayer dielectric layers 174 are deposited, a planarization process such as CMP or an etch-back process is performed until the gate electrode layers 122 of the dummy gate structures 118 are exposed, as shown in FIGS. 2S-1 and 2S-2 in accordance with some embodiments.

Afterwards, the dummy gate structures 118 and the first semiconductor material layers 106 of the fin structures 104-1 and 104-2 are removed to form gate trenches 176, as shown in FIGS. 2T-1 and 2T-2 in accordance with some embodiments. More specifically, the dummy gate structures 118 and the first semiconductor material layers 106 of the fin structures 104-1 and 104-2 are removed to form nanostructures 108' with the second semiconductor material layers 108 of the fin structures 104-1 and 104-2 in accordance with some embodiments.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as an APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

Next, gate structures 178 are formed wrapping around the nanostructures 108', as shown in FIGS. 2U-1 and 2U-2 in accordance with some embodiments. The gate structures 178 wrap around the nanostructures 108' to form gate-all-around transistor structures in accordance with some embodiments. In some embodiments, the gate structures 178 directly cover the top surfaces of the bottom semiconductor layers 105'.

In some embodiments, each of the gate structures 178 includes an interfacial layer 180, a gate dielectric layer 182, and a gate electrode layer 184. In some embodiments, the interfacial layers 180 are oxide layers formed around the nanostructures 108' and on the exposed portions of the bottom semiconductor layer 105'. In some embodiments, the interfacial layers 180 are formed by performing a thermal process.

In some embodiments, the gate dielectric layers 182 are formed over the interfacial layers 180, so that the nanostructures 108' are surrounded (e.g. wrapped) by the gate dielectric layers 182. In addition, the gate dielectric layers 182 also cover the sidewalls of the gate spacers 126 and the inner spacers 138 in accordance with some embodiments. In some embodiments, the gate dielectric layers 182 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, other applicable high-k dielectric materials, or a combination thereof. In some embodiments, the gate dielectric layers 182 are formed using CVD, ALD, other applicable methods, or a combination thereof.

In some embodiments, the gate electrode layers 184 are formed on the gate dielectric layers 182. In some embodiments, the gate electrode layers 184 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 184 are formed using CVD, ALD, electroplating, another applicable method, or a combination thereof.

Other conductive layers, such as work function metal layers, may also be formed in the gate structures 178, although they are not shown in the figures. After the gate dielectric layers 182 and the gate electrode layers 184 are formed, a planarization process such as CMP or an etch-back process may be performed until the interlayer dielectric layers 174 are exposed.

Afterwards, silicide layers 190-1 and source/drain contacts 192-1 are formed through the interlayer dielectric layers 174 and the contact etching stop layers 172 over the source/drain structures 160-1, and silicide layers 190-2 and source/drain contacts 192-2 are formed through the interlayer dielectric layers 174 and the contact etching stop layers 172 over the source/drain structures 160-2, as shown in FIGS. 2V-1 and 2V-2 in accordance with some embodiments.

The formation of the source/drain contacts 192-1 and 192-2 may include patterning the interlayer dielectric layers 174 and the contact etching stop layers 172 to form contact openings partially exposing the source/drain structures 160-1 and 160-2, forming the silicide layers 190-1 and 190-2, and forming a conductive material over the silicide layers 190-1 and 190-2 to form the source/drain contacts 192-1 and 192-2.

The patterning process may include forming a patterned mask layer using a photolithography process over the interlayer dielectric layer 174 followed by an anisotropic etching process. The silicide layers 190-1 and 190-2 may be formed by forming metal layers over the top surface of the source/drain structures 160-1 and the source/drain structures 160-2, and annealing the metal layers so the metal layers react with the source/drain structures 160-1 and the source/drain structures 160-2 to form the silicide layers 190-1 and 190-2. The unreacted metal layers may be removed after the silicide layers 190-1 and 190-2 are formed. The silicide layers 190-1 and 190-2 may be made of WSi, NiSi, TiSi, TaSi, PtSi, WSi, CoSi, or the like.

After the silicide layers 190-1 and 190-2 are formed, the conductive material may be formed in the contact openings to form the source/drain contacts 192-1 and 192-2. The conductive material may include aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. The conductive material may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Liners and/or barrier layers (not shown) may be formed before forming the conductive materials of the source/drain contacts 192-1 and 192-2. The liners may be made of silicon nitride, although any other applicable dielectric may be used as an alternative. The barrier layer may be made of tantalum nitride, although other materials, such as tantalum, titanium, titanium nitride, or the like, may also be used.

Figure 3:
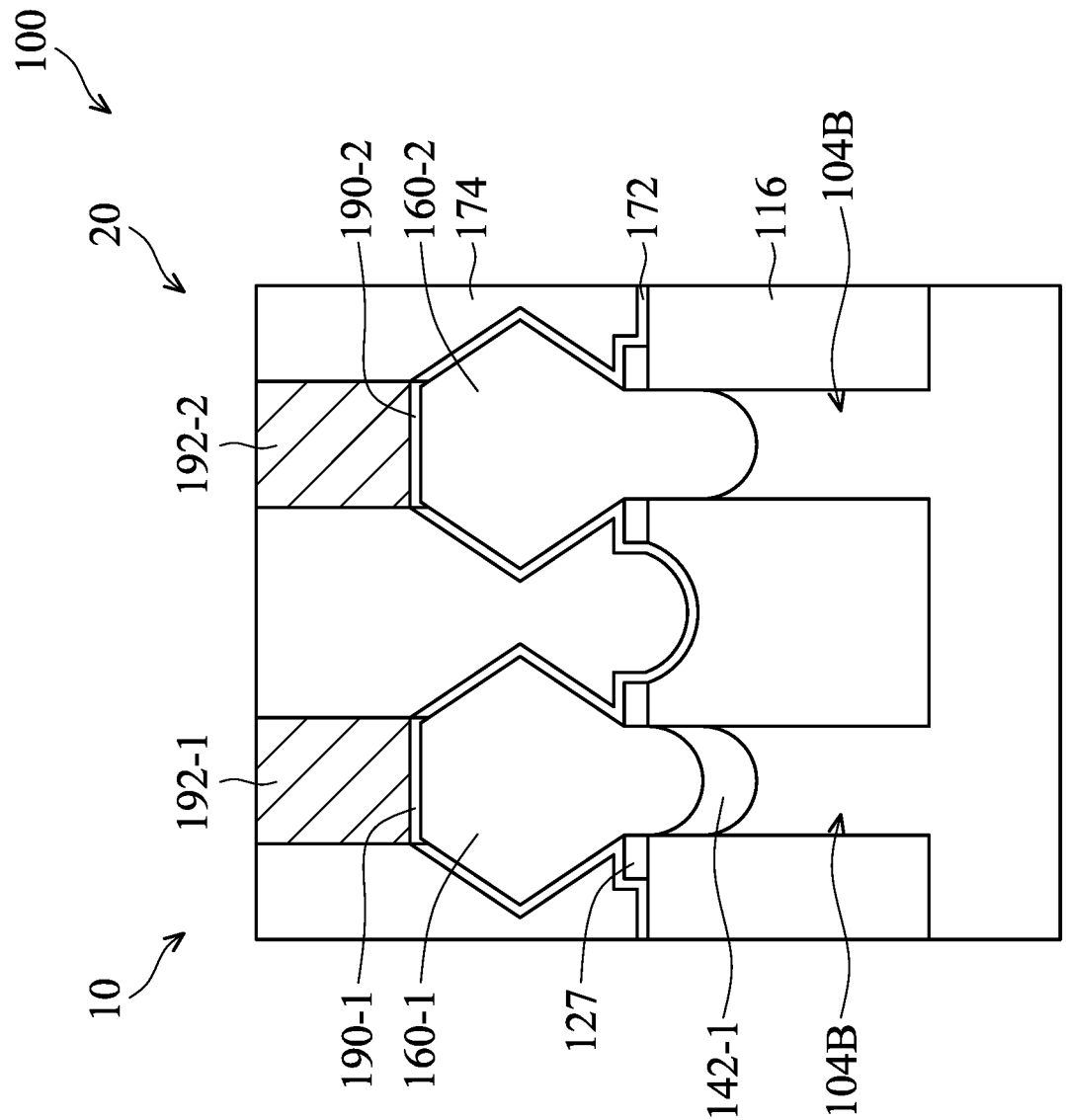
FIG. 3 illustrates a cross-sectional view of the semiconductor structure shown along a direction substantially perpendicular to the extending direction of the fin structures over the source/drain structures and the source/drain structures in accordance with some embodiments.

FIG. 3 illustrates a cross-sectional view of the semiconductor structure 100 shown along a direction substantially perpendicular to the extending direction of the fin structures 104-1 and 104-2 over the source/drain structures 160-1 and 160-2 in accordance with some embodiments. More specifically, the cross-sectional view of the semiconductor structure 100 in FIG. 3 is shown along a direction substantially perpendicular to the line A-A' shown in FIGS. 1D-1 and 1D-2 over the source/drain structures 160-1 and 160-2 in accordance with some embodiments.

In some embodiments, fin spacers 127 are formed over the sidewalls of the fin structure 104-1 and 104-2 after or with the formation of the gate spacers 126. The fin spacers 127 may be formed a single or multiple dielectric layers. In some embodiments, the fin spacers 127 are made of silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

Since the source/drain structures 160-1 are formed over the bottom isolation feature 142-1 in the first region 10 in source/drain regions, the source/drain structures 160-1 are thinner than the source/drain structures 160-2 in the second region 20 in the source/drain region, as shown in FIGS. 2V-1, 2V-2, and 3 in accordance with some embodiments. In some embodiments, the bottommost portions of the source/drain structures 160-2 are substantially level with the bottommost portions of the bottom isolation feature 142-1 and are lower than the bottommost portions of the source/drain structures 160-1.

As described previously, the semiconductor structure 100 includes the bottom isolation feature 142-1 sandwiched between the source/drain structures 160-1 and the base fin structure 104B, and therefore the current leakage through the backside of the resulting device may be prevented. In addition, the formation of the bottom isolation feature 142-1 can be applied to the manufacturing processes easily without complicated alignments or lithography processes. Furthermore, the bottom semiconductor layer 105' is formed in the channel regions under the semiconductor stack. The bottom semiconductor layer 105' can provide additional height when the inner spacer layers 138 are etched back to form the bottom isolation feature 142-1 and therefore provide a greater process window for forming the bottom isolation feature 142-1.

In some embodiments, the bottom isolation feature 142-1 is in contact with the inner spacers 140. In some embodiments, the bottommost portion of the bottom isolation feature 142-1 is lower than the bottommost surface of the nanostructures 108'. In addition, since the portions of the bottom isolation feature 142-2 formed in the source/drain recesses are removed before forming the source/drain structures 160-2, the bottommost surface of the bottom isolation feature 142-2 is higher than the bottommost surface of the bottom isolation feature 142-1 in accordance with some embodiments. In some embodiments, the bottommost portion of the source/drain structure 160-2 is substantially level with the bottommost portion of the bottom isolation feature 142-1.

Figures 1, 4A:
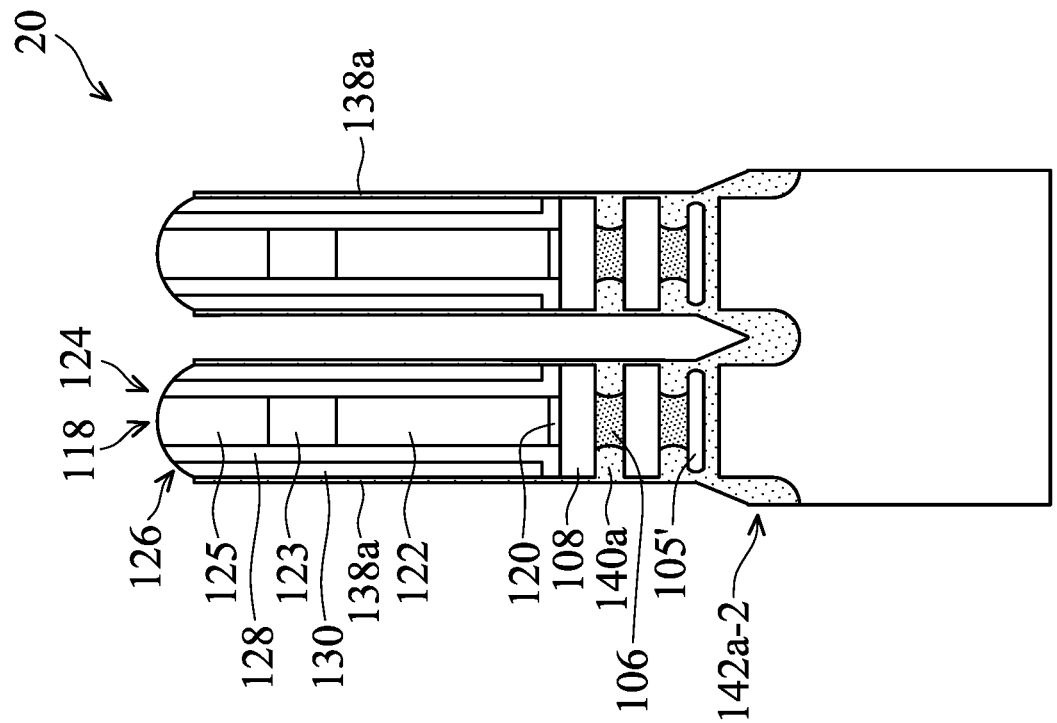
Figures 2, 4A:
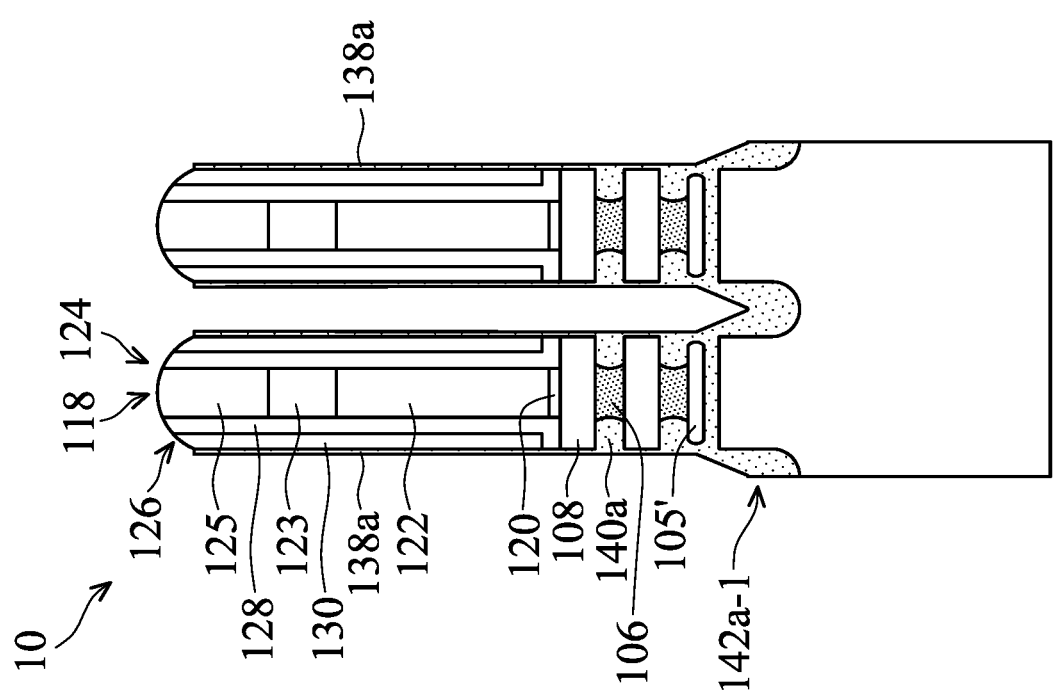

FIGS. 4A-1 to 4D-1 and 4A-2 to 4D-2 illustrate cross-sectional views of intermediate stages of manufacturing the semiconductor structure 100 in accordance with some other embodiments. Materials and processes for manufacturing the semiconductor structure 100 shown in FIGS. 4A-1 to 4D-1 and 4A-2 to 4D-2 may be similar to, or the same as, those shown in FIGS. 2A-1 to 2V-1, 2A-1 to 2V-2, and 3 and described previously, except the inner spacer layer formed on the sidewalls of the gate spacers 126 is not completely removed before the resist structure is formed, as shown in FIGS. 4A-1 and 4A-2 in accordance with some embodiments.

More specifically, the processes shown in FIGS. 2A-1 to 2D-1 and 2A-2 to 2D-2 are performed to form the inner spacer layers (e.g. the inner spacer layer 138), and an etching process is performed, as shown in FIGS. 4A-1 and 4A-2 in accordance with some embodiments. After the etching process is performed, inner spacers 140a and bottom isolation features 142a-1 and 142a-2 are formed with the inner spacer layers in accordance with some embodiments. In addition, a thin inner spacer layer 138a remains on the sidewalls of the gate spacers 126 after the etching process is performed in accordance with some embodiments.

The inner spacers 140a are formed in the notches between the second semiconductor material layers 108 and between the second semiconductor material layers 108 and the bottom semiconductor layer 105' in both the first region 10 and the second region 20 in accordance with some embodiments. In addition, the bottom isolation feature 142a-1 is formed in the first region 10, and the bottom isolation feature 142a-2 is formed in the second region 20 in accordance with some embodiments. In addition, the thin inner spacer layer 138a, the inner spacers 140a, and the bottom isolation features 142a-1 and 142a-2 are a continuous structure with no interface therebetween in accordance with some embodiments.

Figures 1, 2, 4B:
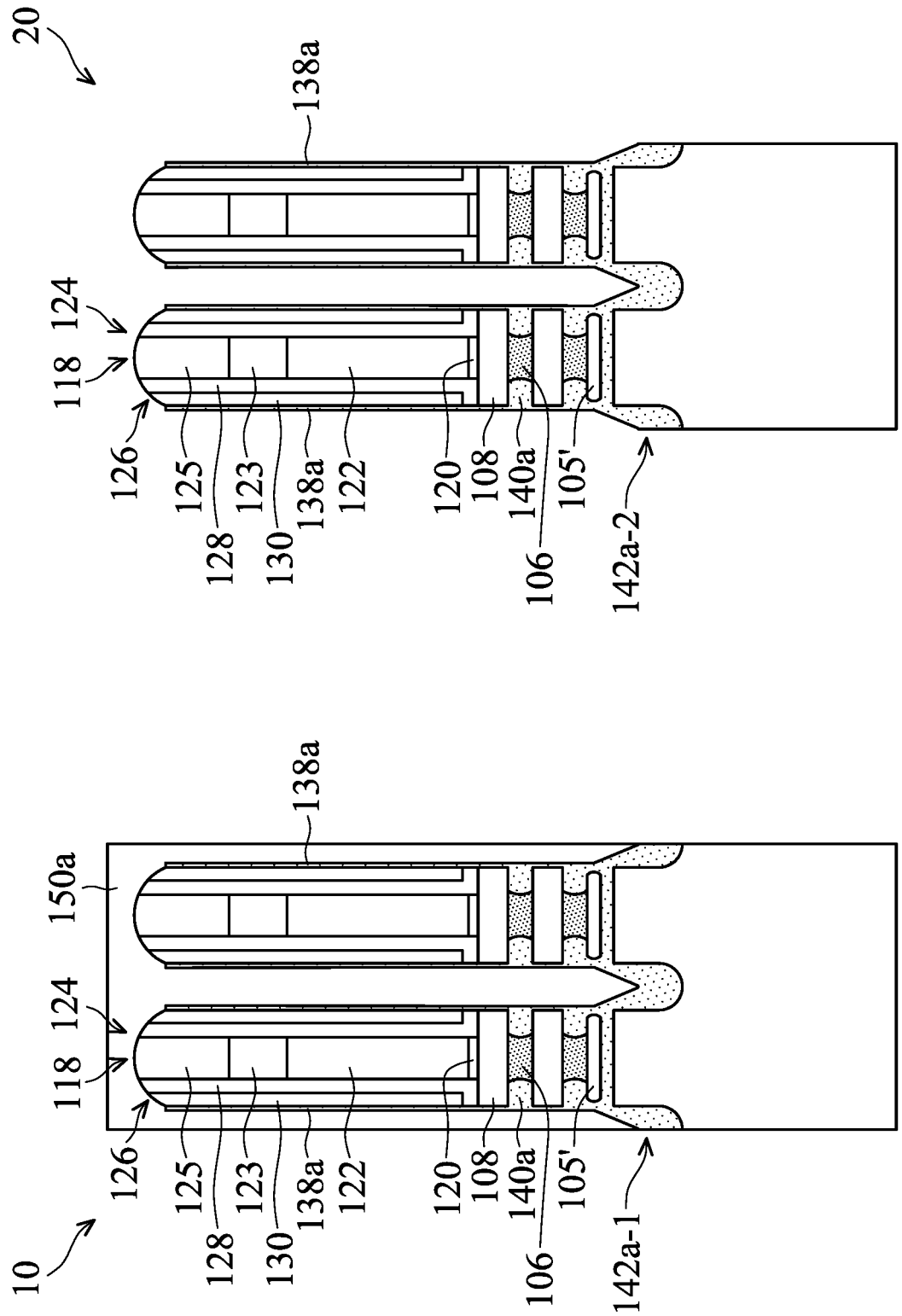

After the etching process is performed, a resist structure 150a is formed in the first region 10 to cover the dummy gate structures 118 and the bottom isolation feature 142a-1 in the first region 10, as shown in FIGS. 4B-1 and 4B-2 in accordance with some embodiments. Furthermore, the thin inner spacer layer 138a is also covered by the resist structure 150a in accordance with some embodiments.

Figures 1, 4C:
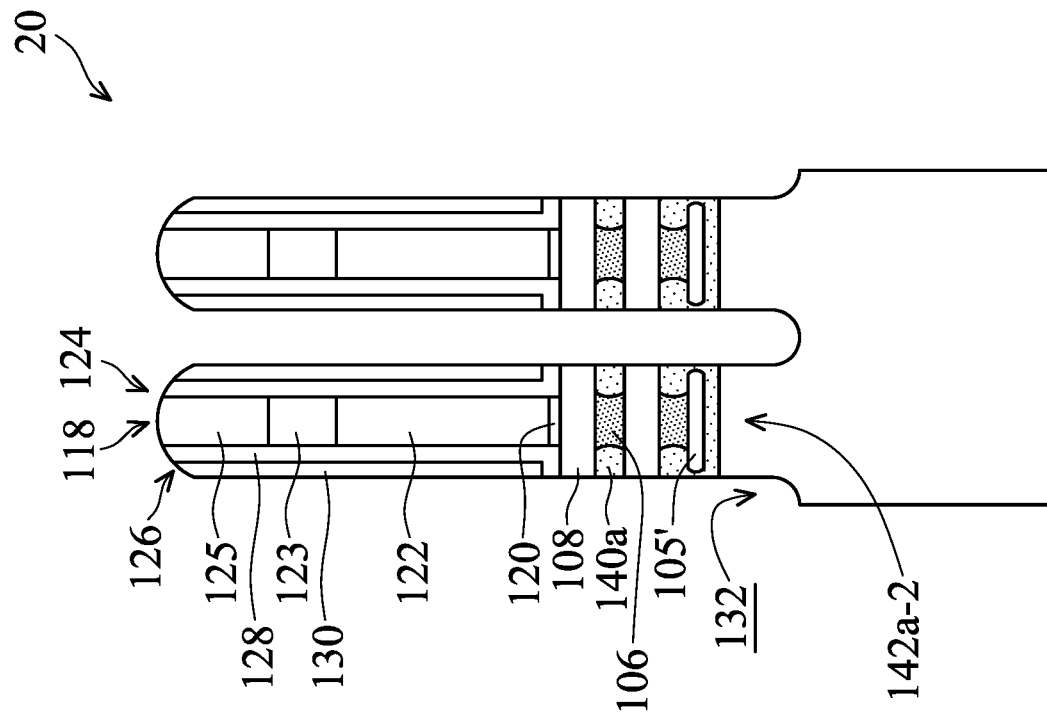
Figures 2, 4C:
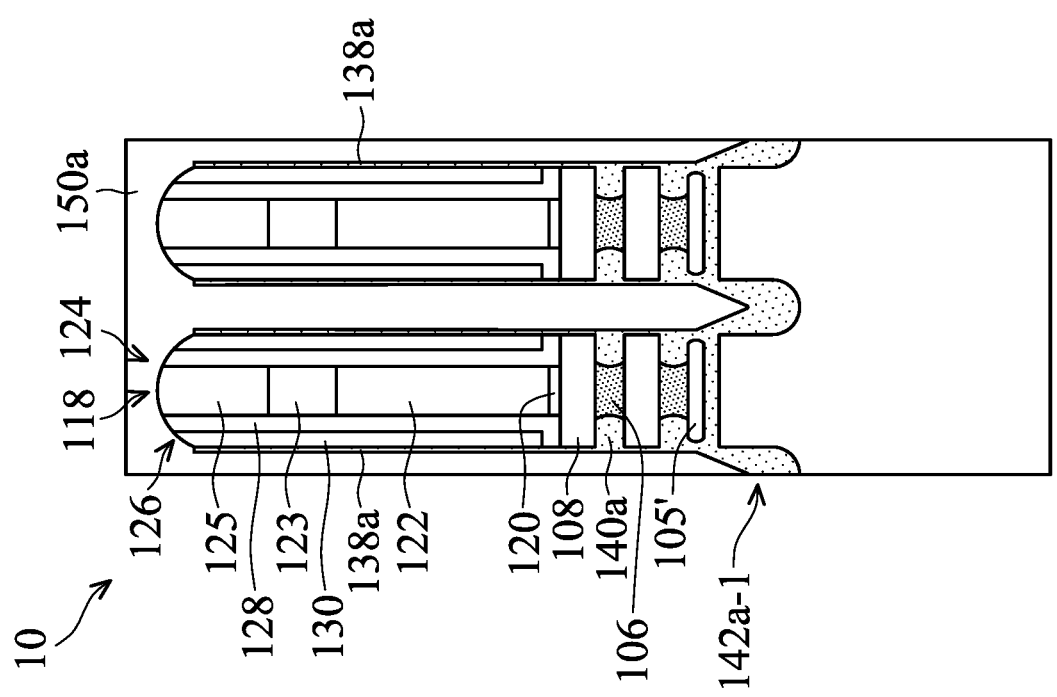

After the resist structure 150a is formed, an etching process is performed to remove the bottom isolation feature 142a-2 formed in the bottom portion of the source/drain recesses 132 and the thin inner spacer layer 138a formed over the sidewalls of the gate spacers 126 in the second region 20, as shown in FIGS. 4C-1 and 4C-2 in accordance with some embodiments.

Figures 2, 4D:
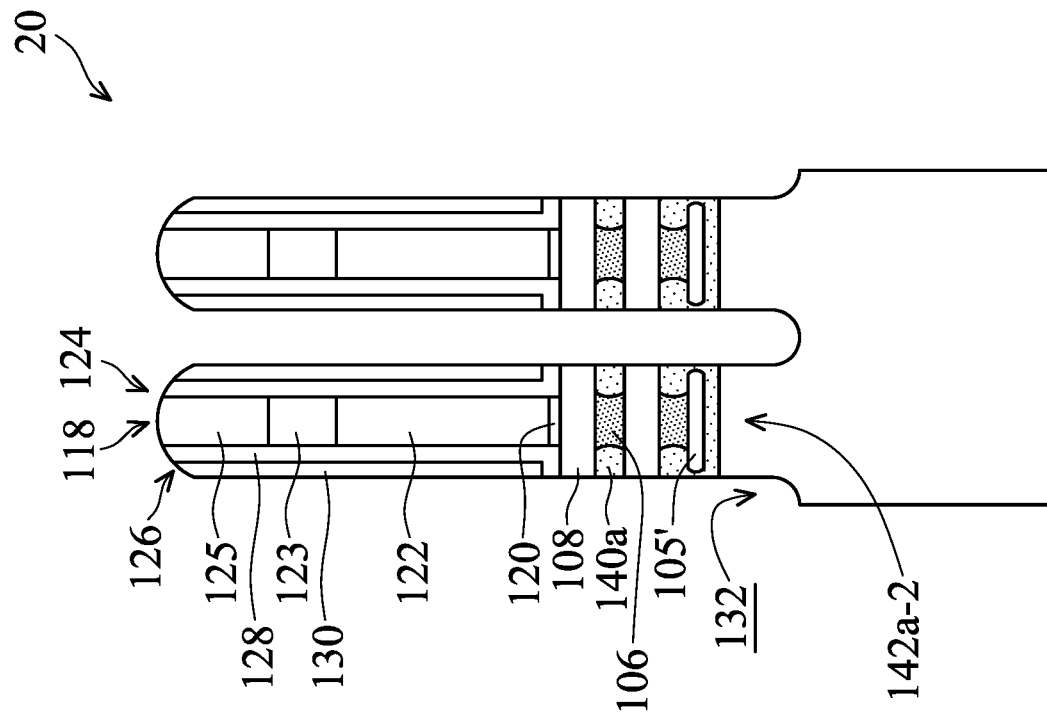
Figures 1, 4D:
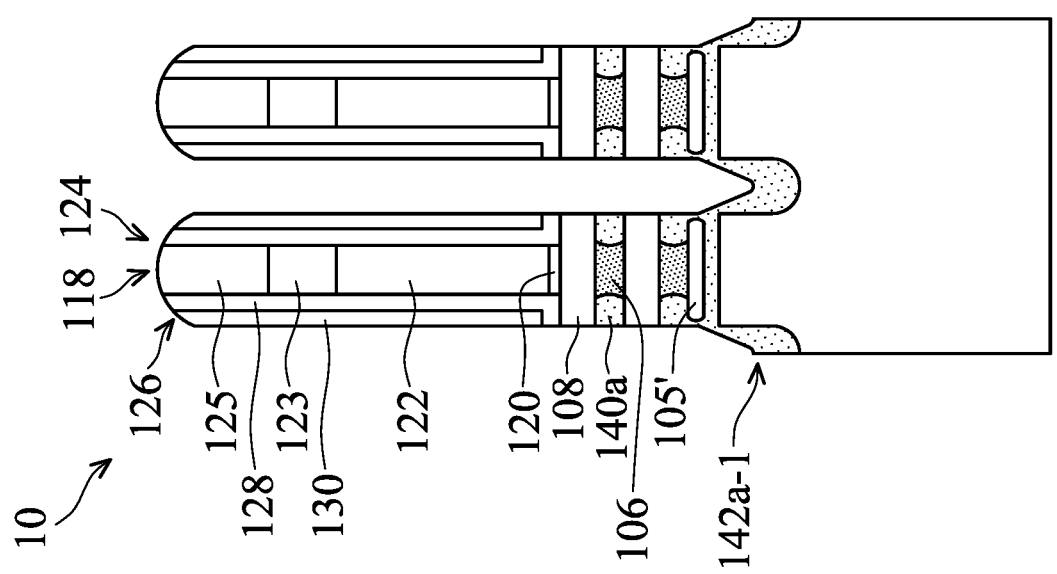

Next, an etching process is performed to remove the resist structure 150a and a cleaning process is performed afterwards, as shown in FIGS. 4D-1 and 4D-2 in accordance with some embodiments. More specifically, the etching process is performed to remove the resist structure 150a, and the cleaning process is performed to clean the top surface of the structure. In some embodiments, the thin inner spacer layers 138a are partially removed during the etching process and are completely removed by the cleaning process. In some embodiments, the etching process is an isotropic etching such as dry chemical etching, remote plasma etching, wet chemical etching, other applicable technique, and/or a combination thereof.

Afterwards, the processes shown in FIGS. 2I-1 to 2V-1 and 2I-2 to 2V-2 are performed to form the semiconductor structure 100, which is similar to, or the same as the semiconductor structure 100 shown in FIGS. 2V-1, 2V-2, and 3 in accordance with some embodiments and are not repeated herein. The processes and materials for forming the inner spacers 140a, the bottom isolation features 142a-1 and 142a-2, and the resist structure 150a are similar to, or the same as, those for forming the inner spacers 140, the bottom isolation features 142-1 and 142-2, and the resist structure 150 described previously and are not repeated herein.

FIGS. 5A-1, 5A-2, 5B-1, and 5B-2 illustrate cross-sectional views of intermediate stages of manufacturing a semiconductor structure 100b in accordance with some embodiments. The semiconductor structure 100b may be similar to the semiconductor structure 100 described previously, except the inner spacers and the bottom isolation features in the second region 20 are further recessed in accordance with some embodiments. Some processes and materials for forming the semiconductor structure 100b may be similar to, or the same as, those for forming the semiconductor structure 100 described previously and are not repeated herein.

More specifically, the processes shown in FIGS. 2A-1 to 2F-1 and 2A-2 to 2F-2 are performed to form the resist structure 150 in the first region 10, and an etching process is performed to remove the bottom isolation feature (e.g. the bottom isolation feature 142-2 shown in FIG. 2F-2) in the source/drain recesses 132 to form bottom isolation feature 142b-2 in the second region 20, as shown in FIGS. 5A-1 and 5A-2 in accordance with some embodiments. In addition, the inner spacers (e.g. the inner spacers 140 shown in FIG. 2F-2) are also etched during the etching process to form inner spacers 140b in accordance with some embodiments. In some embodiments, the inner spacers 140b have curved and recessed sidewall surfaces. Furthermore, the portions of the bottom isolation feature on the sidewalls of the bottom semiconductor layer 105 are also removed during the etching process. Accordingly, the bottom isolation feature 142b-2 and the inner spacers 140b in the second region 20 are separated from each other by the bottom semiconductor layer 105' in accordance with some embodiments. In addition, the bottom isolation feature 142b-2 also has a sidewall that curves inwardly in accordance with some embodiments. In some other embodiments, a thin film of the bottom isolation feature remains on the sidewalls of the bottom semiconductor layer 105 (not shown).

Afterwards, the processes shown in FIGS. 2H-1 to 2V-1 and 2H-2 to 2V-2 are performed to form the semiconductor structure 100b, as shown in FIGS. 5B-1 and 5B-2 in accordance with some embodiments. As described previously, since the inner spacers 140b and the bottom isolation feature 142b-2 have curved sidewalls, source/drain structures 160b-2 formed in the source/drain recesses 132 have sidewall surfaces that are not flat (e.g. lump portions), as shown in FIG. 5B-2 in accordance with some embodiments. In some embodiments, the source/drain structures 160b-2 are in direct contact with the inner spacers 140b, the bottom semiconductor layer 105', the bottom isolation feature 142b-2, and the base fin structure 104B.

The processes and materials for forming the inner spacers 140b, the bottom isolation feature 142b-2, and the source/drain structures 160b-2 are similar to, or the same as, those for forming the inner spacers 140, the bottom isolation feature 142-2, and the source/drain structures 160-2 described previously and are not repeated herein.

FIGS. 6A and 6B illustrate cross-sectional views of intermediate stages of manufacturing a semiconductor structure 100c in accordance with some embodiments. The semiconductor structure 100c may be similar to the semiconductor structure 100 described previously, except voids are formed under the source/drain structures in accordance with some embodiments. Processes and materials for forming the semiconductor structure 100*c* may be similar to, or the same as, those for forming the semiconductor structure 100 described previously and are not repeated herein.

More specifically, the processes shown in FIGS. 2A-1 to 2K-1 and 2A-2 to 2K-2 are performed to form a bottom isolation feature 142*c*-1, and source/drain structures 160*c*-1 are formed in the source/drain recesses over the bottom isolation feature 142*c*-1, as shown in FIG. 6A in accordance with some embodiments. In addition, voids 161*c* are formed under the source/drain structures 160*c*-1 in accordance with some embodiments.

In some embodiments, the source/drain structures 160*c*-1 are formed using an epitaxial growth process, such as MBE, MOCVD, VPE, other applicable epitaxial growth process, or a combination thereof. In some embodiments, the epitaxial growth materials are formed from the sidewalls of the second semiconductor material layers 108 and are merged together before the source/drain recesses are completely filled by the epitaxial materials. Accordingly, the voids 161*c* are formed between the bottom isolation feature 142*c*-1 and the source/drain structures 160*c*-1 in accordance with some embodiments. In some embodiments, the bottommost surface of the source/drain structures 160*c*-1 is higher than the top surface of the base fin structure 104B but is lower than the bottommost surface of the bottom semiconductor layer 105'. The formation of the voids 161*c* may be beneficial to the capacitance of the resulting device.

Afterwards, the processes shown in FIGS. 2M-1 to 2V-1 and 2M-2 to 2V-2 are performed to form the semiconductor structure 100*c*, as shown in FIG. 6B in accordance with some embodiments. The second portion 20 of the semiconductor structure 100*c* may be similar to, or the same as, the second portion 20 of the semiconductor structure 100 described previously and therefore is not shown in FIGS. 6A and 6B and described herein. In addition, the processes and materials for forming the bottom isolation feature 142*c*-1 and the source/drain structures 160*c*-1 are similar to, or the same as, those for forming the bottom isolation feature 142-1 and the source/drain structures 160-1 described previously and are not repeated herein.

FIG. 7 illustrates a cross-sectional view of a semiconductor structure 100*d* in accordance with some embodiments. The semiconductor structure 100*d* may be similar to the semiconductor structure 100*c* described previously, except the voids formed under the source/drain structures are relatively larger in accordance with some embodiments. Processes and materials for forming the semiconductor structure 100*d* may be similar to, or the same as, those for forming the semiconductor structure 100*c* described previously and are not repeated herein.

Similar to the semiconductor structure 100*c*, voids 161*d* are formed between source/drain structures 160*d*-1 and a bottom isolation feature 142*d*-1 in accordance with some embodiments. In some embodiments, the bottommost surface of the source/drain structures 160*d*-1 is higher than the top surface of the bottom semiconductor layer 105' but is lower than the bottommost surface of the nanostructures 108'. In some embodiments, the sidewalls of inner spacers 140*d* are partially exposed by the voids 161*d*.

The second portion 20 of the semiconductor structure 100*d* may be similar to, or the same as, the second portion 20 of the semiconductor structure 100 described previously and therefore is not shown in FIG. 7 and described herein. In addition, the processes and materials for forming the inner spacers 140*d*, the bottom isolation feature 142*d*-1, and the source/drain structures 160*d*-1 are similar to, or the same as, those for forming the inner spacers 140, the bottom isolation feature 142-1, and the source/drain structures 160-1 described previously and are not repeated herein.

FIGS. 8A-1, 8A-2, 8B-1, and 8B-2 illustrate cross-sectional views of intermediate stages of manufacturing a semiconductor structure 100*e* in accordance with some embodiments. The semiconductor structure 100*e* may be similar to the semiconductor structure 100 described previously, except the dummy bottom layer is thicker than that in FIGS. 1A-1 and 1A-2 in accordance with some embodiments. Processes and materials for forming the semiconductor structure 100*e* may be similar to, or the same as, those for forming the semiconductor structure 100 described previously and are not repeated herein.

More specifically, a dummy bottom layer 103*e* is formed over the substrate 102, and the bottom semiconductor layer 105 and the semiconductor stack including the first semiconductor material layers 106 and the second semiconductor material layers 108 are formed over the dummy bottom layer 103*e*, as shown in FIGS. 8A-1 and 8A-2 in accordance with some embodiments. In some embodiments, the dummy bottom layer 103*e* is thicker than the bottom semiconductor layer 105. In some embodiments, the dummy bottom layer 103*e* and the first semiconductor layers 106 in the semiconductor stack have substantially the same width.

Afterwards, the processes shown in FIGS. 2B-1 to 2V-1 and 2B-2 to 2V-2 are performed to form the semiconductor structure 100*e*, as shown in FIGS. 8B-1 and 8B-2 in accordance with some embodiments. Since the dummy bottom layer 103*e* is relatively thicker, bottom isolation features 142*e*-1 and 142*e*-2 formed in the spaces resulting from the removal of the dummy bottom layer 103*e* are also thicker. In some embodiments, the portions of the bottom isolation features 142*e*-1 and 142*e*-2 under the bottom semiconductor layer 105' (e.g. in the channel regions) are thicker than the bottom semiconductor layer 105'. In some embodiments, the portions of the bottom isolation features 142*e*-1 and 142*e*-2 under the bottom semiconductor layer 105' and the nanostructures 108' have substantially the same width.

The processes and materials for forming the dummy bottom layer 103*e* and the bottom isolation features 142*e*-1 and 142*e*-2 are similar to, or the same as, those for forming the dummy bottom layer 103 and the bottom isolation features 142-1 and 142-2 described previously and are not repeated herein.

FIGS. 9A-1, 9A-2, 9B-1, and 9B-2 illustrate cross-sectional views of intermediate stages of manufacturing a semiconductor structure 100*f* in accordance with some embodiments. The semiconductor structure 100*f* may be similar to the semiconductor structure 100 described previously, except the dummy bottom layer is not completely removed in accordance with some embodiments. Processes and materials for forming the semiconductor structure 100*f* may be similar to, or the same as, those for forming the semiconductor structure 100 described previously and are not repeated herein.

More specifically, the processes shown in FIGS. 2A-1 to 2C-1 and 2A-2 to 2C-2 are performed to remove the dummy bottom layer, as shown in FIGS. 9A-1 and 9A-2 in accordance with some embodiments. However, the dummy bottom layer (e.g. the dummy bottom layer 103 shown in FIGS. 2B-1 and 2B-2) are not completely removed and remaining portions 103*f'* of the dummy bottom layer remain under the bottom semiconductor layer 105' in accordance with some embodiments. In some embodiments, the remaining portions 103*f'* of the dummy bottom layer are in contact with the top surface of the base fin structure 104B. In some embodiments, the remaining portions 103*f'* of the dummy bottom layer are in contact with the bottom surface of the bottom semiconductor layer 105'. In some embodiments, the top surfaces or the bottom surfaces of the remaining portions 103f' of the dummy bottom layer are exposed by gaps 136f.

Afterwards, the processes shown in FIGS. 2D-1 to 2V-1 and 2D-2 to 2V-2 are performed to form the semiconductor structure 100f, as shown in FIGS. 9B-1 and 9B-2 in accordance with some embodiments. Since the remaining portions 103f' of the dummy bottom layer remain in the gaps 136f, bottom isolation features 142f-1 and 142f-2 formed in the gaps 136f are in contact with the remaining portions 103f' of the dummy bottom layer in accordance with some embodiments. In some embodiments, the remaining portions 103f' of the dummy bottom layer are embedded in the bottom isolation features 142f-1 and 142f-2.

The processes and materials for forming the gaps 136f and the bottom isolation features 142f-1 and 142f-2 are similar to, or the same as, those for forming the gaps 136 and the bottom isolation features 142-1 and 142-2 described previously and are not repeated herein.

FIGS. 10A-1, 10A-2, 10B-1, and 10B-2 illustrate cross-sectional views of intermediate stages of manufacturing a semiconductor structure 100g in accordance with some embodiments. The semiconductor structure 100g may be similar to the semiconductor structure 100 described previously, except seams are formed in the bottom isolation feature in accordance with some embodiments. Processes and materials for forming the semiconductor structure 100g may be similar to, or the same as, those for forming the semiconductor structure 100 described previously and are not repeated herein.

More specifically, the processes shown in FIGS. 2A-1 to 2D-1 and 2A-2 to 2D-2 are performed to form inner spacer layers 138g, as shown in FIGS. 10A-1 and 10A-2 in accordance with some embodiments. However, the gaps under the bottom semiconductor layer 105' are not completely filled by the inner spacer layers 138g, such that seams 139 are formed in the inner spacer layers 138g in accordance with some embodiments. In some other embodiments, some portions of the bottom surfaces of the bottom semiconductor layer 105' and/or the top surfaces of the base fin structure 104B are exposed by the seams 139 and therefore are not covered by (i.e. they are not in contact with) the inner spacer layers 138g (not shown).

Afterwards, the processes shown in FIGS. 2E-1 to 2V-1 and 2E-2 to 2V-2 are performed to form the semiconductor structure 100g, as shown in FIGS. 10B-1 and 10B-2 in accordance with some embodiments. Since the seams 139 are formed in the inner spacer layers 138g, the resulting bottom isolation features 142g-1 and 142g-2 also include the seams 139 formed therein in accordance with some embodiments. In some embodiments, the bottommost portion of the seams 139 is higher than the bottommost portion of the source/drain structures 160.

The processes and materials for forming the inner spacer layers 138g and the bottom isolation features 142g-1 and 142g-2 are similar to, or the same as, those for forming the inner spacer layers 138 and the bottom isolation features 142-1 and 142-2 described previously and are not repeated herein.

Figure 11:
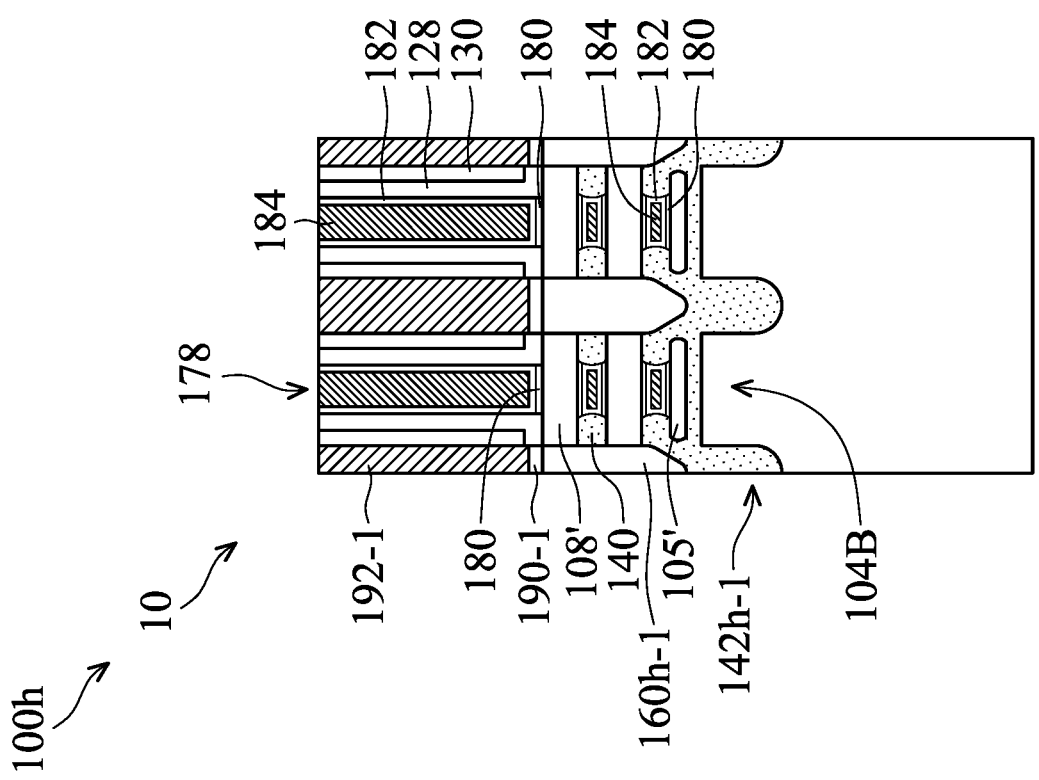
FIG. 11 illustrates a cross-sectional view of a semiconductor structure in accordance with some embodiments.
Figures 2, 12:
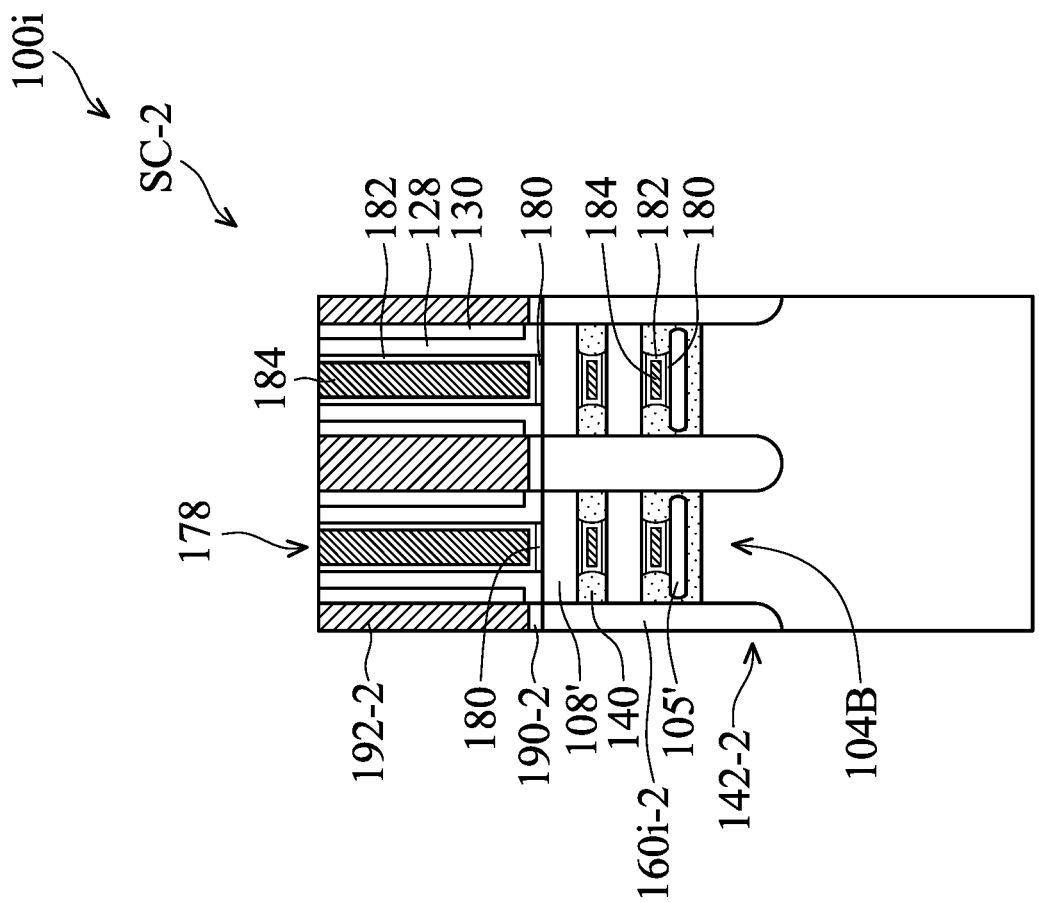
Figures 1, 12:
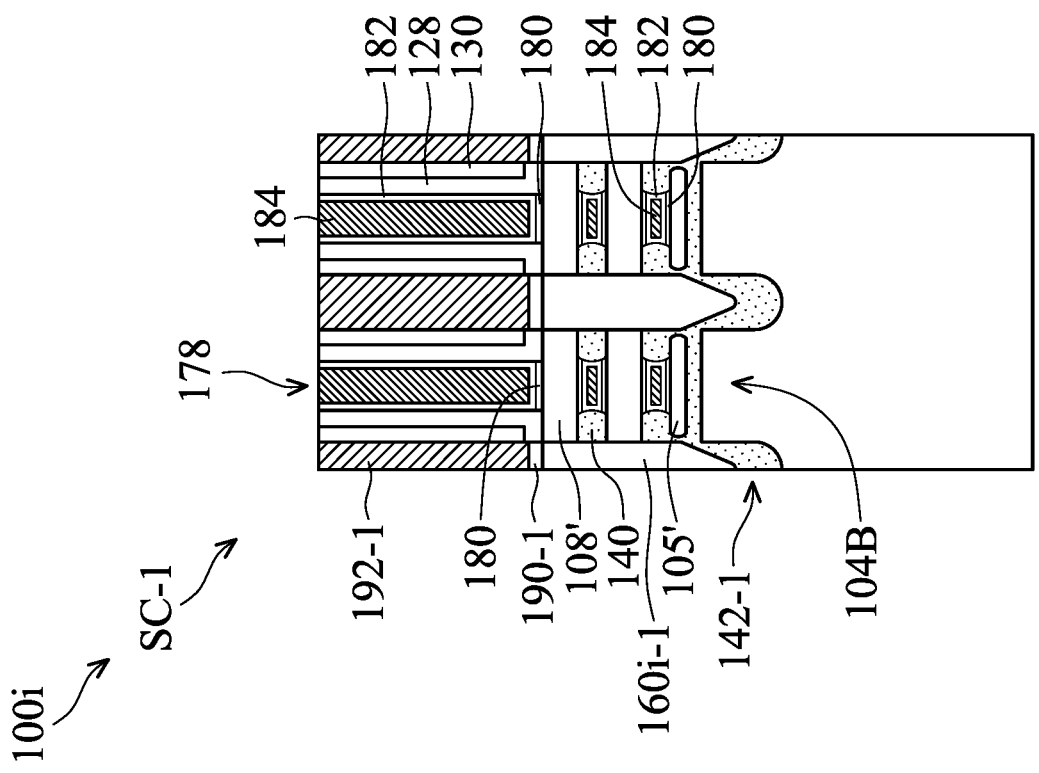
Figures 4, 12:
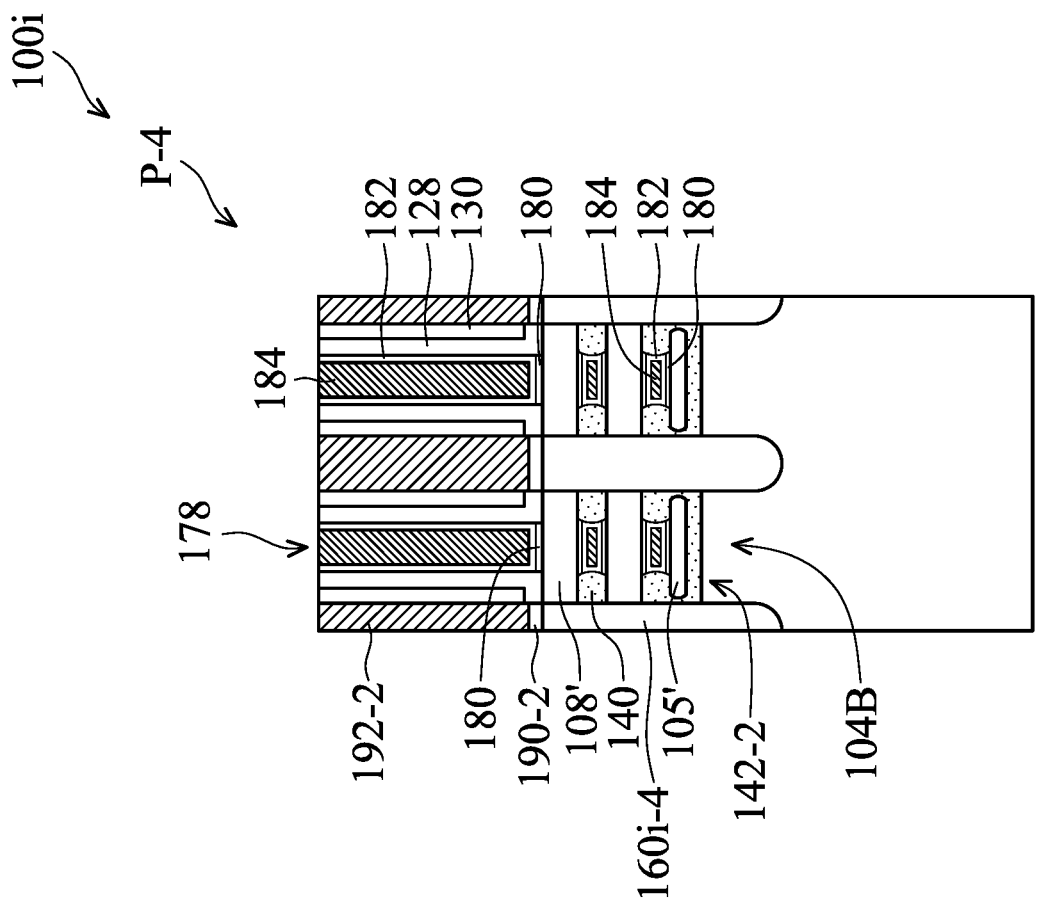
Figures 3, 12:
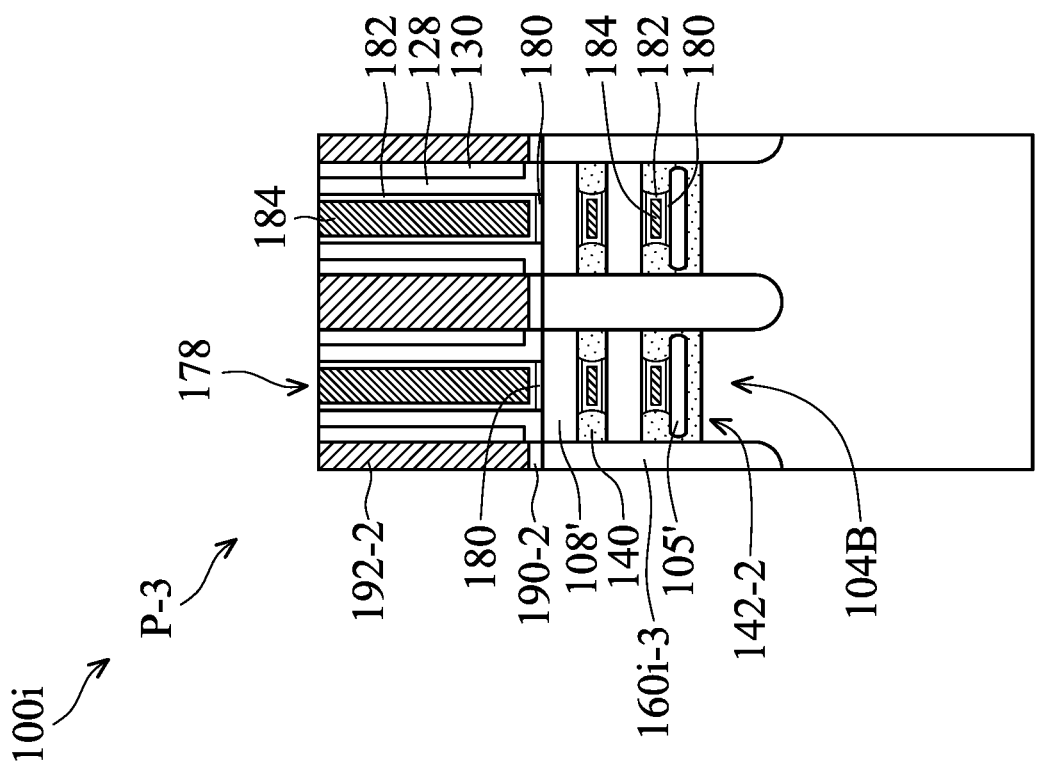
Figures 5, 6, 12:
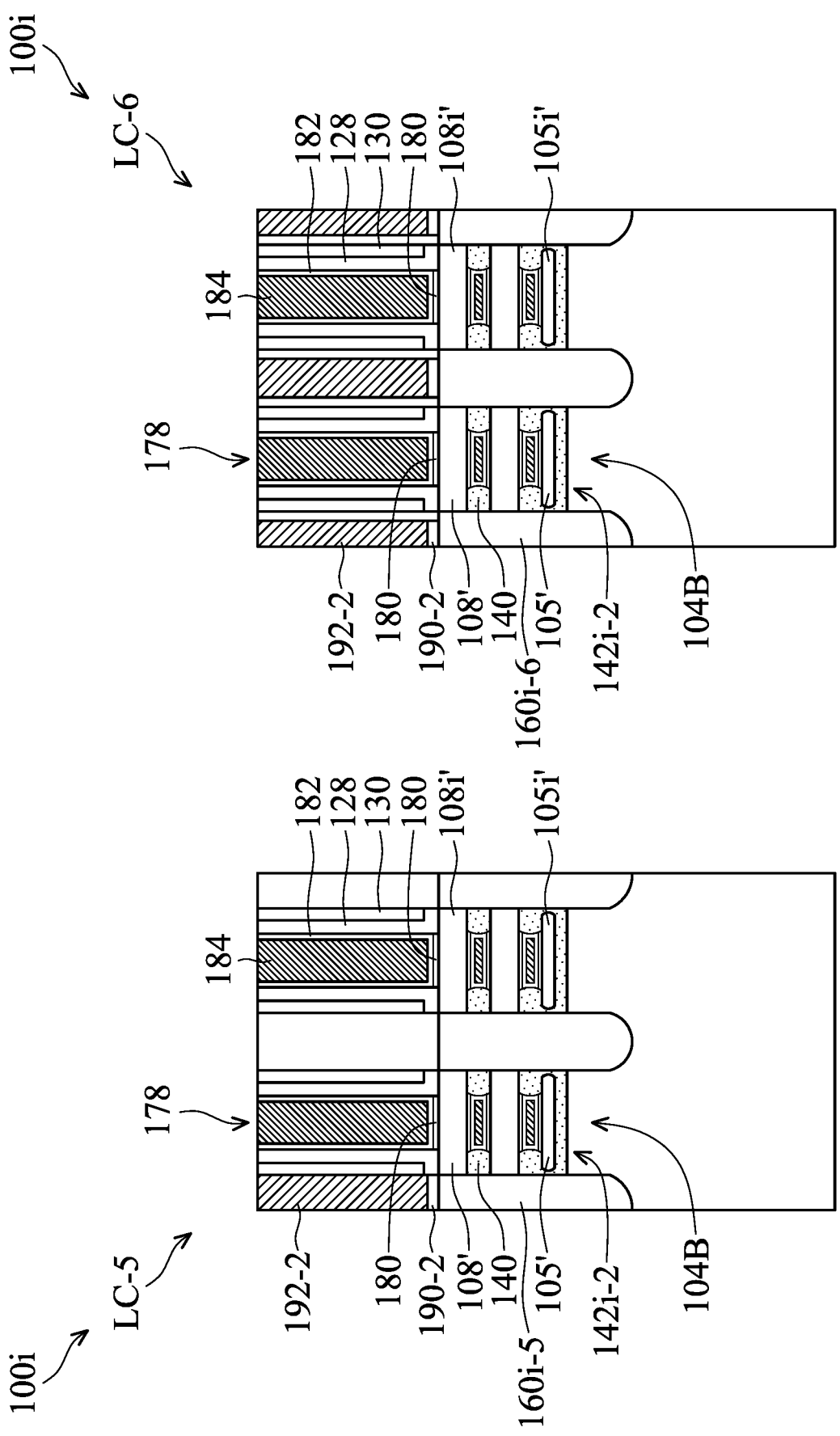

FIG. 11 illustrates a cross-sectional view of a semiconductor structure 100h in accordance with some embodiments. The semiconductor structure 100h may be similar to the semiconductor structure 100 described previously, except the portions of the bottom isolation features formed in the source/drain recesses are thicker than those shown in FIGS. 2V-1, 2V-2, and 3 in accordance with some embodiments. Processes and materials for forming the semiconductor structure 100h may be similar to, or the same as, those for forming the semiconductor structure 100 described previously and are not repeated herein.

Similar semiconductor structure 100, bottom isolation features 142h-1 are formed to cover the base fin structure 104B, as shown in FIG. 11 in accordance with some embodiments. In addition, source/drain structures 160h are formed in the source/drain recesses over the bottom isolation features 142h-1. In some embodiments, the bottom isolation feature 142h-1 is relatively thick, such that the bottommost portions of the source/drain structures 160h are higher than the top surface of the base fin structure 104B. In some embodiments, the bottommost portions of the source/drain structures 160h are lower than the bottommost surface of the nanostructures 108'. In some embodiments, the bottommost portions of the source/drain structures 160h are substantially level with the bottommost surface of the bottom semiconductor layer 105'.

The second portion 20 of the semiconductor structure 100h may be similar to, or the same as, the second portion 20 of the semiconductor structure 100 described previously and therefore is not shown in FIG. 11. In addition, the processes and materials for forming the bottom isolation feature 142f-1 and the source/drain structures 160h-1 are similar to, or the same as, those for forming the bottom isolation feature 142f-1 and the source/drain structures 160h-1 described previously and are not repeated herein.

It should be appreciated that the semiconductor structures 100, 100a, 100b, 100b, 100d, 100e, 100f, 100g, and 100h described previously may be combined and/or exchanged. For example, a semiconductor device may include more than one kinds of bottom isolation features described previously.

FIGS. 12-1, 12-2, 12-3, 12-4, 12-5, and 12-6 illustrate cross-sectional views of various regions of a semiconductor device 100i in accordance with some embodiments. More specifically, the semiconductor device 100i includes short channel regions, pickup regions, and long channel regions in accordance with some embodiments. In some embodiments, the short channel regions include semiconductor structures SC-1 and SC-2, the pickup regions include semiconductor structures P-3 and P-4, and the long channel regions include semiconductor structures LC-5 and LC-6.

In some embodiments, the semiconductor structure SC-1 has the structure the same as that shown in the first region 10 of the semiconductor structure 100 described previously, although other structures shown in the region 10 described above may also be applied thereto. In some embodiments, source/drain structures 160i-1 in the semiconductor structure SC-1 are made of an epitaxial material doping with N-type dopants formed in a P-well region in the substrate.

In some embodiments, the semiconductor structures SC-2, P-3, and P-4 have the structures the same as that shown in the second region 20 of the semiconductor structure 100 described previously, although other structures shown in the region 20 described above may also be applied thereto. In some embodiments, the semiconductor structures SC-2, P-3, and P-4 have similar structures but the dopants in the semiconductor structure P-4 are different from those in the semiconductor structures SC-2 and P-3. In some embodiments, source/drain structures 160i-2 in the semiconductor structure SC-2 are made of an epitaxial material doped with P-type dopants formed in an N-well region in the substrate. In some embodiments, source/drain structures 160i-3 in the semiconductor structure P-3 are made of an epitaxial material doped with P-type dopants formed in a P-well region in the substrate. In some embodiments, source/drain structures 160*i*-4 in the semiconductor structure P-4 are made of an epitaxial material doped with N-type dopants formed in an N-well region in the substrate. Since the semiconductor structures P-3 and P-4 in the pickup regions are configured to connect to the grounding terminal, no bottom isolation features are formed in the semiconductor structures P-3 and P-4 in accordance with some embodiments.

In some embodiments, the semiconductor structures LC-5 and LC-6 have the structures similar to, but larger than, that shown in the second region 20 of the semiconductor structure 100 described previously. In some embodiments, source/drain structures 160*i*-5 in the semiconductor structure LC-5 are made of an epitaxial material doped with N-type dopants formed in a P-well region in the substrate, and source/drain structures 160*i*-6 in the semiconductor structure LC-6 are made of an epitaxial material doped with P-type dopants formed in an N-well region in the substrate. In some embodiments, nanostructures 108*i'*, the bottom semiconductor layer 105*i'*, and the bottom isolation features 142*i*-2 in the semiconductor structures LC-5 and LC-6 are wider than the nanostructures 108', the bottom semiconductor layer 105', and the bottom isolation features 142-2 in the semiconductor structures SC-1, SC-2, P-3, and P-4. In some embodiments, the source/drain structures 160*i*-5 and 160*i*-6 in the semiconductor structures LC-5 and LC-6 are wider than the source/drain structures 160*i*-1, 160*i*-2, 160*i*-3, and 160*i*-4 in the semiconductor structures SC-1, SC-2, P-3, and P-4.

The processes and materials for forming the source/drain structures 160*i*-1, 160*i*-2, 160*i*-3, 160*i*-4, 160*i*-5, and 160*i*-6, the nanostructures 108*i'*, and the bottom semiconductor layer 105*i'* are similar to, or the same as, those for forming the source/drain structures 160, the nanostructures 108', and the bottom semiconductor layer 105' described previously and are not repeated herein.

Generally, source/drain structures are formed in the fin structures and connected to the nanostructures. However, as the device is scaled down, the isolation of the source/drain structures (e.g. between N-type and P-type regions) may become more and more challenging.

In the embodiments described above, the bottom isolation features (e.g. the bottom isolation features 142-1, 142*c*-1, 142*d*-1, 142*e*-1, 142*f*-1, 142*g*-1, and 142*h*-1) are formed under the source/drain structures (e.g. the source/drain structures 160-1, 160*c*-1, 160*d*-1, 160*h*-1, and 160*i*-1), so the isolation of the source/drain structures can be improved.

In addition, the bottom isolation features are not only formed in the source/drain regions but also continuously extend under the channel regions in accordance with some embodiments. Therefore, the isolation of the device regions, especially at the corners of the fin base structures (e.g. the fin base structure 104B) and the source/drain recesses (e.g. the source/drain recesses 132) can be further improved.

Furthermore, the formation of the bottom isolation features can be implemented to the manufacturing processes without additional complicated alignments and lithography processes. In some embodiments, the bottom isolation features are formed in the same etching process for forming the inner spacers (e.g. the inner spacers 140). In addition, the dummy bottom layers (e.g. the dummy bottom layers 103 and 103*e*) and the bottom semiconductor layers (e.g. the bottom semiconductor layers 105') formed under the semiconductor stack provide additional buffer regions for forming the bottom isolation features. Therefore, the process window for manufacturing the bottom isolation features can be enlarged.

Since the leakages from the backside of the device can be greatly improved (e.g. reduce over 100 times), the device performance can be improved and the capacitance of the resulting device may also be reduced (e.g. by more than 60%).

In addition, it should be noted that same elements in FIGs. 1A-1 to 12-6 may be designated by the same numerals and may include materials that are the same or similar and may be formed by processes that are the same or similar; therefore such redundant details are omitted in the interests of brevity. In addition, although FIGs. 1A-1 to 12-6 are described in relation to the method, it will be appreciated that the structures disclosed in FIGs. 1A-1 to 12-6 are not limited to the method but may stand alone as structures independent of the method. Similarly, the methods shown in FIGs. 1A-1 to 12-6 are not limited to the disclosed structures but may stand alone independent of the structures. Furthermore, the nanostructures described above may include nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include nanostructures and source/drain structures attached to the nanostructures. A bottom isolation feature is sandwiched between the substrate and the nanostructures and between the substrate and the source/drain structures. The bottom isolation feature can help to improve the isolation of the source/drain structures, and therefore the leakage under the source/drain structures may be reduced and the performance of the semiconductor structure can be improved.

In some embodiments, a semiconductor structure is provided. The semiconductor structure includes a substrate and a bottom isolation feature formed over the substrate. The semiconductor structure also includes a bottom semiconductor layer formed over the bottom isolation feature and nanostructures formed over the bottom semiconductor layer. The semiconductor structure also includes a source/drain structure attached to the nanostructures and covering a portion of the bottom isolation feature.

In some embodiments, a semiconductor structure is provided. The semiconductor structure includes a first base fin structure protruding from a substrate and a first bottom isolation feature formed over a first region of the first base fin structure. The semiconductor structure also includes a first bottom semiconductor layer formed over the first bottom isolation feature and first nanostructures formed over the first bottom semiconductor layer. The semiconductor structure also includes a first gate structure wrapping around the first nanostructures and a first source/drain structure attached to the first nanostructures and over a second region of the first bottom isolation feature. In addition, a bottom portion of the second region of the first bottom isolation feature is lower than a bottom portion of the first region of first bottom isolation feature.

In some embodiments, a method for manufacturing a semiconductor structure is provided. The method for manufacturing the semiconductor structure includes forming a dummy bottom layer over a substrate and forming a bottom semiconductor layer over the dummy bottom layer. The method for manufacturing the semiconductor structure also includes alternately stacking first semiconductor material layers and second semiconductor material layers to form a semiconductor material stack over the bottom semiconductor layer and patterning the semiconductor material stack, the bottom semiconductor layer, and the dummy bottom layer to form a first fin structure. The method for manufacturing the semiconductor structure also includes recessing the first fin structure to form a first source/drain recess and etching the first semiconductor material layers of the first fin structure to form first notches and etching the dummy bottom layer of the first fin structure to form a first gap under the bottom semiconductor layer of the first fin structure. The method for manufacturing the semiconductor structure also includes forming first inner spacers in the first notches and a first bottom isolation feature in the first gap and in a bottom portion of the first source/drain recess and forming a first source/drain structure over the first bottom isolation feature in the first source/drain recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a dummy bottom layer over a substrate;
   forming a bottom semiconductor layer over the dummy bottom layer;
   alternately stacking first semiconductor material layers and second semiconductor material layers to form a semiconductor material stack over the bottom semiconductor layer;
   patterning the semiconductor material stack, the bottom semiconductor layer, and the dummy bottom layer to form a first fin structure;
   recessing the first fin structure to form a first source/drain recess;
   etching the patterned first semiconductor material layers of the first fin structure to form first notches and etching the patterned dummy bottom layer of the first fin structure to form a first gap under the bottom semiconductor layer of the first fin structure;
   forming first inner spacers in the first notches and a first bottom isolation feature in the first gap and in a bottom portion of the first source/drain recess; and
   forming a first source/drain structure over the first bottom isolation feature in the first source/drain recess;
   removing the patterned first semiconductor material layers of the first fin structure to form first nanostructures with the patterned second semiconductor material layers of the first fin structure; and
   forming a first metal gate structure wrapping around the first nanostructures,
   wherein an interface between the first bottom isolation feature and the first source/drain structure is lower than a bottom surface of the first metal gate structure in a cross-sectional view.

2. The method for manufacturing the semiconductor structure as claimed in claim 1, wherein the dummy bottom layer and the first semiconductor material layers are both made of silicon germanium, and a germanium concentration of the dummy bottom layer is greater than a germanium concentration of the first semiconductor material layers.

3. The method for manufacturing the semiconductor structure as claimed in claim 1, further comprising:
   patterning the semiconductor material stack, the bottom semiconductor layer, and the dummy bottom layer to form a second fin structure;
   recessing the second fin structure to form a second source/drain recess;
   etching the first semiconductor material layers of the second fin structure to form second notches and removing the dummy bottom layer of the second fin structure to form a second gap under the bottom semiconductor layer of the second fin structure;
   forming second inner spacers in the second notches and a second bottom isolation feature in the second gap and in a bottom portion of the second source/drain recess;
   removing the second bottom isolation feature in the bottom portion of the second source/drain recess; and
   forming a second source/drain structure in the second source/drain recess.

4. The method for manufacturing the semiconductor structure as claimed in claim 3, wherein a bottom surface of the second source/drain structure is lower than a bottom surface of the first source/drain structure.

5. The method for manufacturing the semiconductor structure as claimed in claim 3, further comprising:
   forming a first mask layer covering the second source/drain recess before forming the first source/drain structure, wherein a sidewall of the second bottom isolation feature is covered by the first mask layer; and
   removing the first mask layer after forming the first source/drain structure;
   forming a second mask layer over the first source/drain structure before forming the second source/drain structure; and
   removing the second mask layer after forming the second source/drain structure.

6. The method for manufacturing the semiconductor structure as claimed in claim 1, further comprising:
   laterally etching the bottom semiconductor layer of the first fin structure, wherein the first bottom isolation feature extends over a sidewall of the bottom semiconductor layer.

7. The method for manufacturing the semiconductor structure as claimed in claim 1, wherein a remaining portion of the dummy bottom layer of the first fin structure remains in the first gap, and the remaining portion of the dummy bottom layer is in contact with the first bottom isolation feature.

8. A method for manufacturing a semiconductor structure, comprising:
forming a fin structure protruding from a substrate, wherein the fin structure comprises a base fin structure, a dummy bottom layer formed over the base fin structure, a bottom semiconductor layer formed over the dummy bottom layer, and a semiconductor material stack formed over the bottom semiconductor layer, and the semiconductor material stack comprises first semiconductor material layers and second semiconductor material layers alternately stacked;
etching the fin structure to form a first source/drain recess and a second source/drain recess;
removing the dummy bottom layer to form a first gap under the bottom semiconductor layer;
forming a bottom isolation feature having a middle portion in the first gap, a first extending portion extending into a bottom portion of the first source/drain recess, and a second extending portion extending into a bottom portion of the second source/drain recess, wherein a central portion of a top surface of the first extending portion is lower than a top surface of the middle portion; and
forming a first source/drain structure over first extending portion of the bottom isolation feature and a second source/drain structure over the second extending portion of the bottom isolation feature.

9. The method for manufacturing the semiconductor structure as claimed in claim 8, further comprising:
forming an inner spacer layer covering sidewalls of the first semiconductor material layers and the second semiconductor material layers, sidewalls and a bottom surface of the bottom semiconductor layer, and a top surface of the base fin structure; and
partially removing the inner spacer layer to form inner spacers and the bottom isolation feature with the inner spacer layer.

10. The method for manufacturing the semiconductor structure as claimed in claim 9, further comprising:
recessing the first semiconductor material layers from the first source/drain recess and the second source/drain recess to form notches,
wherein the inner spacer layer are formed in the notches.

11. The method for manufacturing the semiconductor structure as claimed in claim 8, further comprising:
removing the first semiconductor material layers to formed second gaps between the second semiconductor material layers; and
forming a gate structure wrapping around the second semiconductor material layers,
wherein the gate structure vertically overlaps the bottom isolation feature.

12. The method for manufacturing the semiconductor structure as claimed in claim 8, wherein the first extending portion of the bottom isolation feature has a concave top surface.

13. A method for manufacturing a semiconductor structure, comprising:
forming a dummy bottom layer, a bottom semiconductor layer, and a semiconductor material stack over a substrate, wherein the semiconductor material stack comprises first semiconductor material layers and second semiconductor material layers alternately stacked;
patterning the semiconductor material stack, the bottom semiconductor layer, and the dummy bottom layer to form a first fin structure and a second fin structure;
removing the patterned dummy bottom layers of the first fin structure and the second fin structure to form a first gap and a second gap, respectively;
forming a first bottom isolation feature in the first gap with a first extending portion protruding from the first gap and a second bottom isolation feature in the second gap with a second extending portion protruding from the second gap;
removing the second extending portion of the second bottom isolation feature to expose the substrate;
forming a first source/drain structure over the first extending portion of the first bottom isolation feature; and
forming a second source/drain structure attaching to a sidewall of the second bottom isolation feature.

14. The method for manufacturing the semiconductor structure as claimed in claim 13, further comprising:
recessing the first fin structure and the second fin structure to form a first source/drain recess and a second source/drain recess, respectively;
forming a first inner spacer layer in the first gap and a bottom portion of the first source/drain recess;
forming a second inner spacer layer in the second gap and a bottom portion of the second source/drain recess;
forming a material layer over the first source/drain recess;
removing a portion of the second inner spacer layer in the bottom portion of the second source/drain recess not covered by the material layer before forming the second source/drain structure; and
removing the material layer after removing the portion of the second inner spacer layer in the bottom portion of the second source/drain recess.

15. The method for manufacturing the semiconductor structure as claimed in claim 14, further comprising:
recessing the first semiconductor material layers in the first fin structure and the second fin structure to form first notches and second notches, respectively,
wherein the first inner spacer layer is formed in the first notches and the second inner spacer layer is formed in the second notches.

16. The method for manufacturing the semiconductor structure as claimed in claim 13, further comprising:
etching the bottom semiconductor layers in the first fin structure and the second fin structure before forming the first bottom isolation feature in the first gap and the second bottom isolation feature in the second gap.

17. The method for manufacturing the semiconductor structure as claimed in claim 13, further comprising:
removing the first semiconductor material layers in the first fin structure; and
forming a gate structure wrapping around the second semiconductor material layers in the first fin structure,
wherein the bottom semiconductor layer is vertically sandwiched between the gate structure and the first bottom isolation feature.

18. The method for manufacturing the semiconductor structure as claimed in claim 1, wherein the first metal gate structure covers a top surface of the first bottom semiconductor layer, and the bottom isolation feature covers a bottom surface of the bottom semiconductor layer.

19. The method for manufacturing the semiconductor structure as claimed in claim 8, wherein the central portion of the top surface of the first extending portion is lower than a bottom surface of the middle portion.

20. The method for manufacturing the semiconductor structure as claimed in claim 13, further comprising:
  forming a mask layer covering the second fin and the sidewall of the second bottom isolation feature before forming the first source/drain structure; and
  removing the mask layer after forming the first source/drain structure and before forming the second source/drain structure.

* * * * *